United States Patent
Yokokawa et al.

(10) Patent No.: US 8,086,934 B2
(45) Date of Patent: Dec. 27, 2011

(54) DECODING APPARATUS AND DECODING METHOD

(75) Inventors: Takashi Yokokawa, Tokyo (JP);
Toshiyuki Miyauchi, Tokyo (JP);
Osamu Shinya, Tokyo (JP)

(73) Assignee: Sony Corporation, Tokyo (JP)

( * ) Notice: Subject to any disclaimer, the term of this patent is extended or adjusted under 35 U.S.C. 154(b) by 610 days.

(21) Appl. No.: 11/912,481

(22) PCT Filed: Apr. 20, 2006

(86) PCT No.: PCT/JP2006/308300
§ 371 (c)(1),
(2), (4) Date: Feb. 26, 2009

(87) PCT Pub. No.: WO2006/115164
PCT Pub. Date: Nov. 2, 2006

(65) Prior Publication Data
US 2009/0217121 A1     Aug. 27, 2009

(30) Foreign Application Priority Data

Apr. 25, 2005    (JP) ................................. 2005-125962

(51) Int. Cl.
*H03M 13/00* (2006.01)
(52) U.S. Cl. .................. 714/758; 714/752; 714/780
(58) Field of Classification Search .............. 714/758, 714/752, 800, 804, 780, 799, 755
See application file for complete search history.

(56) References Cited

U.S. PATENT DOCUMENTS

| | | | | |
|---|---|---|---|---|
| 7,085,983 B2 * | 8/2006 | Ohta | ............................. | 714/752 |
| 7,590,929 B2 * | 9/2009 | Morita et al. | ................. | 714/800 |
| 7,603,607 B2 * | 10/2009 | Maehata | ....................... | 714/752 |
| 2003/0033575 A1 | 2/2003 | Richardson et al. | | |
| 2004/0153960 A1 | 8/2004 | Eroz et al. | | |
| 2005/0240853 A1 | 10/2005 | Yokokawa et al. | | |
| 2005/0278604 A1 | 12/2005 | Yokokawa et al. | | |
| 2005/0278606 A1 | 12/2005 | Richardson et al. | | |

FOREIGN PATENT DOCUMENTS

EP     1 494 358     1/2005

(Continued)

OTHER PUBLICATIONS

E. Yeo et al, "VLSI Architectures for Interative Decoders in Magnetic Recording Channels", IEEE Transactions on Magnetics. vol. 37, No. 2, Mar. 2001.

(Continued)

*Primary Examiner* — Fritz Alphonse
(74) *Attorney, Agent, or Firm* — Finnegan, Henderson, Farabow, Garrett & Dunner, L.L.P.

(57) ABSTRACT

A decoding apparatus and method are capable of decoding LDPC codes with a high degree of precision while preventing the circuit scale of the decoding apparatus from increasing. A computation section carries out a first computation process corresponding to three check-node processes by making use of decoding intermediate results supplied from a decoding intermediate result storage memory by way of a cyclic shift circuit, and stores the result of the first computation process in a decoding intermediate result storage memory. A computation section carries out a second computation process corresponding to six variable-node processes by making use of decoding intermediate results supplied from a decoding intermediate result storage memory by way of a cyclic shift circuit, and stores the decoding intermediate result in the decoding intermediate result storage memory.

16 Claims, 32 Drawing Sheets

FOREIGN PATENT DOCUMENTS

| | | |
|---|---|---|
| EP | 1 521 372 | 4/2005 |
| JP | 2004-364233 | 12/2004 |
| JP | 2005-054781 | 12/2004 |
| WO | WO 02/103631 | 12/2002 |

OTHER PUBLICATIONS

T. Zhang et al., "Joint (3,k)-Regular LDPC Code and Decoder/Encoder Design," IEEE Transactions on Signal Processing, vol. 52, No. 4, pp. 1065-1079, Apr. 2004.

M.M. Mansour et al., "A Novel Design Methodology for High-Performance Programmable Decoder Cores for AA-LDPD Codes," Proceedings of IEEE Workshop on Signal Processing Systems 2003 (SIPS 2003), pp. 29-34, Aug. 2003.

Kartootli M. et al., "Semi-parallel reconfigurable architectures for real-time LDPC decoding", Proc., IEEE Internat. Conf. on Information Technology: Coding and Computing, vol. 1, Apr. 5, 2004, pp. 579-585.

Mansour M M et al., "High-throughput LDPC decoders", IEEE Transactions on Very Large Scale Integration Systems, vol. 11, No. 6, Dec. 1, 2003, pp. 976-996.

Japanese Office Action for Japanese Patent Application No. 2005-125962 dated Jul. 15, 2010.

* cited by examiner

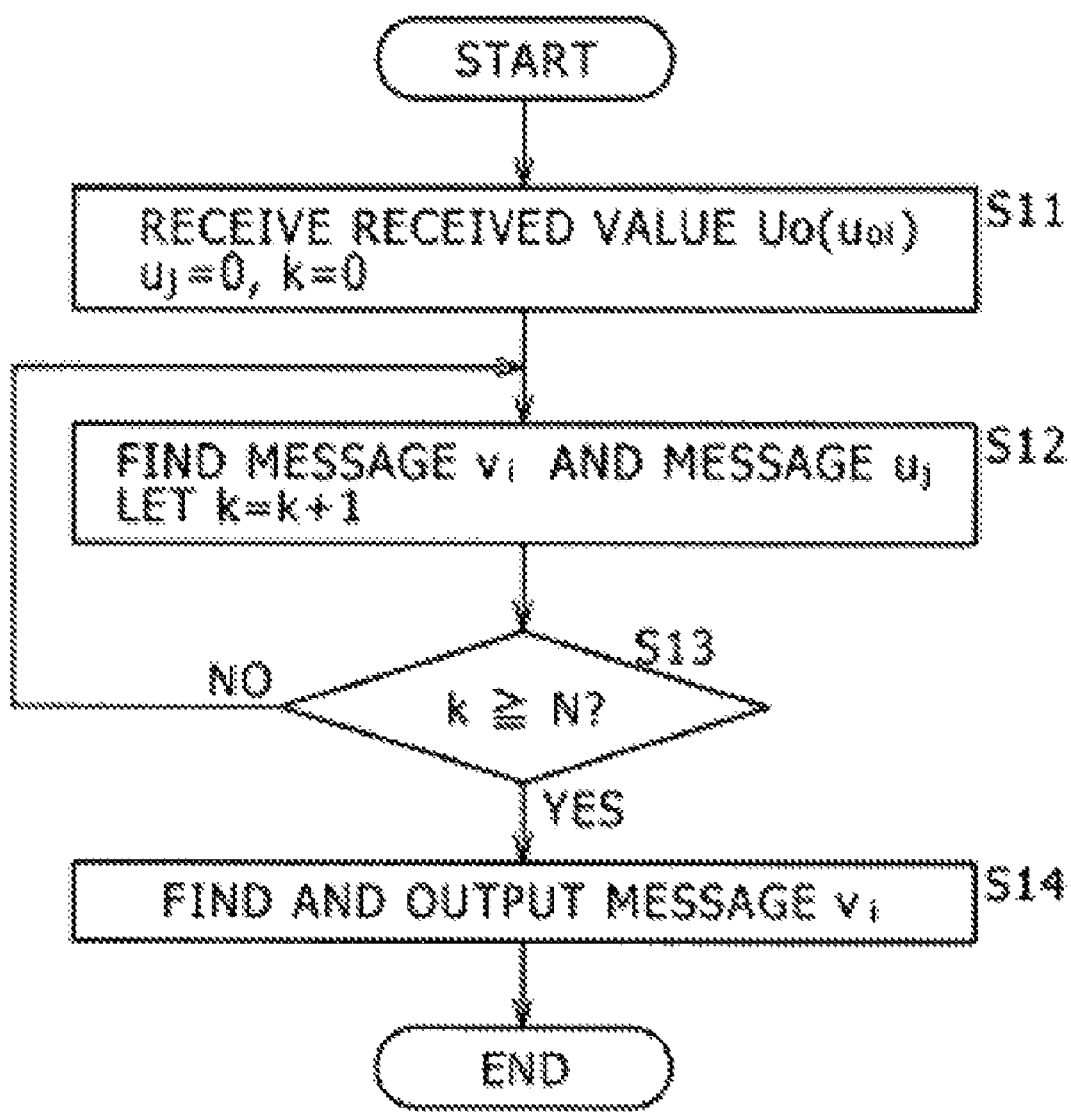

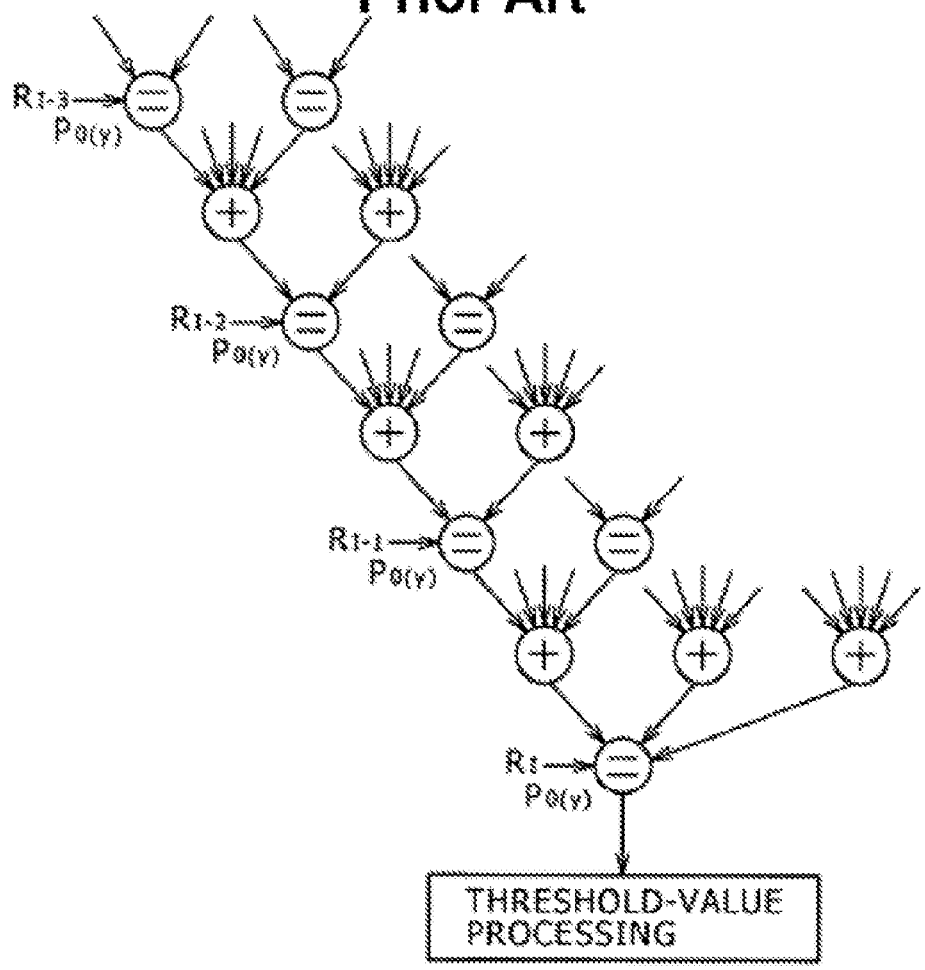

Prior Art

DECODING APPARATUS AND DECODING METHOD

TECHNICAL FIELD

The present invention relates to a decoding apparatus and a decoding method. More particularly, the present invention relates to a decoding apparatus and a decoding method, which are used for decoding codes obtained as a result of a coding process producing low density parity check codes (LDPC coding).

BACKGROUND ART

In recent years, researches in fields including communication fields such as the mobile-body communication and the deep-space communication as well as broadcasting fields such as the terrestrial wave broadcasting and the satellite digital broadcasting have been making very good progress. Accompanying these researches, studies of coding theories are also well conducted with the intention of increasing the efficiencies of error correction coding and error correction decoding.

A Shannon limit given by the so-called communication line coding theorem established by C. E. Shannon is known as a theoretical limit of coding performances. Studies of coding theories are conducted with the intention of developing codes demonstrating a performance close to the Shannon limit. In recent years, a technique known as the so-called turbo coding technique is being developed as a coding method demonstrating a performance close to the Shannon limit. The turbo coding technique is, for example, a coding technique such as PCCCs (Parallel Concatenated Convolutional Codes) and SCCCs (Serially Concatenated Convolutional Codes). While turbo codes are being developed, low density parity check codes are attracting a great deal of attention. Referred to hereafter as LDPC codes, the low density parity check codes are codes used in a coding method, which has been known since an early time in the past.

The LDPC codes were first proposed in a document authored by R. G. Gallager with a title of "Low Density Parity Check Codes," as a document published by M. I. T. Press in the year of 1963 in Cambridge, Mass. Later on, the LDPC codes again drew lots of attention as described in documents such as a document authored by D. J. C. Mackay with a title of "Good error correcting codes based on very sparse matrices" as a document submitted to IEEE Trans. Inf. Theory, IT-45, pp. 399-431, 1999 and a document authored by M. G. Luby, M. Mitzenmacher, M. A. Shokrollahi and D. A. Spielman with a title of "Analysis of low density codes and improved designs using irregular graphs" in Proceedings of ACM Symposium on Theory of Computing, pp. 249-258, 1998.

Researches conducted in recent years are also clarifying the fact that, by increasing the code length of the LDPC codes, it is possible to display a performance close to the Shannon limit in the same way as the turbo codes or the like. In addition, the LDPC codes exhibit a property showing that the minimum distance is proportional to the code length. Thus, the LDPC codes offer merits that the LDPC codes have a good block error probability characteristic as one of its characteristics and the so-called error floor phenomenon hardly occurs in the LDPC codes. The error floor phenomenon is a phenomenon observed in decoding characteristics of the turbo codes or the like.

The LDPC codes are explained concretely as follows. It is to be noted that the LDPC codes are linear codes but are not necessarily 2-dimensional codes. In the following description, however, the LDPC codes are explained as 2-dimensional codes.

The most peculiar characteristic of the LDPC codes is the fact that a parity check matrix defining the LDPC codes is a sparse matrix. A sparse matrix is a matrix having a very small number of matrix elements each set at "1". Let notation H denote a sparse parity check matrix. In this case, as shown in FIG. 1, a typical sparse matrix H has a humming weight of "3" for each column and a humming weight of "6" for each row.

LDPC codes defined by a parity check matrix H having a constant hamming weight for each row and a constant hamming weight for each column as described above are referred to as regular LDPC codes. On the other hand, LDPC codes defined by a parity check matrix H having a hamming weight varying from row to row and a hamming weight varying from column to column are referred to as irregular LDPC codes.

A LDPC-code encoding process is implemented to produce a generation matrix G on the basis of the parity check matrix H and generate code words by multiplying the generation matrix G by a 2-dimensional information message. To put it concretely, first of all, a coding apparatus for carrying out an LDPC-code encoding process finds a generation matrix G for which the equation $GH^T=0$ holds true, where notation $H^T$ denotes the transposed matrix of the parity check matrix H. In this case, if the generation matrix G is a k×n matrix (that is, a matrix having k rows and n columns), the parity check matrix H is an (n−k)−row×n-column matrix.

If an n-bit code word c is an organization code matching a bit sequence including a k-bit information message u and (n−k) parity bits following the information message u for example, the (n−k)−row×n-column parity check matrix H includes an information portion and a parity portion. Associated with the k-bit information message u of the code word c having n bits, the information portion is a matrix portion having (n−k) rows and k columns. Associated with the (n−k) parity bits of the n-bit code word c, the parity portion is a matrix portion having (n−k) rows and (n−k) columns. In this case, if the parity portion is an upper triangular matrix or a lower triangular matrix, the process to code the information message u into LDPC codes can be carried out by making use of the parity check matrix H.

That is to say, for example, the parity check matrix H has an information portion and a parity portion, which is a lower triangle matrix as shown in FIG. 2. If all the elements of the lower triangle matrix of the parity portion are set at 1, the first one of the parity bits included in the code word c has a value obtained as a result of carrying out EXOR (exclusive logical sum) operations on elements each set at 1 on the first row of the information portion included in the parity check matrix H as a matrix portion associated with the information message u.

By the same token, the second one of the parity bits included in the code word c has a value obtained as a result of carrying out EXOR operations on elements each set at 1 on the second row of the information portion included in the parity check matrix H as a matrix portion associated with the information message u and the first one of the parity bits.

Likewise, the third one of the parity bits included in the code word c has a value obtained as a result of carrying out EXOR operations on elements each set at 1 on the third row of the information portion included in the parity check matrix H as a matrix portion associated with the information message u and the first and second ones of the parity bits.

Thereafter, similarly, the ith one of the parity bits included in the code word c has a value obtained as a result of carrying out EXOR operations on elements each set at 1 on the ith row of the information portion included in the parity check matrix H as a matrix portion associated with the information message u and first to (i−1)th ones of the parity bits.

The values of the (n−k) parity bits are found as described above, and the (n−k) parity bits are placed at a location following the information message u having k bits in order to create the code word having n bits.

A technique for decoding LDPC codes can be carried out by adoption of an algorithm proposed by Gallager as an algorithm referred to as a probabilistic decoding algorithm. The probabilistic decoding algorithm is a message passing algorithm based on belief propagation on the so-called Tanner graph including variable nodes also referred to as message nodes and check nodes. In the following description, the variable nodes and the check nodes may be properly referred to simply as nodes.

In a probabilistic decoding process, however, a message exchanged between nodes is a real number. Thus, in order to analyze the message, it is necessary to keep track of nothing but the probabilistic distribution of the message having a continuous value. That is to say, it is necessary to carry out an analysis entailing a very high level of difficulty. In order to solve this problem, Gallager proposed algorithms A and B as algorithms for decoding LDPC codes.

In general, a process for decoding LDPC codes is carried out in accordance with a procedure like one represented by a flowchart shown in FIG. 3. It is to be noted that, in the flowchart representing the procedure, notation $U_o$ ($u_{oi}$) denotes a received value, notation $u_j$ denotes a message output from a check node and notation $v_i$ denotes a message output from a variable node. In this case, a message is a real number expressing the "0" likelihood of a value in terms of the so-called log likelihood ratio. In addition, the log likelihood ratio expressing the "0" likelihood of the received value $U_o$ is represented as received data $u_{oi}$.

As shown in the flowchart of FIG. 3, the procedure for decoding LDPC codes begins with a step S11 at which a value $U_o$ ($u_{oi}$) is received. At the same step, a message $u_j$ and a variable k are initialized to 0. The variable k is used as a repetition processing counter taking an integer. Then, the flow of the procedure goes on to a step S12. At the step S12, a message $v_i$ is found in accordance with Eq. (1) based on the received value $U_o$ ($u_{oi}$). Then, a message $u_j$ is found in accordance with Eq. (2), which is based on the message $v_i$.

[Eq. 1]

$$v_i = u_{0i} + \sum_{j=1}^{d_v-1} u_j \qquad (1)$$

[Eq. 2]

$$\tanh\left(\frac{u_j}{2}\right) = \prod_{i=1}^{d_c-1} \tanh\left(\frac{v_i}{2}\right) \qquad (2)$$

Notation $d_v$ used in Eq. (1) denotes a parameter representing the number of elements arranged in the vertical direction (or the row arrangement direction) of the parity check matrix H as elements each set at "1". On the other hand, notation $d_c$ used in Eq. (2) denotes a parameter representing the number of elements arranged in the horizontal direction (or the column arrangement direction) of the parity check matrix H as elements each set at "1". The parameters $d_v$ and $d_c$ can be selected arbitrarily. In the case of a (3, 6) code for example, the parameter $d_v$ is set at 3 (or $d_v$=3) whereas, the parameter $d_c$ is set at 6 (or $d_c$=6).

It is to be noted that a message input from an edge for which a message is to be output is not used as an addition or multiplication parameter in the computation according to Eq. (1) or (2) respectively. Thus, the range of the summation operation according to Eq. (1) is from 1 to ($d_v$−1) whereas the range of the multiplication operation according to Eq. (2) is from 1 to ($d_c$−1). In addition, the multiplication operation according to Eq. (2) is actually carried out by creating a table showing values of a function R ($v_1$, $v_2$) expressed by Eq. (3) in advance and using the value of the function R continuously (or recursively) as shown in Eq. (4). The function R ($v_1$, $v_2$) has two inputs $v_1$ and $v_2$, generating one output as the value of the function.

[Eq. 3]

$$x = 2\tan h^{-1}[\tan h(v_1/2)\tan h(v_2/2)] = R(v_1, v_2) \qquad (3)$$

[Eq. 4]

$$u_j = R(v_1, R(v_2, R(v_{d_c-2}, v_{d_c-1}))))  \qquad (4)$$

At the step S12, the variable k is also incremented by "1". Then, the flow of the procedure goes on to a step S13. At the step S13, the variable k is compared with a repetitive-decoding count N determined in advance in order to produce a result of determination as to whether or not the variable k is at least equal to the repetitive-decoding count N. If the determination result produced in the process carried out at the step S13 indicates that the variable k is smaller than the repetitive-decoding count N, the flow of the procedure goes back to the step S12 in order to repeat the processes of the step S13 and the subsequent steps in the same way as before.

If the determination result produced in the process carried out at the step S13 indicates that the variable k is at least equal to the repetitive-decoding count N, on the other hand, the flow of the procedure goes on to a step S14 at which a process according to Eq. (5) is carried out in order to find and output a message v as an eventual output decoding result. Then, the execution of the procedure for decoding LDPC codes is ended.

[Eq. 5]

$$v = u_{0i} + \sum_{j=1}^{d_v} u_j \qquad (5)$$

The process according to Eq. (5) is different from the process according to Eq. (1) in that the process according to Eq. (5) is carried out by making use of input messages from all edges connected to the variable nodes.

In the case of a (3, 6) code for example, such a process for decoding LDPC codes is carried out by exchanging messages between nodes as shown in FIG. 4. In a node marked with the "=" special character as shown in FIG. 4 to indicate that the node is a variable node, a computation process according to Eq. (1) is carried out. In a node marked with the "+" to indicate that the node is a check node, on the other hand, a computation process according to Eq. (2) is carried out. Particularly, in accordance with the algorithm A, messages are each converted into a 2-dimensional message. In every node marked with the "+", an exclusive logical summation process is carried out on ($d_c$−1) input messages. In every node marked with the "=", on the other hand, for a received value R, if ($d_v$−1) input messages are all different bit values, the code is inverted before being output.

In addition, also in recent years, a method for implementing the technique for decoding LDPC codes is being studied as well. Before the method for implementing the technique for decoding LDPC codes is explained, first of all, modeling of the technique for decoding LDPC codes is described.

FIG. 5 is a diagram showing a typical parity check matrix H defining (3, 6) LDPC codes having a coding rate of ½ and a code length of 12. The parity check matrix H can be expressed by making use of a Tanner graph shown in FIG. 6. In the Tanner graph shown FIG. 6, a node marked with the "+" special character is a check node whereas a node marked with the "=" special character is a variable node. The check and variable nodes correspond respectively to the rows and the columns of the parity check matrix H. A line connecting a check node to a variable node is referred to as an edge corresponding to a matrix element set at "1" in the parity check matrix H. That is to say, if a matrix element located at the intersection of the jth row and the ith column in the parity check matrix H is set at 1, in the Tanner graph shown in FIG. 6, the ith variable node (or the ith node marked with the "=" special character) from the top of the graph is connected by an edge to the jth check node (or the jth node marked with the "+" special character) from the top of the graph. An edge connecting a check node to a variable node indicates that a coding bit for the variable node imposes a condition of constraint on the check node. It is to be noted that the Tanner graph shown in FIG. 6 is a Tanner graph drawn for the parity check matrix H shown in FIG. 5.

In accordance with a sum product algorithm adopted as an algorithm of the method for decoding LDPC codes, variable-node and check-node computation processes are carried out repeatedly.

In a variable node, the computation according to Eq. (1) is carried out as shown in FIG. 7. That is to say, as shown in FIG. 7, a message $v_i$ for an edge serving as the object of message computation is computed by making use of messages $u_1$ and $u_2$ from remaining edges each connected to the variable node as well as received information $u_{oi}$. Messages for other edges are computed in the same way.

Before the check-node computation process is explained, Eq. (2) is rewritten into Eq. (6) given below by making use of the equation a×b=exp{ ln(|a|)+ln(|b|)}×sign (a)×sign (b) where sign (x) has a value of 1 for x≧0 and a value of −1 for x<0.

[Eq. 6]

$$u_j = 2\tanh^{-1}\left(\prod_{i=1}^{d_c-1} \tanh\left(\frac{v_i}{2}\right)\right) \qquad (6)$$

$$= 2\tanh^{-1}\left[\exp\left\{\sum_{i=1}^{d_c-1} \ln\left(\left|\tanh\left(\frac{v_i}{2}\right)\right|\right)\right\} \times \prod_{i=1}^{d_c-1} \text{sign}\left(\tanh\left(\frac{v_i}{2}\right)\right)\right]$$

$$= 2\tanh^{-1}\left[\exp\left\{-\left(\sum_{i=1}^{d_c-1} -\ln\left(\tanh\left(\frac{|v_i|}{2}\right)\right)\right)\right\} \times \prod_{i=1}^{d_c-1} \text{sign}(v_i)\right]$$

In addition, if the equation $\phi(x)=\ln(\tan h(x/2))$ is defined for x≧0, the equation $\phi^{-1}(x)=2\tan h^{-1}(e^{-x})$ holds true. Thus, Eq. (6) can be rewritten into Eq. (7) given as follows.

[Eq. 7]

$$u_j = \phi^{-1}\left(\sum_{i=1}^{d_c-1} \phi(|v_i|)\right) \times \prod_{i=1}^{d_c-1} \text{sign}(v_i) \qquad (7)$$

In a check node, the computation according to Eq. (7) is carried out as shown in FIG. 8. That is to say, as shown in FIG. 8, a message $u_j$ for an edge serving as the object of message computation is computed by making use of messages $v_1$, $v_2$, $v_3$, $v_4$ and $v_5$ from remaining edges each connected to the check node. Messages for other edges are computed in the same way.

It is to be noted that the function $\phi(x)$ can also be expressed by the equation $\phi(x)=\ln((e^x+1)/(e^x-1))$. Thus, the equation $\phi(x)=\phi^{-1}(x)$ holds true for x>0. If the functions $\phi(x)$ and $\phi^{-1}(x)$ are implemented by hardware, the functions may be realized by making use of a LUT (Look Up Table) in some cases. In these cases, the same LUT common to both the functions is used.

If the sum product algorithm is implemented by making use of hardware, the variable-node computation according to Eq. (1) and the check-node computation according to Eq. (7) need to be carried out repeatedly by making use of a proper circuit scale and at a proper operating frequency.

First of all, the following description explains an implementation method adopted in a decoding process. In accordance with the implementation method, computations at nodes are simply carried out sequentially one computation after another in order to perform a decoding process.

It is to be noted that, in this case, let a decoding process be carried out in order to decode codes expressed by a parity check matrix H having 36 (rows)×108 (columns) as shown in FIG. 9 as codes having a coding rate of ⅔ and a code length of 108. The number of matrix elements each set at 1 in the parity check matrix H is 323. Thus, the number of edges in the Tanner graph representing the parity check matrix H is also 323. In the parity check matrix H shown in FIG. 9, matrix elements reset to 0 are each represented by the period ".".

FIG. 10 is a diagram showing a decoding apparatus for carrying out a process of decoding LDPC codes once.

In the decoding apparatus shown in FIG. 10, for every operating clock, a message for 1 edge is computed.

That is, the decoding apparatus shown in FIG. 10 is provided with two edge memories 100 and 102, a check-node computer 101, a variable-node computer 103, a reception memory 104 and a control section 105.

In the decoding apparatus shown in FIG. 10, message data are read out from the edge memory 100 or 102 sequentially one message after another. Then, a message for an edge serving as an object of message computation is computed by making use of the messages read out from the edge memory 100 or 102. Subsequently, the messages computed for the edge serving as an object of message computation are stored in the edge memory 102 or 100 provided at a stage following the edge memory 100 or 102 respectively sequentially one message after another. In order to carry out this decoding process repeatedly, a plurality of decoding apparatus each like the one shown in FIG. 10 as a decoding apparatus for carrying out a process of decoding LDPC codes once are connected to each other in a cascade configuration. As an alternative, the decoding apparatus shown in FIG. 10 is used repeatedly in order to carry out the decoding process repeatedly. It is to be noted that, in the following description, as an example, a plurality of decoding apparatus each like the one shown in FIG. 10 as a decoding apparatus for carrying out a process of decoding LDPC codes once are connected to each other in a cascade configuration.

The edge memory 100 is used for storing messages D100 each received from a variable-node computer 103 employed in a decoding apparatus provided at the immediately preceding stage not shown in the figure in an order the check-node computer 101 provided at the stage following the edge memory 100 reads out the messages D100. Then, at a check-node computation phase, the messages D100 are read out from the edge memory 100 and supplied to the edge memory 100 as messages D101 in the order the messages D100 were stored in the edge memory 100.

On the basis of a control signal D106 received from the control section 105, the check-node computer 101 carries out the computation process according to Eq. (7) by making use of the messages D101 in order to generate a message D102, and supplies the message D102 to the edge memory 102 provided at a stage immediately following the check-node computer 101.

The edge memory 102 is used for storing messages D102 received from the check-node computer 101 provided at the immediately preceding stage in an order the variable-node computer 103 provided at the stage immediately following the edge memory 102 reads out the messages D100. Then, at a variable-node computation phase, the messages D102 are read out from the edge memory 102 and supplied to the variable-node computer 103 as messages D103 in the order the messages D102 were stored in the edge memory 102.

In addition, the variable-node computer 103 also receives a control signal D107 from the control section 105 and received data D104 from the reception memory 104. On the basis of the control signal D107, the variable-node computer 103 carries out the computation process according to Eq. (1) by making use of the message D103 received from the edge memory 100 and the received data D104 received from the reception memory 100 in order to produce a message D105 as a result of the computation process, and supplies the message D105 to an edge memory 100 employed in a decoding apparatus provided at the immediately following stage not shown in the figure.

The reception memory 104 is used for storing LDPC codes, which are received data already converted into LDPC codes. The control section 105 supplies the control signal D106 to the check-node computer 101 as a signal for controlling the check-node computation process. By the same token, the control section 105 supplies the control signal D107 to the variable-node computer 103 as a signal for controlling the variable-node computation process. The control section 105 supplies the control signal D106 to the check-node computer 101 when messages received from all edges have been stored in the edge memory 100. By the same token, the control section 105 supplies the control signal D107 to the variable-node computer 103 when messages received from all edges have been stored in the edge memory 102.

FIG. 11 is a block diagram showing a typical configuration of the check-node computer 101 employed in the decoding apparatus shown in FIG. 10 as a check-node computer 101 for carrying out check-node computation processes sequentially one process after another.

It is to be noted that, in the configuration shown in FIG. 11 as the configuration of the check-node computer 101, each message is quantized into a total of 6 bits including a sign bit. In addition, in the configuration shown in FIG. 11, a check-node computation process is carried out on LDPC codes defined by the parity check matrix H shown in FIG. 9. Moreover, the check-node computer 101 shown in FIG. 11 receives a clock signal ck providing the necessary clock signal ck to the check-node computer 101. Thus, each block employed in the check-node computer 101 carries out an operation synchronously with the clock signal ck.

On the basis of the control signal D106 received from the control section 105 as a control signal including typically 1 bit, the check-node computer 101 shown in FIG. 11 carries out the computation process according to Eq. (7) by making use of messages D101 sequentially read out from the edge memory 100 one message after another.

That is to say, the check-node computer 101 reads out 6-bit messages D101 (or messages $v_i$) each received from a variable node corresponding to a column of the parity check matrix H sequentially one message after another, supplying the less significant bits included in the message as bits representing an absolute value D122 ($|v_i|$) of the message to a LUT 121 and the most significant bit D121 included in the message as a bit representing the sign of the message to an EXOR circuit 129 and a FIFO (First In First Out) memory 133. In the check-node computer 101, the control signal D106 received from the control section 105 is supplied to selectors 124 and 131.

For the absolute value D122 ($|v_i|$) supplied to the LUT 121, the LUT 121 reads out 5-bit data D123 ($\phi(|v_i|)$ used in the computation process according to Eq. (7)) and supplies the data D123 ($\phi(|v_i|)$) to an adder 122 and a FIFO memory 127.

The adder 122 adds the data D123 ($\phi(|v_i|)$) to 9-bit data D124 stored in a register 123 and stores back the cumulative sum including 9 bits in the register 123 as new 9-bit data D124 replacing the previous data D124 also including 9 bits. It is to be noted that, when the process to find the cumulative sum has been completed for the absolute values D122 ($|v_i|$) of messages D101 received from all the edges along 1 row of the parity check matrix H, the register 123 is reset.

When messages D101 received from all the edges along 1 row of the parity check matrix H are read out sequentially one message after another and the final cumulative sum representing the sum of function values D123 along the row is stored in the register 123, the control section 105 changes the control signal D106 supplied thereby from 0 to 1. For a row weight of 9 for example, the control signal D106 stays at 0 during a period covering the first to eighth clock pulses. As the ninth clock pulse is generated, the control section 105 changes the control signal D106 from 0 to 1.

With the control signal D106 set at 1, a selector 124 selects the cumulative sum D124 stored in the register 123 and supplies the cumulative sum D124 to a register 125 as data D125 to be stored in the register 125. The cumulative sum D124 stored in the register 123 with the control signal D106 set at 1 is a 9-bit value obtained as a result of cumulatively adding the function values D123 (or $\phi(|v_i|)$) obtained for messages D101 (or messages $v_i$) received from all the edges along 1 row of the parity check matrix H. That is to say, the cumulative sum D124 stored in the register 123 with the control signal D106 set at 1 is the value of $\Sigma\phi(|v_i|)$ for a summation range starting from i=1 and ending at i=$d_c$. The data D125 stored in the register 125 is supplied to the selector 124 and an adder 126 as data D126 including 9 bits. With the control signal D106 reset at 0, on the other hand, the selector 124 selects the 9-bit data D126 received from the register 125 and outputs the selected data D126 including 9 bits to the register 125 as data to be stored in the register 125 again. That is to say, the register 125 supplies a cumulative value obtained previously as the 9-bit cumulative sum of the function values $\phi(|v_i|)$ to the selector 124 and the adder 126 till data including 9 bits is obtained as a result of cumulatively adding the function values φ(|v$_i$|) obtained for messages D101 (or messages vi) received from all the edges along 1 row of the parity check matrix H.

On the other hand, the FIFO memory 127 delays the data D123 (φ(|v$_i$|)) output by the LUT 121 to a point of time at which the register 125 supplies new data D126 (Σφ(|v$_i$|) for a summation range starting from i=1 and ending at i=d$_c$) to the adder 126. Then, the FIFO memory 127 supplies the data D123 to an adder 126 as data D127 including 5 bits. The adder 126 subtracts the data D127 supplied by the FIFO memory 127 from the data D126 supplied by the register 125 and supplies the difference to an LUT 128 as difference data D128 including 5 bits. That is to say, the adder 126 subtracts the 5-bit function value φ(|v$_i$|) found for a message D101 (or a message v$_i$) received from an edge serving as an object of message computation from 9-bit data obtained as a result of cumulatively adding the function values φ(|v$_i$|) obtained for messages D101 (or messages v$_i$) received from all the edges along 1 row of the parity check matrix H, and supplies the difference to an LUT 128 as the difference data D128 including 5 bits. The difference data D128 is thus the value of Σφ(|v$_i$|) for a summation range starting from i=1 and ending at i=(d$_c$−1).

It is to be noted that, even though the adder 126 subtracts the 5-bit data D127 supplied by the FIFO memory 127 from the 9-bit data D126 supplied by the register 125 to result in a difference including up to 9 bits, the adder 126 supplies difference data D128 including 5 bits. In consequence, if the adder 126 subtracts the 5-bit data D127 supplied by the FIFO memory 127 from the 9-bit data D126 supplied by the register 125 to result in a difference, that cannot be expressed by 5 bits, that is, if the adder 126 produces a difference greater than 31 (or 11111 if represented in the binary format), which is the maximum value of data including 5 bits, the adder 126 clips the difference to the maximum value of 31 and supplies the maximum value as the difference data D128 including 5 bits.

For the difference data D128, which is the value of Σφ(|v$_i$|) for a summation range starting from i=1 and ending at i=(d$_c$−1), the LUT 128 reads out 5-bit data D129 (φ$^{-1}$(Σφ(|v$_i$|))) used in the computation process according to Eq. (7)).

Concurrently with the processing described above, the EXOR circuit 129 computes the exclusive logical sum of 1-bit data D131 stored in a register 130 and the sign bit D121. That is to say, the EXOR circuit 129 computes the product of two sign bits. The multiplication result D130 including 1 bit is stored back in the register 130. It is to be noted that, when the sign bits D121 extracted from messages D101 received from all the edges along 1 row of the parity check matrix H have been subjected to the multiplication process carried out by the EXOR circuit 129, the contents of the register 130 are reset.

When the multiplication result D130 (Πsign (v$_i$) from i=1 and ending at i=d$_c$) obtained from the multiplication processes carried out on the sign bits D121 extracted from messages D101 received from all the edges along 1 row of the parity check matrix H is stored in the register 130, the control section 105 changes the control signal D106 supplied thereby from 1 to 0.

With the control signal D106 set at 1, a selector 131 selects the multiplication result D131 stored in the register 130 and supplies the multiplication result D131 to a register 132 as 1-bit data 132 to be stored in the register 132. As described above, the multiplication result D131 stored in the register 130 with the control signal D106 set at 1 is a 1-bit data obtained as a result of the multiplication processes on the sign bits D121 extracted from messages D101 received from all the edges along 1 row of the parity check matrix H. That is to say, the multiplication result D131 stored in the register 130 with the control signal D106 set at 1 is the value of Π sign (v$_i$) for a multiplication range starting from i=1 and ending at i=d$_c$. The data D132 stored in the register 132 is supplied to the selector 131 and an EXOR circuit 134 as data D133 including 1 bit. With the control signal D106 reset at 0, on the other hand, the selector 131 selects the 1-bit data D133 received from the register 132 and outputs the selected data D133 including 1 bit to the register 132 as data to be stored in the register 132 again. That is to say, the register 132 supplies the data D133 already stored therein to the EXOR circuit 134 and the selector 131 till data including 1 bit is obtained as a result of the multiplication processes carried out by the EXOR circuit 129 on the sign bits D121 extracted from messages D101 (or messages v$_i$) received from all the edges along 1 row of the parity check matrix H.

On the other hand, the FIFO memory 133 delays the sign bit D121 to a point of time at which the register 132 supplies new data D133 (or the value of Π sign (v$_i$) for a multiplication range starting from i=1 and ending at i=d$_c$) to the EXOR circuit 134. Then, the FIFO memory 133 supplies the delayed sign bit D121 to the EXOR circuit 134 as data D134 including 1 bit. The EXOR circuit 134 computes an exclusive logical sum of the data D133 received from the register 132 and the 1-bit data D134 received from the FIFO memory 133 in order to divide the data D133 by the data D134 including 1 bit, producing a division result also including 1 bit. Then, the EXOR circuit 134 outputs the division result including 1 bit as data D135. That is to say, the EXOR circuit 134 divides a product of sign bits D121 (sign (|v$_i$|)) extracted from messages D101 received from all the edges along 1 row of the parity check matrix H by the sign bit D121 (sign (|v$_i$|)) extracted from a message D101 (or a message v$_i$) received from an edge serving as an object of message computation, and outputs the division result (or the value of Π sign (v$_i$) for a multiplication range starting from i=1 and ending at i=(d$_c$−1)) as the division result D135.

The check-node computer 101 concatenates the 5-bit processing result D129 generated by the LUT 128 with the 1-bit division result D135 produced by the EXOR circuit 134 by taking the processing result D129 including 5 bits as 5 less significant bits and the division result D135 including 1 bit as the most significant bit in order to output a message D102 (or a message u$_j$) including a total of 6 bits.

As described above, the check-node computer 101 carries out the computation processing according to Eq. (7) in order to find a message u$_j$.

It is to be noted that, since the maximum value of the row weight for the parity check matrix H shown in FIG. 9 is nine, that is, since the maximum number of messages supplied to the check node is nine, the check-node computer 101 is provided with the FIFO memory 127 and the FIFO memory 133, which are used for delaying the nine messages (or the value of the function φ(|v$_i$|)). In a process to handle row messages fewer than the row weight of 9, the magnitude of the delay provided by the FIFO memory 127 and the FIFO memory 133 can be reduced to a value corresponding to the row weight for the processed row messages.

FIG. 12 is a block diagram showing a typical configuration of the variable-node computer 103 included in the decoding apparatus shown in FIG. 10 as a variable-node computer 103 for carrying out variable-node computation processes sequentially one process after another.

It is to be noted that, in the configuration shown in FIG. 12 as a typical configuration of the variable-node computer 103, each message is quantized into a total of 6 bits including a sign bit. In addition, in the configuration shown in FIG. 12, a variable-node computation process is carried out on LDPC codes expressed by the parity check matrix H shown in FIG. 9. On top of that, the variable-node computer 103 shown in FIG. 12 receives a clock signal ck providing the necessary clock signal ck to the variable-node computer 103. Thus, each block employed in the variable-node computer 103 carries out an operation synchronously with the clock signal ck.

On the basis of the control signal D107 received from the control section 105 as a control signal having typically 1 bit, the variable-node computer 103 shown in FIG. 12 carries out the computation process according to Eq. (1) by making use of messages D103 sequentially read out from the edge memory 102 one message after another and received data D104 read out from the reception memory 104.

That is to say, the variable-node computer 103 reads out 6-bit messages D103 (or messages uj) each received from a check node corresponding to a row of the parity check matrix H sequentially one message after another, supplying the messages D103 to an adder 151 and a FIFO memory 155. In addition, the variable-node computer 103 reads out pieces of received D104 including 6 bits from the reception memory 104 sequentially one piece after another, supplying the pieces of received including 6 bits to an adder 156. The variable-node computer 103 supplies a control signal D107 received from the control section 105 to a selector 153.

The adder 151 adds the message D103 (or the message $u_j$) to 9-bit data D151 stored in a register 152 in order to produce a cumulative message D103 including 9 bits and stores the cumulative message D103 also including 9 bits also in the register 152. It is to be noted that, after the messages D103 received from all the edges along one column of the parity check matrix H are cumulatively added and stored in the register 152, the contents of the register 152 are reset.

After the variable-node computer 103 reads out messages D103 received from all edges along a column of the parity check matrix H sequentially one message after another and the adder 151 adds the message D103 in order to produce a cumulative message D103 including 9 bits and stores the cumulative message D103 also including 9 bits also in the register 152, the control section 105 changes the control signal D107 supplied thereby from 0 to 1. In the case of a column weight of 5 for example, the control signal D107 stays at 0 during a period covering the first to fourth clock pulses. As the fifth clock pulse is generated, the control section 105 changes the control signal D107 from 0 to 1.

With the control signal D107 set at 1, a selector 153 selects the 9-bit cumulative sum D151 stored in the register 152 and supplies the selected cumulative sum D151 to a register 154 to be stored in the register 154. The cumulative sum D151 stored in the register 152 set at 1 is a 9-bit value obtained as a result of cumulatively adding the messages D103 (or messages $u_j$) received from all the edges along 1 column of the parity check matrix H. That is to say, the cumulative sum D151 stored in the register 152 set at 1 is the value of $\Sigma u_j$ for a summation range starting from j=1 and ending at j=$d_v$. The data D151 stored in the register 154 is supplied to the selector 153 and an adder 156 as data D152 consisting of 9 bits. With the control signal D107 reset at 0, on the other hand, the selector 153 selects the 9-bit data D152 received from the register 154 and outputs the selected data D152 including 9 bits to the register 154 as data to be stored in the register 154 again. That is to say, the register 154 supplies the 9-bit data D152 obtained as a result of the cumulative additions carried out previously to the selector 153 and the adder 156 till data consisting of 9 bits is obtained as a result of cumulatively adding the function values $\phi(|v_i|)$ obtained for messages D103 (or messages $u_j$) received from all the edges along 1 column of the parity check matrix H.

On the other hand, a FIFO memory 155 delays the message D103 received from a check node to a point of time at which the register 154 supplies new data D152 ($\Sigma u_j$ for a summation range starting from i=1 and ending at i=$d_v$) to an adder 156. Then, the FIFO memory 155 supplies the delayed data D103 to the adder 156 as data D153 including 6 bits. The adder 156 subtracts the data D153 supplied by the FIFO memory 155 from the data D152 supplied by the register 154. That is to say, the adder 156 subtracts the message $u_j$ received from an edge serving as an object of message computation from the messages D103 (the messages $u_j$) received from all the edges along 1 column of the parity check matrix H, and outputs the difference. The difference is thus the value of $\Sigma u_j$ for a summation range starting from j=1 and ending at j=($d_v$−1). In addition, the adder 156 adds the difference (which is the value of $\Sigma u_j$ for a summation range starting from j=1 and ending at j=($d_v$−1)) to the received data D104 read out from the reception memory 104 in order to produce a sum including 6 bits and outputs the sum as a message D105 (a message $v_i$).

As described above, the variable-node computer 103 carries out a computation process according to Eq. (1) in order to generate a message $v_i$.

It is to be noted that, since the maximum value of the column weight for the parity check matrix H shown in FIG. 9 is 5, that is, since the maximum number of messages supplied to the variable node is 5, the variable-node computer 1031s provided with the FIFO memory 155 for delaying the five messages $u_j$. In a process to handle column messages fewer than the column weight of 5, the magnitude of the delay provided by the FIFO memory 155 can be reduced to a value corresponding to a column weight for the processed column messages.

As described above, the adder 156 subtracts the 6-bit data D153 supplied by the FIFO memory 155 from the 9-bit data D152 supplied by the register 154, producing a difference and, then, the adder 156 adds the difference to the 6-bit received data D104 read out from the reception memory 104 in order to produce a result smaller than a minimum value, which can be represented by a message D105 including 6 bits, or a result greater than a maximum value. If the adder 156 produces a result smaller than the minimum value, which can be represented by a message D105 including 6 bits, the adder 156 clips the result to the minimum value. If the adder 156 produces a result greater than the maximum value, which can be represented by a message D105 including 6 bits, on the other hand, the adder 156 clips the result to the maximum value.

The decoding apparatus shown in FIG. 10 receives control signals from the control section 105 in accordance with weights of the parity check matrix H. Then, by merely changing the control signals, the decoding apparatus is capable of decoding LDPC codes by making use of various parity check matrixes H provided that the storage capacities of the edge memory 100, the edge memory 102, the FIFO memory 127 and the FIFO memory 133, which are employed in the check-node computer 101, and the FIFO memory 155 employed in the variable-node computer 103 are sufficient.

It is to be noted that, at the last decoding stage in the decoding apparatus shown in FIG. 10, a process according to Eq. (5) can be carried out as a substitute for the variable-node process according to Eq. (1) and the result of the process according to Eq. (5) can be output as the final decoding result. This feature is not shown in the figure though.

If the LDPC codes are decoded by making use of a series of decoding apparatus each like the one shown in FIG. 10, the check-node processing and the variable-node processing are carried out alternately. That is to say, in such a series of decoding apparatus each like the one shown in FIG. 10, a variable-node computer 103 carries out the variable-node processing by making use of the result of the check-node processing carried out by a check-node computer 101 whereas a check-node computer 101 carries out the check-node processing by making use of the result of the variable-node processing carried out by a variable-node computer 103.

Thus, in a decoding process making use of a parity check matrix H having 323 edges as shown in FIG. 9, 646 (=323×2) clock pulses are required. In order to carry out 50 decoding processes for example, 108 codes forming received data are handled as a frame. In this case, the number 108 is the code length. While 1 frame is being received, an operation driven by 32,300 (=646×50) clock pulses is necessary. That is to say, an operation of a high speed about 300 (≈32,300/108) times the receiving frequency is necessary. If the receiving frequency is several tens of MHz, an operation of a high speed of at least 1 GHz is necessary.

In a process to decode LDPC codes by making use a series of 50 interconnected decoding apparatus each like the one shown in FIG. 10 for example, while a variable-node computer is carrying out a variable-node process on a first frame, a check-node computer carries out a check-node process on a second frame and another variable-node computer carries out a variable-node process on a third frame and so on. In this way, a plurality of variable-node processes and a plurality of check-node processes can be carried out at the same time. In this case, it is necessary only to carry out computations on 323 edges while 108 codes are being received. Thus, the decoding apparatus only needs to carry out an operation of a high speed equivalent to about 3 (≈323/108) times the receiving frequency, and such an operation can be well implemented. In this case, however, simple estimation indicates that the circuit scale is 50 times the size of the decoding apparatus shown in FIG. 10.

The following description explains a method for implementing a decoding apparatus having a full parallel decoding configuration in which processes of all node are carried out at the same time.

This method for implementing a decoding apparatus having a full parallel decoding configuration is described in documents such as Non-Patent Document 1.

FIG. 13 is a block diagram showing a typical configuration of a decoding apparatus for decoding codes expressed by the parity check matrix H shown in FIG. 9 as codes having a coding rate of ⅔ and a code length of 108.

In the decoding apparatus shown in FIG. 13, all messages received from 323 edges are read out from an edge memory 202 or 206 at the same time and used for generating new messages for the 323 edges. Then, the resulting new messages are stored at the same time respectively in the edge memory 206 or 202 provided at the following stage. Thus, the LDPC codes can be decoded by making use of a series of decoding apparatus each like the one shown in FIG. 13.

The decoding apparatus shown in FIG. 13 includes a reception memory 205, two edge reshuffling devices 200 and 203, the two edge memories 202 and 206 mentioned above, 36 check-node computers $201_1$ to $201_{36}$ and 108 variable-node computers $204_1$ to $204_{108}$. These memories, sections and computers are explained in detail as follows.

The edge memory 206 is used for storing all messages $D206_1$ to $D206_{108}$ received from respectively variable-node computers $204_1$ to $204_{108}$ provided at the immediately preceding stage at the same time. Then, at the next time (or the next clock timing), the messages $D206_1$ to $D206_{108}$ are read out as respectively messages $D207_1$ to $D207_{108}$, which are supplied to an edge reshuffling device 200 provided at the Immediately succeeding stage as messages D200 (strictly speaking, messages $D200_1$ to $D200_{108}$ respectively). The edge reshuffling device 200 rearranges the order of the messages $D200_1$ to $D200_{108}$ received from the edge memory 206 in accordance with the parity check matrix H shown in FIG. 9 and supplies the rearranged messages to the check-node computers $201_1$ to $201_{36}$ as messages $D201_1$ to $D201_{36}$.

The check-node computers $201_1$ to $201_{36}$ carry out the computation process according to Eq. (7) on respectively the messages $D201_1$ to $D201_{36}$ received from the edge reshuffling device 200 in order to produce messages $D202_1$ to $D202_{36}$ respectively as a result of the computation process and supplies the messages $D202_1$ to $D202_{36}$ to the edge memory 202.

The edge memory 202 is used for storing all the messages $D202_1$ to $D202_{36}$ from the check-node computers $201_1$ to $201_{36}$ respectively at the same time. Then, at the next time, the messages $D202_1$ to $D202_{36}$ are read out from the edge memory 202 as respectively messages $D203_1$ to $D203_{36}$, which are supplied to an edge reshuffling device 203 provided at the immediately succeeding stage.

The edge reshuffling device 203 rearranges the order of the messages $D203_1$ to $D203_{36}$ received from the edge memory 202 in accordance with the parity check matrix H shown in FIG. 9 and supplies the rearranged messages to the variable-node computers $204_1$ to $204_{108}$ as messages $D204_1$ to $D204_{108}$.

The variable-node computers $204_1$ to $204_{108}$ carry out the computation process according to Eq. (1) on the messages $D204_1$ to $D204_{108}$ received from the edge reshuffling device 203 and the messages $D205_1$ to $D205_{108}$ received from the reception memory 205 in order to produce messages $D206_1$ to $D206_{108}$ respectively as a result of the computation process and supplies the messages $D206_1$ to $D206_{108}$ to the edge memory 206 provided at the immediately succeeding state.

FIG. 14 is a diagram showing a typical configuration of each of the check-node computers $201_m$ (where m=1, 2, . . . 36) employed in the decoding apparatus shown in FIG. 13 as computers for carrying out check-node processes at the same time.

A check-node computer $201m$ shown in FIG. 14 carries out a check-node process according to Eq. (7) in the same way as the check-node computer 101 shown in FIG. 11. Check-node processes are, however, carried out at the same time on all edges.

That is to say, in the check-node computer $201_m$ shown in FIG. 14, messages $D221_1$ to $D221_9$ (messages $v_i$) originally received from variable nodes each corresponding to a row of the parity check matrix H shown in FIG. 9 are all acquired at the same time from the edge reshuffling device 200. The 5 less significant bits of each of the messages $D222_1$ to $D222_9$ ($v_i$) are the absolute value ($|v_i|$) of each of the messages $D222_1$ $D222_9$ ($v_i$) respectively, the absolute values ($|v_i|$) being supplied to LUTs $221_1$ to $221_9$ respectively. On the other hand, the most significant bit of each of the messages $D221_1$ to $D221_9$ ($v_i$) are the sign of each of the messages $D221_1$ $D221_9$ ($v_i$) respectively. The signs denoted by notations $D223_1$ to $D223_9$ are supplied to EXOR circuits $226_1$ to $226_9$ respectively and an EXOR circuit 225.

For the absolute value $D222_1$ to $D222_1$ ($|v_i|$), the LUT $221_1$ to LUT $221_9$ reads out 5-bit data $D224_1$ to $D224_9$ (or the 5-bit value of the function ($\phi(|v_i|)$) used in the computation process according to Eq. (7)) and supplies computation results $D224_1$ to $D224_9$ ($\phi(|v_i|)$) to a subtractor $223_1$ to $223_9$ and an adder 222.

The adder 222 finds a 9-bit sum D225 of the computation results $D224_1$ to $D224_9$. The sum D225 including 9 bits is the sum of computation results $D224_1$ to $D224_9$ obtained for 1 row of the parity check matrix H. That is to say, the sum D225 consisting of 9 bits is the value of $\Sigma\phi(|v_i|)$ for a summation range starting from i=1 and ending at i=9. The adder 222 supplies the sum D225 including of 9 bits to the subtractors $223_1$ to $223_9$. The subtractors $223_1$ to $223_9$ subtract the computation results $D224_1$ to $D224_9$ (or the values of the function $\phi(|v_i|)$) from the sum D225 to give differences $D227_1$ to $D227_9$ each including 5 bits and supplies to LUT $224_1$ to $224_9$. That is to say, the subtractors $223_1$ to $223_9$ subtract the value of the function $\phi(|v_i|)$ obtained for a message $v_i$ received from an edge serving as an object of message computation from the sum of the values of the function $\phi(|v_i|)$ obtained for messages $v_i$ received from all edges and outputs the differences $D227_1$ to $D227_9$ each including 5 bits to the LUT $224_1$ to $224_9$ respectively. Thus, the differences $D227_1$ to $D227_9$ each including 5 bits are each the value of $\Sigma\phi(|v_i|)$ for a summation range starting from i=1 and ending at i=8. For the differences $D227_1$ to $D227_9$ each including 5 bits respectively, the LUTs $224_1$ to $224_9$ read out respectively 5-bit data $D228_1$ to $228_9$ (or the 5-bit values of the function $\phi^{-1}$ ($\Sigma\phi(|v_i|)$) used in the computation process according to Eq. (7)).

On the other hand, an EXOR circuit 225 computes the exclusive logical sum of all the sign bits $D223_1$ to $D223_9$ in order to find a 1-bit product D226 of all the sign bits $D223_1$ to $D223_9$. Then, the EXOR circuit 225 outputs the product D226 including 1 bit to EXOR circuits $226_1$ to $226_9$. The product D226 including 1 bit is the value of $\Pi$ sign ($v_i$) for a multiplication range starting from i=1 and ending at i=9. The EXOR circuits $226_1$ to $226_9$ find the exclusive logical sum of the product D226 including 1 bit and the sign bits $D223_1$ to $D223_9$ respectively in order to divide the sign bits $D223_1$ to $D223_9$ by the product D226 including 1 bit to give division results $D229_1$ to $D229_9$, which are each the value of $\Pi$ sign ($v_i$) for a multiplication range starting from i=1 and ending at i=8.

A check-node computer $201_m$ outputs messages $D230_1$ to $D230_9$ as a result of the check-node process carried out thereby. The messages $D230_1$ to $D230_9$ are each message including a total of 6 bits. The 5 less significant bits of each of the messages $D230_1$ to $D230_9$ are one of the 5-bit processing results $D228_1$ to $D228_9$ output by the LUT $224_1$ to $224_9$ respectively. On the other hand, the most significant bit of each of the messages $D230_1$ to $D230_9$ is one of the division results $D229_1$ to $D229_9$ output by the EXOR circuits $226_1$ to $226_9$ respectively.

As described above, a check-node computer $201_m$ carries out a check-node process according to Eq. (7) in order to find a message $u_j$.

It is to be noted that, in the configuration shown in FIG. 14 as the configuration of a check-node computer $201_m$, each message is quantized into a total of 6 bits including a sign bit. In addition, the circuit shown in FIG. 14 as the circuit of a check-node computer corresponds to 1 check node. There are as many check nodes as rows of the parity check matrix H shown in FIG. 9 as a parity check matrix H serving as the object of the check-node process. Since the parity check matrix H has 36 rows as shown in FIG. 9, the decoding apparatus shown in FIG. 13 includes 36 check-node computers $201_m$ each like the one shown in FIG. 14.

As described above, the check-node computer $201_m$ shown in FIG. 14 is capable of computing nine messages at the same time. In addition, since the row weights of the parity check matrix H shown in FIG. 9 as a parity check matrix serving as the object of the check-node process are 8 for the first row and 9 for each of the second to thirty-sixth rows, that is to say, since the number of messages supplied to the check node is 8 for 1 check-node computer $201_m$ corresponding to the first row having a row weight of 8, or is 9 for 35 check-node computers $201_m$ respectively corresponding to the second to thirty-sixth rows each having a row weight of 9, the check-node computer $201_m$ has a configuration capable of computing 8 messages at the same time in the same way as the circuit shown in FIG. 14 whereas each of the remaining 35 check-node computers $201_2$ to $201_{36}$ has the same configuration as the circuit shown in FIG. 14 and is hence capable of computing 8 messages at the same time in the same way as the circuit shown in FIG. 14.

FIG. 15 is a diagram showing a typical configuration of each of the variable-node computers $204_p$ (where p=1, 2, . . . 108) employed in the decoding apparatus shown in FIG. 13 as computers for carrying out check-node processes at the same time.

A check-node computer $204_p$ shown in FIG. 15 carries out a variable-node process according to Eq. (1) in the same way as the variable-node computer 103 shown in FIG. 12. Variable-node processes are, however, carried out at the same time on all edges.

That is to say, in the variable-node computer $204_p$ shown in FIG. 15, the 6-bit messages $D251_1$ to $D251_5$ (messages $u_j$) received from check nodes each corresponding to a row of the parity check matrix H are all acquired at the same time from the edge reshuffling device 203. The 6-bit messages $D251_1$ to $D251_5$ (or messages $u_j$) are supplied to adders $252_1$ to $252_5$ and an adder 251. In addition, the variable-node computer $204_p$ also receives received data D271 from the reception memory 205. The received data D271 is then supplied to the adders $252_1$ to $252_5$.

The adder 251 computes a sum D252 including 9 bits as the sum of all the 6-bit messages $D251_1$ to $D251_5$ (or messages $u_j$) and outputs the sum D252 including 9 bits to the adders $252_1$ to $252_5$. The sum D252 including 9 bits is the value of $\Sigma u_j$ for a summation range starting from j=1 and ending at j=5. The adders $252_1$ to $252_5$ subtract the 6-bit messages $D251_1$ to $D251_5$ (or messages $u_j$) respectively from the sum D252. The 6-bit messages $D251_1$ to $D251_5$ (or messages $u_j$) subtracted by the adders $252_1$ to $252_5$ respectively from the sum D252 are each a message received from an edge serving as an object of message computation whereas the sum D252 is a result computed from messages $u_j$ received from all edges. Thus, the differences obtained as results of subtracting the 6-bit messages $D251_1$ to $D251_5$ (or messages $u_j$) respectively from the sum D252 are each the value of $\Sigma u_j$ for a summation range starting from j=1 and ending at j=4.

In addition, the adders $252_1$ to $252_5$ add received data D271 ($u_{oi}$) to the subtracting values (or the values of $\Sigma u_j$ for a summation range starting from j=1 and ending at j=4) to give 6-bit sums $D253_1$ to $D253_5$, which are each output as a result of the variable-node process.

As described above, the variable-node computer $204_p$ carries out a variable-node process according to Eq. (1) in order to generate messages $v_i$.

It is to be noted that, in the configuration shown in FIG. 15 as the configuration of a variable-node computer $204_p$, each message is quantized into a total of 6 bits including a sign bit. In addition, the circuit shown in FIG. 15 corresponds to 1 variable node. There are as many variable nodes as columns of the parity check matrix H shown in FIG. 9 as a parity check matrix H serving as the object of the variable-node process.

Since the parity check matrix H has 108 columns as shown in FIG. 9, the decoding apparatus shown in FIG. 13 includes 108 circuits like the one shown in FIG. 15.

Thus, the variable-node computer $204_p$ shown in FIG. 15 is capable of computing five messages at the same time. Since the parity check matrix H shown in FIG. 9 as a parity check matrix serving as the object of the variable-node process has column weights of 5, 3, 2 and 1 on 18, 54, 35 and 1 columns respectively, 18 of the 108 variable-node computers $204_1$ to $204_{108}$ corresponding respectively to 18 columns each having a column weight of 5 each have the same configuration as the circuit shown in FIG. 15. The remaining 54, 35, 1 variable-node computers $204_p$ corresponding respectively to 54, 35, 1 columns each having a column weight of 3, 2, 1 are each capable of computing 3, 2. 1 messages at the same time in the same way as the circuit shown in FIG. 15.

It is to be noted that, at the last decoding stage in the decoding apparatus shown in FIG. 13, a process according to Eq. (5) can be carried out as a substitute for the variable-node process according to Eq. (1) and the result of the process according to Eq. (5) can be output as the final decoding result as is the case with the decoding apparatus shown in FIG. 10. This feature is not shown in the figure though.

As described above, the decoding apparatus shown in FIG. 13 is capable of computing all messages received from 323 edges at the same time in 1 clock.

If LDPC codes are decoded by making use of a series of decoding apparatus each like the one shown in FIG. 13, the check-node processing and the variable-node processing are carried out alternately and it takes time of two clocks to complete one decoding process. Thus, if it is necessary to carry out 50 decoding processes, only 100 (2×50) clock operations need to be performed while receiving received data taking codes with a code length of 108 as 1 frame. As a result, the operating frequency is about equal to the receiving frequency. In general, the LDPC codes have a large code length in a range of several thousands to several tens of thousands. By using the decoding apparatus shown in FIG. 13, it is possible to set a very large number as the number of times the decoding processing is to be carried out. Therefore, improvement of the error correction performance can be expected.

Since the decoding apparatus shown in FIG. 13 computes messages corresponding to all edges of the Tanner graph concurrently, however, the circuit scale of the decoding apparatus increases proportionally to the code length. In addition, if the decoding apparatus shown in FIG. 13 is designed as an apparatus for decoding the LDPC codes defined by a parity check matrix H as codes having a certain code length and a certain coding rate, it will be difficult to decode LDPC codes expressed by a parity check matrix H other than the certain parity check matrix H as codes having a code length other than the certain code length and a coding rate other than the certain coding rate. That is to say, it is difficult to apply the decoding apparatus shown in FIG. 13 to a case in which a variety of codes can be decoded by merely changing control signals as is the case with the decoding apparatus shown in FIG. 10. In other words, the decoding apparatus shown in FIG. 13 exhibits much code dependence.

In addition to the decoding methods adopted by the decoding apparatus shown in FIGS. 10 and 13, there is a decoding method described in documents such as Non-Patent Document 2 as a decoding method for decoding neither one message at one time nor all messages at the same time, that is, as a decoding method for decoding four messages at one time. The decoding method described in Non-Patent Document 2 has a problem that, in general, it is not easy to avoid operations to read out data from different addresses in a memory at the same time and operations to write data into different addresses in the memory at the same time. That is to say, it is hard to control accesses to the memory.

In order to solve the problem described above, there has been reported a coding and decoding apparatus (for example, referred to as Non-Patent Documents 3 and 4) as an apparatus much suitable for implementation of a decoder for decoding partially parallel codes instead of decoding random codes. However, a method for implementing the decoding apparatus described in Non-Patent Document 3 is a method devised for specific codes. With this method, it is thus difficult to decode codes having a variety of code lengths and a variety of coding rates.

Documents such as Patent Document 1 describe a decoding apparatus capable of decoding codes having a variety of code lengths and a variety of coding rates if the codes are LDPC codes expressed by a parity check matrix H like one shown in FIG. 16. As shown in the figure, the parity check matrix H is a matrix that can be represented as a combination of 6×6 unit matrixes, a matrix obtained by setting one or more of the "1" elements of a unit matrix to 0 (hereinafter referred to as semi unit matrixes accordingly), a matrix obtained by carrying out a cyclic shift operation on a unit matrix or a semi unit matrix (hereinafter referred to as shift matrixes accordingly), a matrix obtained by computing the sum of at least any two of a unit matrix, a semi unit matrix and a shift matrix (or the sum of a plurality such matrixes)(hereinafter referred to as sum matrixes accordingly) and 0 matrixes including a 6×6 matrix each having all elements thereof set to 0. The decoding apparatus is also capable of decoding codes having a variety of code lengths and a variety of coding rates if the codes are LDPC codes according to the transposed matrix of the parity check matrix H shown in FIG. 16 as a matrix that can be expressed as a combination of the these matrixes.

It is to be noted that the parity check matrix H shown in FIG. 16 is obtained by providing a gap between any two adjacent 6×6 matrixes included in the parity check matrix H shown in FIG. 9. In the following description, the unit matrix, the semi unit matrix, the shift matrix, the sum matrix and the 0 matrix, which are combined to form the parity check matrix H shown in FIG. 16, are each properly referred to as a component matrix.

By referring to FIGS. 17 to 22, the following description explains a decoding apparatus for decoding LDPC codes that can be expressed by the parity check matrix H shown in FIG. 16.

FIG. 17 is a block diagram showing a typical configuration of a decoding apparatus 400 for decoding LDPC codes that can be expressed by the parity check matrix H shown in FIG. 16.

The decoding apparatus 400 employs a decoding intermediate result storage memory 410, a cyclic shift circuit 411, a computation section 412 having six computers $412_1$ to $412_6$, a decoding intermediate result storage memory 413, a cyclic shift circuit 414, a computation section 415 having six computers $415_1$ to $415_6$, a reception memory 416 and a control section 417.

Computation processes carried out by the computers $412_k$ and the computers $415_k$ (where k=1, 2, . . . and 6) are explained by making use of equations as follows.

To put it concretely, the computation section 412 carries out a first computation process according to Eq. (7) given earlier and Eq. (8) shown below in order to generate a decoding intermediate result $u_j$ as the result of the first computation process and supplies to the decoding intermediate result storage memory 410. Computation section 415 carries out a second computation process according to Eq. (5) given earlier in order to generate a decoding intermediate result v as the result of the second computation process and supplies to the decoding intermediate result storage memory 410.

[Eq. 8]
$$v_i = v - u_{d_v} \quad (8)$$

It is to be noted that notation $u_{d_v}$ used in Eq. (8) denotes an intermediate result received from an edge, which is included in the ith column of the parity check matrix H as an edge serving as an object of message computation, as a result of a check-node process. In this case, the intermediate result is the check-node process result itself. That is to say, notation $u_{d_v}$ denotes a decoding intermediate result for an edge serving as an object of message computation.

That is to say, the decoding intermediate result v obtained as a result of the second computation process according to Eq. (5) given before is the sum of the received value $u_{oi}$ and decoding intermediate results $u_j$ generated from all edges corresponding to matrix elements each set at 1 at intersections of rows and the ith column in the parity check matrix H as decoding intermediate results of check-node processes. Thus, the value $v_i$ used in Eq. (7) is a difference obtained as a result of subtracting the decoding intermediate result $u_{d_v}$ received from an edge serving as an object of message computation as the decoding intermediate result of a check-node process from the decoding intermediate result v obtained as a result of the second computation process according to Eq. (5). The decoding intermediate result $u_{d_v}$ is one of the decoding intermediate results $u_j$ generated from all edges corresponding to matrix elements each set at 1 at intersections of rows and the ith column in the parity check matrix H as decoding Intermediate results of check-node processes. That is to say, the computation process expressed by Eq. (1) as a process to compute the value $v_i$ used in the computation process according to Eq. (7) is a computation process carried out as a combination of the computation process according to Eq. (5) and Eq. (8).

Thus, in the decoding apparatus 400, the computation section 412 carries out the first computation process according to Eqs. (7) and (8) alternately with the second computation process carried out by the computation section 415 in accordance with Eq. (5). Then, the computation section 415 outputs the result of the last second computation process as a decoding result. In this way, the decoding apparatus 400 is capable of carrying out a decoding process repeatedly to decode LDPC codes.

It is to be noted that the decoding intermediate result $u_j$ obtained as a result of the first computation process according to Eqs. (7) and (8) is equal to the result $u_j$ of the check-node process according to Eq. (7).

In addition, since the value v obtained as a result of the second computation process according to Eq. (5) is a result of adding the result $u_j$ received from an edge serving as an object of message computation as the result of a check-node process to the result $v_i$ of the variable-node process according to Eq. (1), only one value v is found for 1 column of the parity check matrix H (or for one variable node).

In the decoding apparatus 400, the computation section 412 makes use of the decoding intermediate result v produced in the second computation process carried out by the computation section 415 as a result corresponding to columns of the parity check matrix H in execution of the first computation process. The computation section 412 generates a decoding intermediate result $u_j$ as the result of the first computation process and supplies to the decoding intermediate result storage memory 413. The decoding intermediate result $u_j$ is generated from an edge corresponding to a matrix element set at 1 at an intersection of a row and the ith column in the parity check matrix H as a decoding intermediate result of a check-node process of a check node outputting a message through the edge. Thus, the storage capacity of the decoding intermediate result storage memory 413 is equal to the product obtained as a result of an operation to multiply the number of one matrix elements in the parity check matrix H (that is, the number of all edges) by the number of quantization bits as is the case with the storage capacity of a memory used for storing results of check-node processes.

On the other hand, the computation section 415 makes use of the decoding intermediate results $u_j$ generated from all edges corresponding to matrix elements each set at "1" at intersections of rows and the ith column in the parity check matrix H as decoding intermediate results of second computation processes carried out by the computation section 412 and makes use of received data $u_{oi}$ in order to carry out the second computation process and stores a decoding intermediate result v corresponding to the ith column in the decoding intermediate result storage memory 410 as a result of the second computation process. Thus, the storage capacity of the decoding intermediate result storage memory 410 is equal to the product obtained as a result of an operation to multiply the number of columns smaller than the number of matrix elements each set at 1 in the parity check matrix H, that is, the code length of the LDPC codes by the number of quantization bits of the decoding intermediate result v.

As a result, the storage capacity of the decoding intermediate result storage memory 410 can be reduced to a value smaller than the storage capacity of a memory used for storing the result of a variable-node process. Thus, the circuit scale of the decoding apparatus 400 can be decreased.

Next, operations carried out by the sections employed in the decoding apparatus 400 shown in FIG. 17 are explained in detail as follows.

The decoding intermediate result storage memory 410 is used for storing six decoding intermediate results D415 generated by the computation section 415 as a result of the second computation process carried out by the computation section 415. The six decoding intermediate results D415 generated by the computation section 415 are sequentially stored (memory) in the decoding intermediate result storage memory 410 at storage locations starting with a first address.

To put it in detail, at the first address in the decoding intermediate result storage memory 410, the first to sixth decoding intermediate results v are stored as a part of decoding intermediate results corresponding to the columns of the parity check matrix H. Then, by the same token, at a second address, the seventh to twelfth decoding intermediate results v are stored. Subsequently, in the same way, at a third address, the thirteenth to eighteenth decoding intermediate results v are stored. Thereafter, the same operation to store six decoding intermediate results v at an address of a sequence of addresses starting with a fourth address is carried out repeatedly in a similar manner till the 103rd to 108th decoding intermediate results v are stored in an eighteenth address. As a result, 108 decoding intermediate results v are stored in the decoding intermediate result storage memory 410. Thus, the number of words in the decoding intermediate result storage memory 410 is a quotient of 18 obtained as a result of dividing the integer 108 which is the number of columns (the code length of LDPC codes) composing the parity check matrix H shown in FIG. 16 by the integer 6 which is the number of decoding intermediate results at the same time in one operation described above.

In addition, the decoding intermediate result storage memory 410 selects six decoding intermediate results v corresponding to matrix elements each set at "1" on a row included in the parity check matrix H as a row corresponding to a decoding intermediate result $u_j$ to be found by the computation section 412 at a succeeding stage from the decoding intermediate results D415 already stored in the decoding intermediate result storage memory 410 and outputs the six selected decoding intermediate results v to the cyclic shift circuit 411 at the same time as a decoding intermediate result D410.

It is to be noted that the decoding intermediate result storage memory 410 typically employs single-port RAMs allowing operations to store and read out six decoding intermediate results in any of the RAMs at the same time. In addition, the decoding intermediate result storage memory 410 is also used for storing a decoding intermediate result D414 produced by the second computation process carried out by the computation section 415 as a result corresponding to a column. Thus, the required storage capacity of the decoding intermediate result storage memory 410, that is, the maximum amount of data that can be stored in the decoding intermediate result storage memory 410, is equal to a product obtained as a result of an operation to multiply the quantization-bit count of the decoding intermediate result D414 by the number of columns (the code length of LDPC codes) in the parity check matrix H.

The cyclic shift circuit 411 receives six decoding intermediate results D410 from the decoding intermediate result storage memory 410 and a control signal D619 from the control section 417. The control signal D619 is information on the number of cyclic shift operations to be carried out on components matrixes such as unit matrixes composing the parity check matrix H. To put it concretely, the information is matrix data representing the number of matrix elements each set at 1 in the parity check matrix H as a matrix element corresponding to one of the decoding intermediate results D410. On the basis of the control signal D619, the cyclic shift circuit 411 carries out cyclic shift operations to rearrange the six decoding intermediate results D410 and outputs the result of the arrangement to the computation section 412 as decoding intermediate results D411.

As described above, the computation section 412 employs the six computers $412_1$ to $412_6$. The computation section 412 receives the six decoding intermediate results D411 (v) from the cyclic shift circuit 411 as a result of the second computation process carried out by the computation section 415. In addition, the computation section 412 also receives six decoding intermediate results D413 ($u_j$) from the decoding intermediate result storage memory 413 as a result of the first computation process previously carried out by the six computers $412_1$ to $412_6$. The six decoding intermediate results D411 and the six decoding intermediate results D413 are supplied to the six computers $412_1$ to $412_6$ respectively. On top of that, the computation section 412 also receives the control signal D419 from the control section 417. In the computation section 412, the control signal D419 is supplied to all the six computers $412_1$ to $412_6$. It is to be noted that the control signal D419 is a signal common to the six computers $412_1$ to $412_6$.

The six computers $412_1$ to $412_6$ each carry out the first computation process according to Eqs. (7) and (8) by making use of one of the six decoding intermediate results D411 (v) and one of the six decoding intermediate results D413 in order to find six decoding intermediate results D412 ($v_i$) corresponding to six matrix elements each set at 1 in the parity check matrix H. Then, the computation section 412 outputs the six decoding intermediate results D412 obtained as a result of the processes carried out by the six computers $412_1$ to $412_6$ respectively to the decoding intermediate result storage memory 413.

The decoding intermediate result storage memory 413 typically employs two single-port RAMs allowing operations to write and read out six decoding intermediate results to and from any of the RAMs at the same time. The decoding intermediate result storage memory 413 receives the six decoding intermediate results D412 from the computation section 412 and a control signal D420 from the control section 417 as a signal for controlling an operation to write and read out the six decoding intermediate results D413 to and from the decoding intermediate result storage memory 413.

The decoding intermediate result storage memory 413 allows the six decoding intermediate results D412 received from the computation section 412 to be collectively stored therein and six decoding intermediate results D412 already stored in the decoding intermediate result storage memory 413 to be read out at the same time on the basis of the control signal D420. The decoding intermediate result storage memory 413 supplies the six decoding intermediate results D412 already stored therein to the computation section 412 and the cyclic shift circuit 414 as the six decoding intermediate results D413. That is to say, the decoding intermediate result storage memory 413 allows an operation to read out six decoding intermediate results D413 to be supplied to the computation section 412 and the cyclic shift circuit 414 and an operation to store the six decoding intermediate results D412 received from the computation section 412 at the same time.

It is to be noted that the decoding intermediate results D412 resulting from the first computation process carried out by the computation section 412 are stored in the decoding intermediate result storage memory 413 as messages each generated from an edge corresponding to a matrix element set at 1 at an intersection of a row and the ith column in the parity check matrix H. Thus, the required storage capacity of the decoding intermediate result storage memory 413, that is, the amount of data that can be stored in the decoding intermediate result storage memory 413, is equal to a product obtained as a result of an operation to multiply the quantization-bit count of the decoding intermediate result D412 by the number of matrix elements each set at 1 in the parity check matrix H.

The cyclic shift circuit 414 receives six decoding intermediate results D413 (decoding intermediate results $u_j$) from the decoding intermediate result storage memory 413 and a control signal D421 from the control section 417. The control signal D421 is information on the number of cyclic shift operations to be carried out on components matrixes such as unit matrixes composing the parity check matrix H. To put it concretely, the information is matrix data representing the number of matrix elements each set at 1 in the parity check matrix H as a matrix element corresponding to one of the decoding intermediate results D413. On the basis of the control signal D421, the cyclic shift circuit 414 carries out cyclic shift operations to rearrange the six decoding intermediate results D413 and outputs the result of the arrangement to the computation section 415 as decoding intermediate results D414.

As described earlier, the computation section 415 employs the six computers $415_1$ to $415_6$. The computation section 415 receives the six decoding intermediate results D414 from the cyclic shift circuit 414. The six decoding intermediate results D414 are supplied to the 6 computers $415_1$ to $415_6$ respectively. In addition, the computation section 415 also receives six pieces of received data D417 (or the LDPC codes) from the reception memory 417. The received data D417 are supplied to the six computers $415_1$ to $415_6$ respectively. On top of that, the computation section 417 also receives a control signal D422 from the control section 417. The control signal D422 is supplied to the computers $415_1$ to $415_6$. It is to be noted that the control signal D422 is a signal common to the computers $417_1$ to $417_6$.

The computers $415_1$ to $415_6$ each carry out the second computation process according to Eq. (5) by making use of the decoding intermediate results D414 and the decoding intermediate results D417 in order to find decoding intermediate results D415. Then, the computation section 415 supplies the six decoding intermediate results D415 (v) obtained as a result of the second computation processes carried out by the computers $415_1$ to $415_6$ respectively to the decoding intermediate result storage memory 410. If the process presently carried out by the computation section 415 is the last second computation process, the six decoding intermediate results D415 obtained as a result of the processes are output as the final decoding result.

The reception memory 416 is a memory used for storing received data D416, which is data (received data) of a received LLR (Log Likelihood Ratio) serving as the value of a 0 likelihood computed from an incoming value (or a sign bit) D416 received from a transmission line as the 0 likelihood of the sign bit.

To put it in detail, at a first address in the reception memory 416, received data D416 corresponding to the first to sixth columns of the parity check matrix H are stored as a part of received data D416 corresponding to the columns of the parity check matrix H. Then, by the same token, at a second address, received data D416 corresponding to the seventh to twelfth columns of the parity check matrix H are stored. Subsequently, in the same way, at a third address, received data D416 corresponding to the thirteenth to eighteenth columns of the parity check matrix H are stored. Thereafter, the same operation to store six pieces of received data D416 at an address in a sequence of addresses starting with a fourth address is carried out repeatedly in a similar manner till received data D416 corresponding to the 19th to 108th columns of the parity check matrix H are stored in an eighteenth address.

Then, pieces of received data D416 already stored in the reception memory 616 are read out in 6-piece units sequentially one unit after another in an order required by a variable-node process and supplied to the computation section 415 as received data D417.

It is to be noted that the reception memory 416 typically employs single-port RAMs allowing operations to write and read out six pieces of received data to and from any of the RAMs at the same time. Thus, the required storage capacity of the reception memory 416, that is, the maximum amount of data that can be stored in the reception memory 416, is equal to a product obtained as a result of an operation to multiply the quantization-bit count of the received data D416 by the code length of the LDPC codes. In addition, the number of words in the reception memory 416 is a quotient of 18 obtained as a result of dividing the integer 108 by the integer 6. In this case, the integer 108 is the number of columns composing the parity check matrix H, that is the code length of the LDPC codes whereas the integer 6 is the number of pieces of received data D417 read out at the same time in one operation described above.

The control section 417 supplies the control signal D418 to the cyclic shift circuit 411 in order to control the cyclic shift circuit 411 and the control signal D419 to the computation section 412 in order to control the computation section 412. In addition, the control section supplies the control signal D420 to the decoding intermediate result storage memory 413 in order to control the decoding intermediate result storage memory 413, the control signal D421 to the cyclic shift circuit in order to control the cyclic shift circuit 414 and the control signal D421 to the computation section 415 in order to control the computation section 415.

Data is circulated for one decoding process in the decoding apparatus 400 in the following order: the decoding intermediate result storage memory 410 to the cyclic shift circuit 411 to the computation section 412 to the decoding intermediate result storage memory 413 to the cyclic shift circuit 414 and to the computation section 415. After the decoding apparatus 400 carries out the decoding process repeatedly a predetermined number of times, the decoding intermediate results D415 obtained as a result of the second computation processes carried out by the computation section 415 are output as the final decoding result.

FIG. 18 is a block diagram showing a typical configuration of a computation section $412_1$ employed in the computation section 412 shown in FIG. 17.

It is to be noted that, even though the computation section $412_1$ is explained by referring to FIG. 18, the explanation also applies to the computers $412_2$ to $412_6$.

In the configuration shown in FIG. 18 as the configuration of the computation section 412, each decoding intermediate result ($u_{dv}$) obtained as a result of the first computation process carried out previously by the computation section 412 is quantized into data including 6 bits including a sign bit whereas each decoding intermediate result (v) obtained as a result of the second computation process carried out by the computation section 415 is quantized into data including 9 bits. In addition, the computer $412_1$ shown in FIG. 18 receives a clock signal ck to be provided to necessary blocks. Thus, each block employed in the computer $412_1$ carries out an operation synchronously with the clock signal ck.

On the basis of the control signal D419 received from the control section 417, the computer $412_1$ shown in FIG. 18 carries out the first computation process according to Eqs. (7) and (8) by making use of a decoding intermediate result D413 ($u_{dv}$) obtained as a result of the first computation process performed earlier by the computation section 412 and one of decoding intermediate results D411 (v) supplied sequentially one result after another by the cyclic shift circuit 411. The decoding intermediate results D413 ($u_{dv}$) are read out from the decoding intermediate result storage memory 413 sequentially one result after another.

To be more specific, the computer $412_1$ receives one of six 9-bit decoding intermediate result D411 (v) supplied sequentially one result after another by the cyclic shift circuit 411 and a decoding intermediate result D413 ($u_{dv}$) selected from six 6-bit decoding intermediate results D413 ($u_j$) read out from the decoding intermediate result storage memory 413 sequentially one result after another. As described above, the 6-bit decoding intermediate result D413 ($u_{dv}$) is obtained as a result of the first computation process performed earlier by the computation section 412. In the computer $412_1$, the decoding intermediate result D411 (v) including 9 bits and the decoding intermediate result D413 ($u_{dv}$) including bits are supplied to an adder 431. In addition, the computer $412_1$ also receives the control signal D419 from the control section 417. The control signal D419 is supplied to selectors 435 and 442.

The adder 431 subtracts the decoding intermediate result D413 ($u_j$) including 6 bits from the decoding intermediate result D411 (v) including 9 bits to yield a difference D431 including 6 bits. That is to say, the adder 431 carries out an operation according to Eq. (8) in order to produce the difference D431 ($v_i$) as the result of the operation.

The 1-bit sign bit D432 (sign ($v_i$)) of the 6-bit difference D431 generated by the adder 431 is supplied to an EXOR circuit 440 whereas the 5 less significant bits D433 ($|v_i|$) of the difference D431 including 6 bits are supplied to a LUT 432. The sign bit D432 (sign ($v_i$)) representing the plus/minus sign of the 6-bit difference D431 is the most significant bit of the 6-bit difference D431.

For the absolute value D433 ($|v_i|$) supplied to the LUT 432, the LUT 432 reads out 5-bit data D434 ($\phi(|v_i|)$) used in the computation process according to Eq. (7)) from a table and supplies the data D434 ($\phi(|v_1|)$) to an adder 433 and a FIFO memory 438.

The adder 433 cumulatively adds the data D434 (or the value of the function $\phi(|v_i|)$) to 9-bit data D435 stored in a register 434 in order to compute a sum D434 including 9 bits and stores the sum D434 back in the register 434. It is to be noted that this cumulative addition process is carried out repeatedly and, as the cumulative addition process is completed to find the final cumulative addition result for the absolute values D433 ($|v_i|$) found from the decoding intermediate results D411 corresponding to all matrix elements set at 1 on 1 row of the parity check matrix H, the contents of the register 434 are reset.

After receiving decoding intermediate results D411 corresponding to a row of the parity check matrix H sequentially one result after another and sequentially adding the results D411 to the data D434 stored in the register 434 in a cumulative manner, the control section 417 changes the control signal D419 supplied thereby from 0 to 1. In the case of a row weight of 9 for example, the control signal D419 stays at 0 during a period covering the first to eighth clock pulses. As the ninth clock pulse is generated, the control section 417 changes the control signal D419 to 1.

With the control signal D419 set at 1, a selector 435 selects the data stored in the register 434 and supplies the data to a register 436 to be stored in the register 436 as data D436. The data stored in the register 434 with the control signal D419 set at 1 is 9-bit data D435 obtained as a result of cumulatively adding the function values $\phi(|v_i|)$ found from decoding intermediate results D411 (or decoding intermediate results v) corresponding to all matrix elements set at 1 on 1 row of the parity check matrix H. That is to say, the cumulative 9-bit data D435 is the value of $\Sigma\phi(|v_i|)$ for a summation range starting from i=1 and ending at i=$d_c$. The data D436 stored in the register 436 is supplied to the selector 435 and an adder 437 as data D437 including 9 bits. With the control signal D419 reset at 0, on the other hand, the selector 435 selects the 9-bit data D437 received from the register 436 and outputs the selected data D437 to the register 436 as data to be stored in the register 436 again. That is to say, the register 436 supplies the 9-bit data D437 obtained as a result $\Sigma\phi(|v_i|)$ of the cumulative additions carried out previously to the selector 435 and the adder 437 till data including 9 bits is obtained as a result $\Sigma\phi(|v_i|)$ of cumulatively adding the function values $\phi(|v_i|)$ found from the decoding intermediate results D411 (or the decoding intermediate results v) corresponding to all matrix elements set at 1 on 1 row of the parity check matrix H.

On the other hand, a FIFO memory 438 delays the computation result D434 ($\phi(|v_i|)$) received from the LUT 432 to a point of time at which the register 436 supplies new data D437 ($\Sigma\phi(|v_i|)$) for a summation range starting from i=1 and ending at i=$d_c$) to the adder 437. Then, the FIFO memory 438 supplies the delayed data D434 to an adder 437 as data D438 including 5 bits. The adder 437 subtracts the data D438 supplied by the FIFO memory 438 from the data D437 supplied by the register 436. That is to say, the adder 437 subtracts a decoding intermediate result corresponding to an edge serving as an object of message computation, that is, the function value $\phi(|v_i|)$ found from the decoding intermediate result D411 (or the decoding intermediate result v) corresponding to a predetermined matrix element set at 1 on 1 row of the parity check matrix H, from the result $\Sigma\phi(|v_i|)$ of cumulatively adding the function values $\phi(|v_i|)$ found from the decoding intermediate results D411 (or the decoding intermediate results v) corresponding to all matrix elements set at 1 on 1 row of the parity check matrix H, and outputs the difference to a LUT 439 as a difference D439. The difference D439 is thus the value of $\Sigma\phi(|v_i|)$ for a summation range starting from i=1 and ending at i=($d_c$−1).

For the difference D439 representing the value of $\Sigma\phi(|v_i|)$ for a summation range starting from i=1 and ending at i=($d_c$−1), the LUT 439 reads out a 5-bit computation result D440 ($\phi^{-1}(\Sigma\phi(|v_i|))$) used in the computation process according to Eq. (7)).

Concurrently with the processing described above, an EXOR circuit 440 computes the exclusive logical sum of 1-bit data D442 stored in a register 441 and the sign bit D432. That is to say, the EXOR circuit 440 computes the product of two sign bits. The multiplication result D441 including 1 bit is stored back in the register 441. It is to be noted that, when the sign bits D432 extracted from the decoding intermediate results D411 corresponding to all matrix elements set at 1 on 1 row of the parity check matrix H have been subjected to the multiplication process carried out by the EXOR circuit 440, the contents of the register 441 are reset.

When the multiplication result D441 (or the value of Π sign ($v_i$) for a multiplication range starting from i=1 and ending at i=$d_c$) obtained from the multiplication processes carried out on the sign bits D432 extracted from the decoding intermediate results D411 corresponding to all matrix elements set at 1 on 1 row of the parity check matrix H is stored in the register 441, the control section 417 changes the control signal D419 supplied thereby from 0 to 1.

With the control signal D419 set at 1, a selector 442 selects the multiplication result D442 (Π sign ($v_i$) for a multiplication range starting from i=1 and ending at i=$d_c$) stored in the register 441 and supplies the multiplication result D442 to a register 443 as 1-bit data D443 to be stored in the register 443. As described above, the multiplication result D442 is a 1-bit data obtained as a result of the multiplication processes carried out by the EXOR circuit 445 on the sign bits D432 extracted from the decoding intermediate results D411 corresponding to all matrix elements set at 1 on 1 row of the parity check matrix H. The data D443 stored in the register 443 is supplied to the selector 442 and an EXOR circuit 445 as data D444 including 1 bit. With the control signal D419 reset at 0, on the other hand, the selector 442 selects the data D444 received from the register 443 and outputs to the register 443 as data to be stored in the register 443 again. That is to say, the register 443 supplies the data already stored therein to the selector 442 and the EXOR circuit 445 till data is obtained as a result of the multiplication processes on the sign bits D432 extracted from the decoding intermediate results D411 (or the decoding intermediate results v) corresponding to all matrix elements set at 1 on 1 row of the parity check matrix H.

On the other hand, the FIFO memory 444 delays the sign bit D432 to a point of time at which the register 443 supplies new data D444 (or the value of Π sign ($v_i$) for a multiplication range starting from i=1 and ending at i=$d_c$) to the EXOR circuit 445. Then, the FIFO memory 444 supplies the delayed sign bit D432 to the EXOR circuit 445 as data D445 including 1 bit. The EXOR circuit 445 computes an exclusive logical sum of the data D444 received from the register 443 and the 1-bit data D445 received from the FIFO memory 444 in order to divide the data D444 by the data D445, and outputs the division result consisting of 1 bit as data D446. That is to say, the EXOR circuit 445 divides a product of decoding intermediate results D432 (sign ($v_i$)) extracted from decoding intermediate results D411 corresponding to all matrix elements set at 1 on 1 row of the parity check matrix H by the sign bit D432 (sign ($v_i$)) extracted from a decoding intermediate result D411 corresponding to a predetermined matrix element set at 1 on the row of the parity check matrix H, and outputs the division result (or the value of Π sign ($v_i$) for a multiplication range starting from i=1 and ending at i=($d_c$−1)) as the division result D446.

The computer $412_1$ concatenates the 5-bit processing result D440 generated by the LUT 439 with the 1-bit division result D446 produced by the EXOR circuit 445 by taking the processing result D440 including 5 bits as 5 less significant bits and the division result D446 including 1 bit as the most significant bit in order to output a decoding intermediate result D412 (or a decoding intermediate result $u_j$) including a total of 6 bits.

As described above, the computer $142_1$ carries out the computation processing according to Eqs. (7) and (8) in order to find a decoding intermediate result $u_j$.

It is to be noted that, since the maximum value of the row weight for the parity check matrix H shown in FIG. 16 is 9, that is, since the maximum number of decoding intermediate results D411 (v) and decoding intermediate results D413 ($u_{d_v}$) supplied to the computer $412_1$ are each 9, the computer $412_1$ is provided with the FIFO memory 438 for delaying the nine decoding intermediate results D434 (or the values of the function $\phi(|v_i|)$) and the FIFO memory 444 for delaying the nine sign bits D432. In a process to handle row messages fewer than the row weight of 9, the magnitude of the delay provided by the FIFO memory 438 and the FIFO memory 444 can be reduced to a value corresponding to the row weight.

FIG. 19 is a block diagram showing a typical configuration of a computer $415_1$ employed in the computation section 415 shown in FIG. 17.

It is to be noted that, even though only the computer $415_1$ is explained by referring to FIG. 19, the explanation also applies to the computers $415_2$ to $415_6$.

In the configuration shown in FIG. 19 as the configuration of the computer $415_1$, each decoding intermediate result ($u_j$) obtained as a result of the first computation process carried out by the computation section 412 is quantized into a total of 6 bits including a sign bit. In addition, the computer $415_1$ shown in FIG. 19 receives a clock signal ck providing the necessary clock signal ck to the computer $415_1$. Thus, each block employed in the computer $415_1$ carries out an operation synchronously with the clock signal ck.

On the basis of a control signal D422 received from the control section 417, the computer $415_1$ shown in FIG. 19 carries out the second computation process according to Eq. (5) by making use of pieces of received data D417 (or received values $u_{oi}$) sequentially read out from the reception memory 416 one piece after another and decoding intermediate results D414 ($u_j$) sequentially read out from the cyclic shift circuit 414 one result after another.

That is to say, the computer $415_1$ reads out 6-bit decoding intermediate results D414 (or decoding intermediate results $u_j$) corresponding to matrix elements set at 1 on rows of the parity check matrix H from the cyclic shift circuit 414 sequentially one result after another from the cyclic shift circuit 414, supplying the decoding intermediate results D414 to an adder 471. In addition, the computer $415_1$ reads out pieces of 6-bit received D417 from the reception memory 416 sequentially one piece after another, supplying the pieces of 6-bit received D417 to an adder 475. On top of that, the computer $415_1$ receives a control signal D422 from the control section 417 and supplies the control signal D422 to a selector 473.

The adder 471 adds the decoding intermediate result D414 (or the decoding intermediate result $u_j$) to 9-bit data D471 stored in a register 472 in order to produce a cumulative decoding intermediate D414 consisting of 9 bits and stores the cumulative decoding intermediate result D414 consisting of 9 bits also in the register 472. It is to be noted that, after the decoding intermediate results D414 corresponding to all matrix elements set at 1 on 1 column of the parity check matrix H are cumulatively added and stored in the register 472, the contents of the register 472 are reset.

After the computer $415_1$ reads out decoding intermediate results D414 corresponding to all matrix elements set at 1 on 1 column of the parity check matrix H sequentially one result after another and stores the cumulative decoding intermediate result D414 to the register 472, the control section 417 changes the control signal D422 supplied thereby from "0" to "1". In the case of a column weight of "5" for example, the control signal D422 stays at "0" during a period covering the first to fourth clock pulses. As the fifth clock pulse is generated, the control section 417 changes the control signal D422 from "0" to "1".

With the control signal D422 set at "1", a selector 473 selects the value stored in the register 472, that is the 9-bit cumulative sum D471 (value of $\Sigma u_j$ for a summation range starting from j=1 and ending at j=$d_v$) stored in the register 472 and supplies the cumulative sum D471 consisting of 9 bits to a register 474 to be stored in the register 474. The cumulative sum D471 stored in the register 472 is a 9-bit value obtained as a result of cumulatively adding the decoding intermediate results D414 (or decoding intermediate results $u_j$) received from all the edges along 1 column of the parity check matrix H. The data D471 stored in the register 474 is supplied to the selector 471 and an adder 475 as data D472 consisting of 9 bits. With the control signal D422 reset at "0", on the other hand, the selector 473 selects the data D472 received from the register 474 and outputs to the register 474 as data to be stored in the register 474 again. That is to say, the register 474 supplies the 9-bit data D472 obtained as a result of the cumulative additions carried out previously to the selector 473 and the adder 475 till the decoding intermediate results D414 (or decoding intermediate results $u_j$) received from all the edges along 1 column of the parity check matrix H are added to each other in order to give a cumulative sum.

The adder 475 adds the data D472 consisting of 9 bits to the 6-bit data D417 received from the reception memory 416 and outputs a decoding intermediate result D415 (or a decoding intermediate result v) obtained as the result of the addition operation.

As described above, the computer $415_1$ carries out a process according to Eq. (5) in order to produce the decoding intermediate result v.

It is to be noted that, since the maximum value of the column weight for the parity check matrix H shown in FIG. 9 is 5, that is, since the maximum number of decoding intermediate results $u_j$ supplied to the computer $415_1$ is 5, the computer $415_1$ adds up to five decoding intermediate results $u_j$ each consisting of 6 bits in order to give a cumulative sum. Thus, the output of the computer $415_1$ consists of 9 bits.

FIG. 20 is a block diagram showing a typical configuration of the decoding intermediate result storage memory 413 shown in FIG. 17.

The decoding intermediate result storage memory 413 employs switches 501 and 504 as well as two decoding intermediate result storage RAMs 502 and 503, which are each a single-port RAM.

Before every component employed in the decoding intermediate result storage memory 413 is described in detail, first of all, a method for storing data in the decoding intermediate result storage RAMs 502 and 503 is described.

The decoding intermediate result storage RAMs 502 and 503 are each used for storing decoding intermediate results D412 supplied to the decoding intermediate result storage RAMs 502 and 503 by way of the switch 501 as a result of the first computation process carried out by the computation section 412.

To put it concretely, at first to ninth addresses in the decoding intermediate result storage RAM 502, decoding intermediate results D412 (D501) corresponding to matrix elements set at 1 on the first to sixth rows of the parity check matrix H shown in FIG. 16 are stored in a form of packing (by ignoring matrix elements reset to 0) decoding intermediate results D412 corresponding to matrix elements set at 1 on the rows in the horizontal direction (or the column arrangement direction).

Let notation (j, i) denote an intersection of the jth row and the ith column in the parity check matrix H shown in FIG. 16. In this case, decoding intermediate results D412 corresponding to matrix elements set at 1 in a 6×6 unit matrix included in the parity check matrix H shown in FIG. 16 as a component matrix spread throughout a matrix area ranging over intersections (1, 1) to (6, 6) are stored at the first address in the decoding intermediate result storage RAM 502. By the same token, decoding intermediate results D412 corresponding to matrix elements set at 1 in a 6×6 shift matrix included in the parity check matrix H shown in FIG. 16 as a component matrix spread throughout a matrix area ranging over intersections (1, 25) to (6, 30) are stored at the second address. The shift matrix in this case is a shift matrix obtained by carrying out a cyclic shift operation on a 6×6 unit matrix by 5 matrix elements in the direction to the right. In the same way, decoding intermediate results D412 corresponding to matrix elements set at 1 in 6 component matrixes included in the parity check matrix H shown in FIG. 16 are stored at the third to eighth addresses. Likewise, decoding intermediate results D412 corresponding to matrix elements set at 1 in a 6×6 shift matrix included in the parity check matrix H shown in FIG. 16 as a component matrix spread throughout a matrix area ranging over intersections (1, 102) to (6, 108) are stored at the ninth address. The shift matrix in this case is a shift matrix obtained by carrying out a cyclic shift operation on a 6×6 semi unit matrix by 1 matrix element in the direction to the right. The 6×6 semi unit matrix in this case is a semi unit matrix obtained by resetting the matrix element set at 1 on the first row of a 6×6 unit matrix to 0. In this case, the first row of the 6×6 shift matrix spread throughout a matrix area ranging over intersections (1, 102) to (6, 108) does not include a matrix element set at 1. Thus, no decoding intermediate results D412 are stored at the ninth address.

By the same token, at tenth to eighteenth addresses in the decoding intermediate result storage RAM 502, decoding intermediate results D412 (D501) corresponding to matrix elements set at 1 on the thirteenth to eighteenth rows of the parity check matrix H shown in FIG. 16 are stored. To put it in detail, decoding intermediate results D412 corresponding to matrix elements set at 1 in a 6×6 shift matrix included in the parity check matrix H shown in FIG. 16 as a component matrix spread throughout a matrix area ranging over intersections (13, 7) to (18, 12) are stored at the tenth address. The shift matrix in this case is a shift matrix obtained by carrying out a cyclic shift operation on a 6×6 unit matrix by 5 matrix elements in the direction to the right. By the same token, decoding intermediate results D412 corresponding to matrix elements set at 1 in a shift matrix serving as a component of a sum matrix included in the parity check matrix H shown in FIG. 16 as a component matrix spread throughout a matrix area ranging over intersections (13, 13) to (18, 18) are stored at the eleventh address. The sum matrix in this case is the sum of a 6×6 unit matrix and the shift matrix, which is obtained by carrying out a cyclic shift operation on a 6×6 unit matrix by 1 matrix element in the direction to the right. Likewise, decoding intermediate results D412 corresponding to matrix elements set at 1 in the 6×6 the unit matrix serving as a component of the sum matrix included in the parity check matrix H shown in FIG. 16 as a component matrix spread throughout a matrix area ranging over intersections (13, 13) to (18, 18) are stored at the twelfth address. Thereafter, in the same way, decoding intermediate results D412 corresponding to matrix elements set at 1 in component matrixes included in the parity check matrix H shown in FIG. 16 are stored at the thirteenth to eighteenth addresses.

That is to say, in the case of a component matrix having a weight 2 or more, the component matrix is expressed in the form of a sum matrix obtained by computing the sum of a P×P unit matrix having a weight of 1, a semi unit matrix having a weight of 1 and a shift matrix having a weight of 1. As described earlier, a semi unit matrix is a matrix obtained by setting one or more of the elements set at 1 in a unit matrix to 0 whereas a shift matrix is a matrix obtained by carrying out a cyclic shift operation on a unit matrix or a semi unit matrix. With the component matrix expressed in the form of a sum matrix as described above, decoding intermediate results (decoding intermediate results obtained in the course of a process to decode messages corresponding to edges corresponding to matrix elements set at 1 in the unit matrix, the semi unit matrix and the shift matrix) corresponding to matrix elements set at 1 in the unit matrix having a weight of 1, the semi unit matrix having a weight of 1 and the shift matrix having a weight of 1 are stored at the same address.

By the same token, decoding intermediate results D412 corresponding to matrix elements set at 1 on the twenty-fifth to thirtieth rows of the parity check matrix H shown in FIG. 16 are stored at nineteenth to twenty-seventh addresses in the decoding intermediate result storage RAM 502. That is to say, the number of words of the decoding intermediate result storage RAM 502 is 27.

On the other hand, at first to ninth addresses in the decoding intermediate result storage RAM 503, decoding intermediate results D412 (D502) corresponding to matrix elements set at 1 on the seventh to twelfth rows of the parity check matrix H shown in FIG. 16 are stored in a form of packing (ignoring matrix elements reset to 0) decoding intermediate results D412 corresponding to matrix elements set at 1 on the rows in the horizontal direction (or the column arrangement direction).

To be more specific, a first shift matrix of a sum matrix (the sum of the first shift matrix obtained by carrying out a cyclic shift operation on a 6×6 unit matrix by 2 matrix elements in the direction to the right and a second shift matrix obtained by carrying out a cyclic shift operation on a 6×6 unit matrix by 4 matrix elements in the direction to the right) included in the parity check matrix H as a component matrix spread throughout a matrix area ranging over intersections (7, 1) to (12, 6) are stored at the first address in the decoding intermediate result storage RAM 503. By the same token, a second shift matrix of the sum matrix included in the parity check matrix H as a component matrix spread throughout a matrix area ranging over intersections (7, 1) to (12, 6) are stored in the second address. Thereafter, in the same way, component matrixes included in the parity check matrix H are stored at the third to ninth addresses.

By the same token, at tenth to eighteenth addresses in the decoding intermediate result storage RAM 503, decoding intermediate results D412 (D502) corresponding to matrix elements set at 1 on the nineteenth to twenty-fourth rows of the parity check matrix H shown in FIG. 16 are stored. In the same way, at nineteenth to twenty-seventh addresses in the decoding intermediate result storage RAM 503, decoding intermediate results D412 (D502) corresponding to matrix elements set at 1 on the thirty-first to thirty-sixth rows of the parity check matrix H shown in FIG. 16 are stored. That is to say, the number of words of the decoding intermediate result storage RAM 503 is 27.

As described above, the number of words in the decoding intermediate result storage RAM 502 and the number of words in the decoding intermediate result storage RAM 503 are each 27. This number is obtained as follows. The row weight of the parity check matrix H is 9. This row weight of 9 is multiplied by the row count of 36 to give a product, which is equal to the number of matrix elements set at 1 in the parity check matrix H. The product is then divided by the number of decoding intermediate results to give a quotient. The number of decoding intermediate results is the number of decoding intermediate results that can be read out from the decoding intermediate result storage RAM 502 or the decoding intermediate result storage RAM 503 at the same time. In this case, the number of decoding intermediate results D501, which can be read out from the decoding intermediate result storage RAM 502 or the decoding intermediate result storage RAM 503 respectively at the same time, is 6. Finally, the quotient is further divided by the number of RAMs employed in decoding intermediate result storage memory 413 to result in the number 27. In this case, the number of RAMs employed in decoding intermediate result storage memory 413 is 2.

The following description explains details of operations carried out by sections employed in the decoding intermediate result storage memory 413 shown in FIG. 20.

In the decoding intermediate result storage memory 413, when the first computation process carried out by the computation section 412, the decoding intermediate results D412 ($u_j$) of the first computation process carried out by the computation section 412 are provided and the intermediate results D412 is written to predetermined address in either of the decoding intermediate result storage RAM 502 and the decoding intermediate result storage RAM 503. At the same time, decoding intermediate results D412 ($u_j$) of the first computation process carried out by the computation section 412 are read out from the other one of the decoding intermediate result storage RAM 502 and the decoding intermediate result storage RAM 503 and outputted to the computation section 412. When the computation section 415 carries out the second computation process, on the other hand, the decoding intermediate result storage memory 413 is not used for writing the decoding intermediate results of the second computation process in the decoding intermediate result storage RAM 502 or the decoding intermediate result storage RAM 503. Instead, the decoding intermediate result storage memory 413 reads out decoding intermediate results from a predetermined address in either the decoding intermediate result storage RAM 502 or the decoding intermediate result storage RAM 503 and supplies the decoding intermediate results to the cyclic shift circuit 414.

The switch 501 receives six decoding intermediate results D412 from the computation section 412 and a control signal $D420_1$ as a signal for selecting either the decoding intermediate result storage RAM 502 or the decoding intermediate result storage RAM 503 as a memory to be used for storing the decoding intermediate results D412. On the basis of the control signal $D420_1$, the switch 501 selects either the decoding intermediate result storage RAM 502 or the decoding intermediate result storage RAM 503 and supplies the six decoding intermediate results D412 to the selected one of the decoding intermediate result storage RAM 502 and the decoding intermediate result storage RAM 503.

Thus, the decoding intermediate result storage RAM 502 may receive the six decoding intermediate results D412 from the switch 501 as decoding intermediate results D501. In this case, the decoding intermediate result storage RAM 502 also receives a control signal $D420_2$ representing an address from the control section 417. In addition, six decoding intermediate results D501 already stored at the address represented by the control signal $D420_2$ as a result of the first computation process carried out previously by the computation section 412 are read out from the address and supplied to a switch 504 as decoding intermediate results D503. Furthermore, the six decoding intermediate results D412 received from the switch 501 as decoding intermediate results D501 are stored (written) at the address represented by the control signal $D420_2$.

As an alternative, the decoding intermediate result storage RAM 503 receives the six decoding intermediate results D412 from the switch 501 as decoding intermediate results D502. In this case, the decoding intermediate result storage RAM 503 also receives a control signal $D420_3$ representing an address from the control section 417. In addition, six decoding intermediate results D502 already stored at the address as a result of the first computation process carried out previously by the computation section 412 are read out from the address and supplied to the switch 504 as decoding intermediate results D504. Furthermore, the six decoding intermediate results D502 received from the switch 501 are stored (written) at the address represented by the control signal $D420_3$.

The switch 504 receives the decoding intermediate results D503 from the decoding intermediate result storage RAM 502 or the decoding intermediate results D504 from the decoding intermediate result storage RAM 503. In addition, the switch 504 also receives a control signal $D420_4$ generated by the control section 417 as a signal for selecting either the decoding intermediate result storage RAM 502 or the decoding intermediate result storage RAM 503. On the basis of the control signal $D420_4$, the switch 504 selects either the decoding intermediate result storage RAM 502 or the decoding intermediate result storage RAM 503 as a source for the decoding intermediate results D413 to be output by the switch 504. The switch 504 then passes on the six decoding intermediate results received from the selected one of the decoding intermediate result storage RAM 502 and the decoding intermediate result storage RAM 503 to the computation section 412 and the cyclic shift circuit 414 as the six decoding intermediate results D413.

FIG. 21 shows timing charts used for explaining read and write operations carried out on the decoding intermediate result storage RAM 502 and the decoding intermediate result storage RAM 503, which are employed in the decoding intermediate result storage memory 413.

It is to be noted that, in the timing charts shown in FIG. 21, the horizontal axis represents the lapse of time (t). Notation Ri denotes an operation to read out data corresponding to a matrix element indicated by the suffix i enclosed in a circle in a component matrix shown in FIG. 22 to indicate that the matrix element is a matrix element set at 1. By the same token, notation Wi denotes an operation to write (store) data corresponding to a matrix element indicated by the suffix i enclosed in a circle in a component matrix shown in FIG. 22 to indicate that the matrix element is a matrix element set at 1.

When the computation section 412 carries out the first computation process, six decoding intermediate results D501 per clock are read out for nine consecutive (9 clocks) in respectively (R0 to R8 shown in the figure) on the basis of the control signal $D420_2$ from the same address in the decoding intermediate result storage RAM 502 employed in the decoding intermediate result storage memory 413. The decoding intermediate results D501 corresponding to matrix elements set at 1 on the first to sixth rows of the parity check matrix H are a part of decoding intermediate results D501 already stored in the decoding intermediate result storage RAM 502 as a result of the first computation process carried out previously by the computation section 412. The decoding intermediate results D501 read out from the decoding intermediate result storage RAM 502 are supplied to the computation section 412 by way of the switch 504. That is, since the row weight of the parity check matrix H shown in FIG. 16 is 9, the number of decoding intermediate results D501 corresponding to matrix elements set at 1 on each of the first to sixth rows of the parity check matrix H is 9. Since six decoding intermediate results D501 are corresponding to matrix elements set at 1 on the first to sixth rows of the parity check matrix H are read out from the decoding intermediate result storage RAM 502 in nine consecutive.

Then, six decoding intermediate results D502 per clock are read out for 9 clocks in respectively read operations R9 to R17 shown in the figure on the basis of the control signal $D420_3$ from the same address in the decoding intermediate result storage RAM 503. The decoding intermediate results D502 corresponding to matrix elements set at 1 on the seventh to twelfth rows of the parity check matrix H are a part of decoding intermediate results D501 already stored in the decoding intermediate result storage RAM 503 as a result of the first computation process carried out previously by the computation section 412. The decoding intermediate results D502 read out from the decoding intermediate result storage RAM 503 are supplied to the computation section 412 by way of the switch 504.

The computers $412_1$ to $412_6$ and $415_1$ to $415_6$ each used for computing a message for a node cause a delay corresponding to a node degree. For example, the computers $412_1$ to $412_6$ cause a delay equal to a period of 9 clocks. In addition, if the decoding apparatus 400 carries out a high-speed operation at an operation speed higher than a frequency of 100 MHz, the computers $412_1$ to $412_6$ cause a further delay equal to a period of 3 clocks. Thus, pipelining of a period of 3 clocks is required.

That is to say, a time period T1 required by the computation section 412 to complete the first computation process is a period of 12 clocks. The time period T1 is defined as a period from the start of an operation to read out decoding intermediate results D413 from the decoding intermediate result storage memory 413 to the start of an operation to supply decoding intermediate results D412 to the decoding intermediate result storage memory 413 as a result of the first computation process carried out on the decoding intermediate results D413.

Thus, as the time period T1 lapses since the first read operation (R0) to read out decoding intermediate results D503 from the decoding intermediate result storage RAM 502, the computation section 412 starts an operation to supply six decoding intermediate results D412 corresponding to matrix elements set at 1 on respectively the first to sixth rows of the parity check matrix H to the decoding intermediate result storage memory 413 as a result of the first computation process. In the decoding intermediate result storage memory 413, the decoding intermediate results D413 are supplied to the decoding intermediate result storage RAM 502 by way of the switch 501 as decoding intermediate results D501. In the decoding intermediate result storage RAM 502, the decoding intermediate results D501 are stored at an address used for storing decoding intermediate results D503 in nine consecutive store operations (W0 to W8) on the basis of the control signal $D420_2$.

That is to say, a wait time is needed for 3 clocks time period Tw (=T1−9). The time period Tw is a period from the end of the nine consecutive read operations (R0 to R8) to read out decoding intermediate results D503 from the decoding intermediate result storage RAM 502 to the start of the nine consecutive store operations (W0 to W8) to store decoding intermediate results D501 in the decoding intermediate result storage RAM 502.

In other words, the nine consecutive store operations (W0 to W8) to store in the decoding intermediate result storage RAM 502 ends after the time period Tw lapses after the end of the nine consecutive read operations (R9 to R17) to read out from the decoding intermediate result storage RAM 503. That is to say, the time period Tw is required as a period between the end of nine consecutive read operations (R9 to R17) to read out from the decoding intermediate result storage RAM 503 and the start of nine consecutive read operations (R18 to R26) to read out from the decoding intermediate result storage RAM 502.

In addition, there have also been proposed some methods including a method implemented by approximation the sum product algorithm cited before. However, these proposed methods lead to deterioration of performance.

In the case of the aforementioned sum product algorithm that is implemented by hardware, as described above, the processing to compute messages each corresponding to an edge (the check-node process, the variable-node process, the first computation process and the second computation process) can be carried out by adoption of a serial method which, processes of the processing are carried out sequentially one process after another; a full parallel method which, all processes of the processing are carried out concurrently at the same time; or a parallel method which, some processes of the processing are carried out concurrently at one time in an operation.

In the case of the full parallel method or the parallel method for carrying out P processes concurrently at one time, however, a large value of P undesirably entails an increased circuit scale of the computation section 412 in particular. In the case of a P value of and a code length of 64,800 for example, the circuit scale of the computation section 412 may reach 20% of the entire decoding apparatus 400 or 60% of the logic circuit excluding memories (for example, the decoding intermediate result storage memory 410, the decoding intermediate result storage memory 413 and the reception memory 416) employed in the decoding apparatus 400 in some cases.

In addition, time periods Tw are required as shown in FIG. 21 as periods during which no data is read out from the decoding intermediate result storage RAM 502 and the decoding intermediate result storage RAM 503. That is to say, during a time period Tw, no decoding intermediate results D413 are supplied to the computation section 412 for carrying out the first computation process. Thus, during a time period Tw, the computation section 412 is undesirably in an idle state of carrying out no first computation process. In the case of a low node degree particularly, the time period Tw becomes relatively long, putting the computation section 412 in a long wasteful period of time.

[Non-Patent Document 1]

C. Howland and A. Blanksby, "Parallel Decoding Architectures for Low Density Parity Check Codes", Symposium on Circuits and Systems, 2001

[Non-Patent Document 2]

E. Yeo, P. Pakzad, B. Nikolic and V. Anantharam, "VLSI Architectures for iterative Decoders in Magnetic Recording Channels", IEEE Transactions on Magnetics, Vol. 37, No. 2, March 2001

[Non-Patent Document 3]

T. Zhang, K. K. Parhi, "Joint (3, k)-regular LDPC Code and decoder/encoder design," IEEE Transactions on Signal Processing, Vol. 52, No. 4, pp. 1065 to 1079, April 2004

[Non-Patent Document 4]

M. M. Mansour, N. R. Shanbhag, "A novel design methodology for high-performance programmable decoder cores for AA-LDPC codes," Proceedings of IEEE Workshop on Signal Processing Systems 2003 (SIPS 2003), pp. 29 to 34, August 2003

[Patent Document 1]

Japanese Patent Laid-open No. 2004-364233

DISCLOSURE OF THE INVENTION

Problems to be Solved by the Invention

Addressing the problems described above, the present invention provides a decoding apparatus and a decoding method, which are capable of carrying out a process to decode LDPC codes with a high degree precision while preventing the scale of the circuit implementing the decoding apparatus from increasing.

Means for Solving the Problems

A decoding apparatus according to the present invention includes a first computation section for carrying out a computation process of a check node for decoding LDPC codes and a second computation section for carrying out a computation process of a variable node for decoding LDPC codes, characterized in that: only the first computation section carries out processes of N (where N is an integer smaller than an integer P) check nodes at the same time; only the second computation section carries out processes of N variable nodes at the same time; or the first computation section carries out processes of N check nodes at the same time and the second computation section carries out processes of N variable nodes at the same time.

A decoding method according to the present invention includes a first computation step of carrying out a computation process of a check node for decoding LDPC codes and a second computation step of carrying out a computation process of a variable node for decoding LDPC codes, characterized in that: only the first computation step is executed to carry out processes of N (where N is an integer smaller than an integer P) check nodes at the same time; only the second computation step is executed to carry out processes of N variable nodes at the same time; or the first computation step is executed to carry out processes of N check nodes at the same time and the second computation step is executed to carry out processes of N variable nodes at the same time.

According to the present invention: only processes of N (where N is an integer smaller than an integer P) check nodes are carried out at the same time; only processes of N variable nodes are carried out at the same time; or processes of N check nodes are carried out at the same time and processes of N variable nodes are carried out at the same time.

Effect of the Invention

Thus, the present invention provides a decoding apparatus and a decoding method, which are capable of carrying out a process to decode LDPC codes with a high degree precision while preventing the scale of the circuit implementing the decoding apparatus from increasing.

BRIEF DESCRIPTION OF THE DRAWINGS

FIG. 3 shows a flowchart representing a procedure for decoding LDPC codes.

FIG. 4 is an explanatory diagram showing flows of messages.

FIG. 5 is a diagram showing a typical parity check matrix H of LDPC codes.

Figure 1:
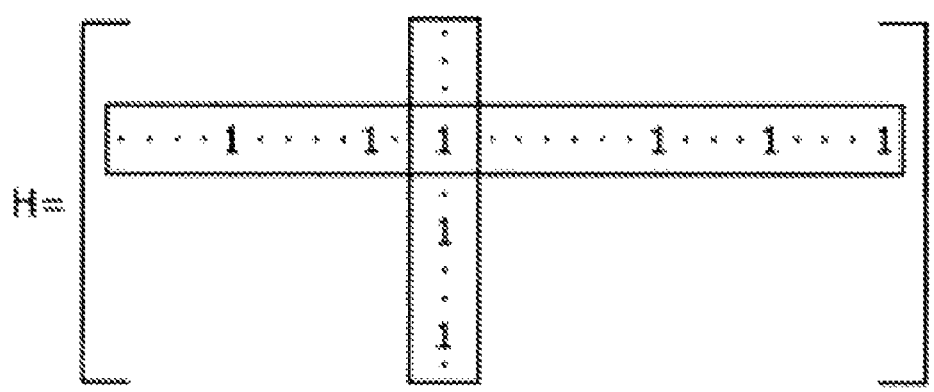
FIG. 1 is an explanatory diagram showing a parity check matrix H of LDPC codes.
Figure 2:
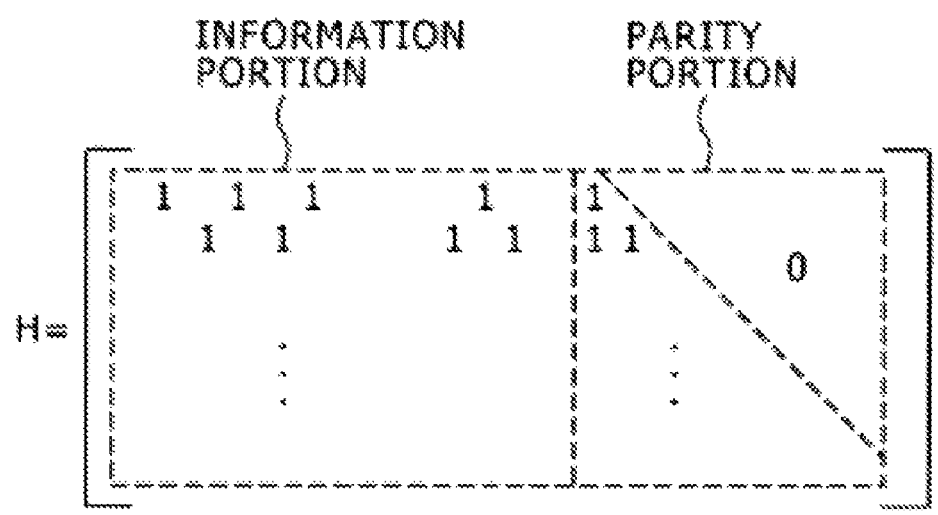
FIG. 2 is a diagram showing a parity check matrix H including a parity portion forming a lower triangle matrix.
Figure 6:
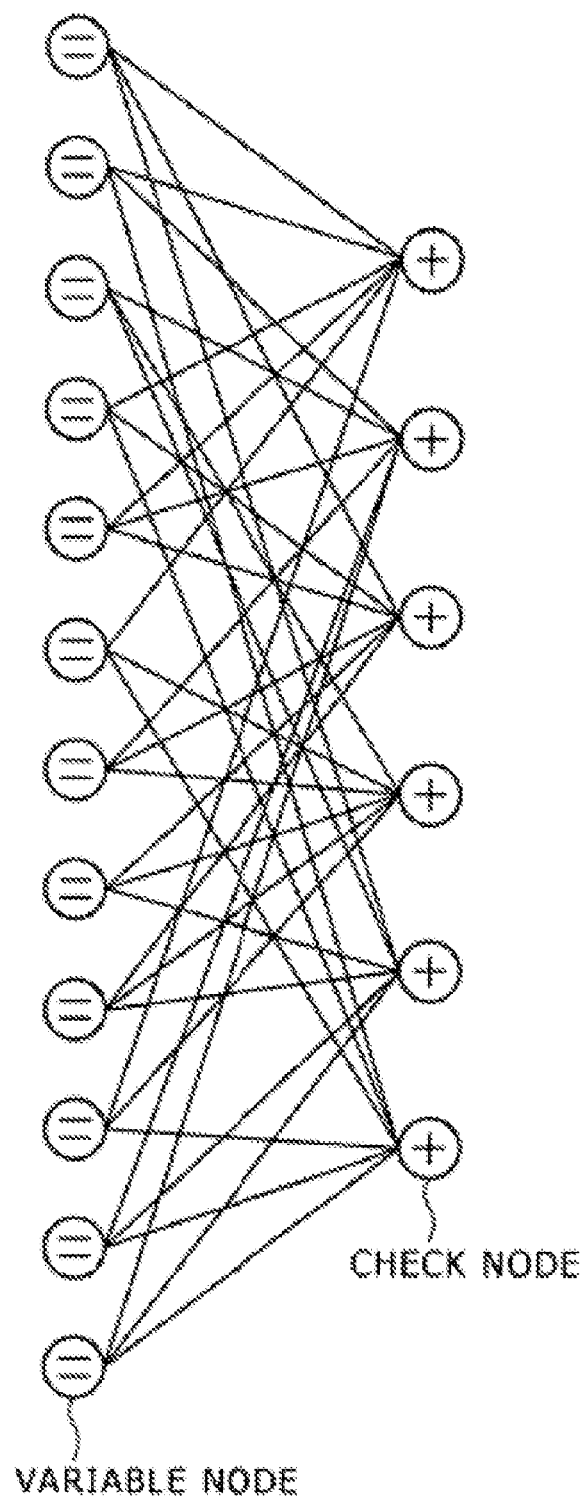
FIG. 6 is a diagram showing a Tanner graph corresponding to a parity check matrix H.
Figure 7:
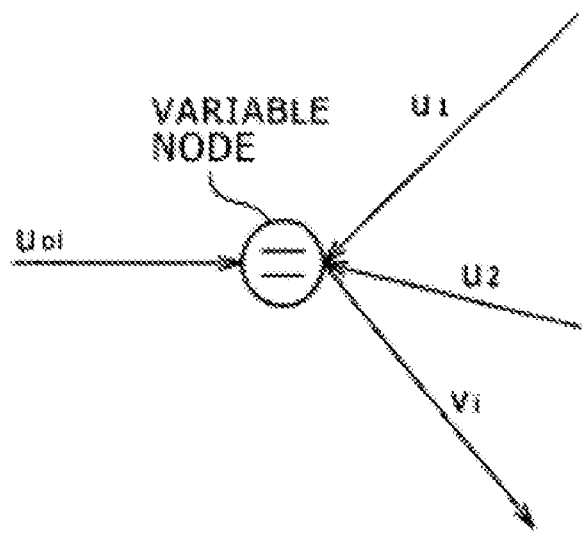
FIG. 7 is a diagram showing a variable node.
Figure 8:
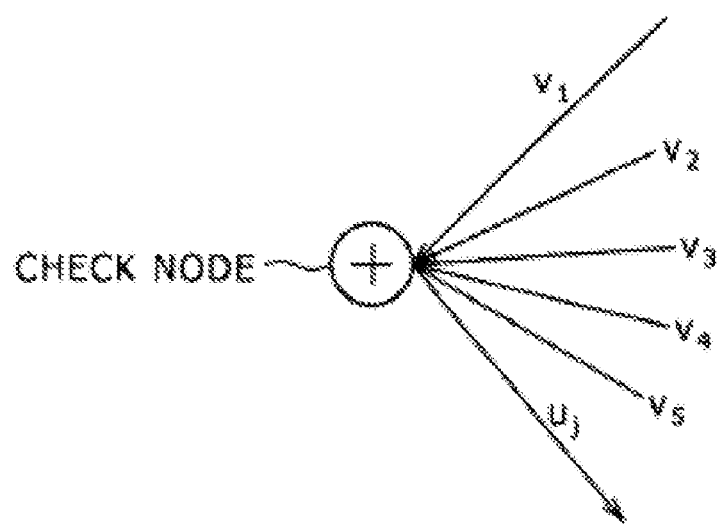
FIG. 8 is a diagram showing a check node.
Figure 9:
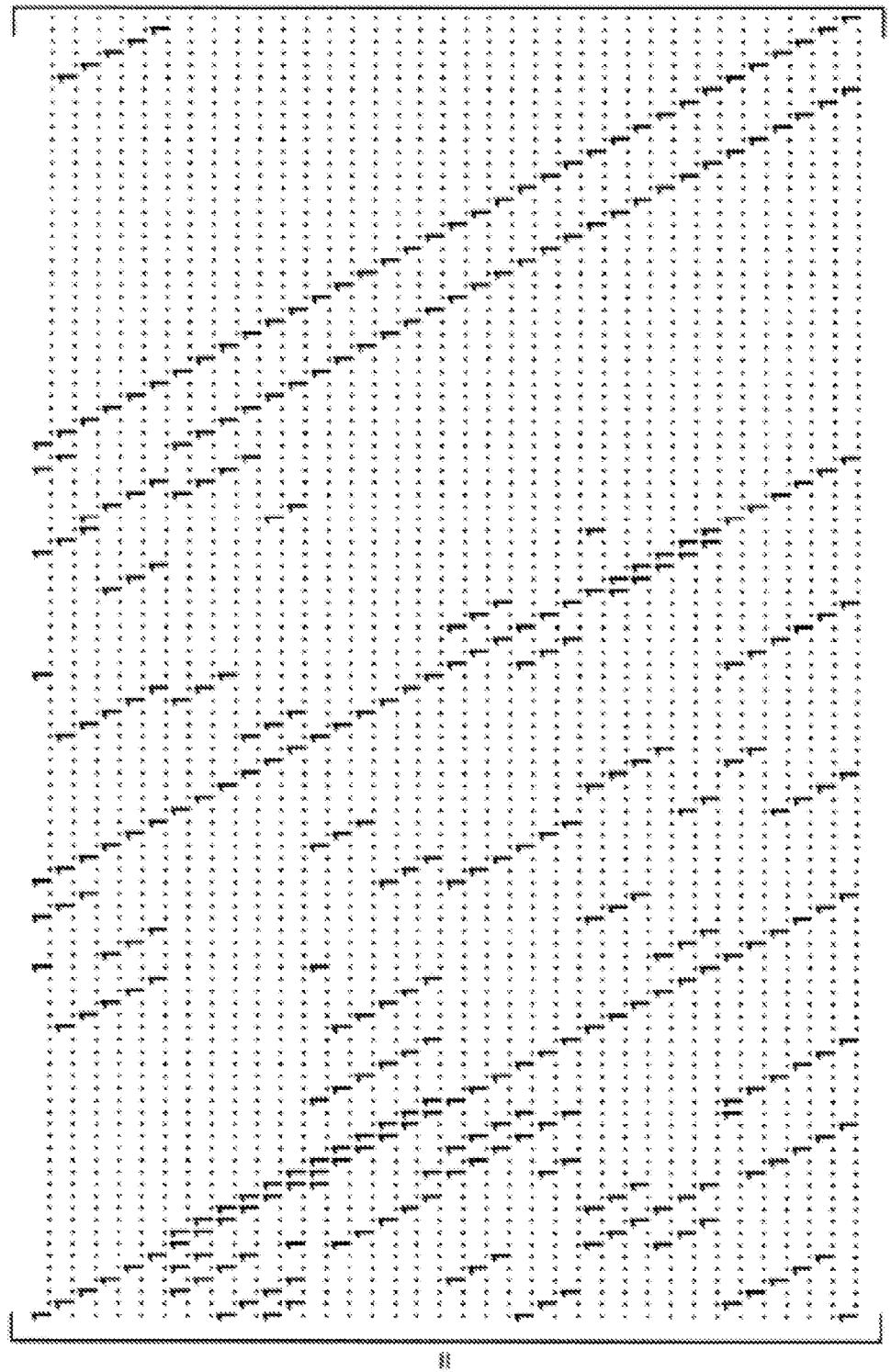
FIG. 9 is a diagram showing a typical parity check matrix H of LDPC codes.
Figure 10:
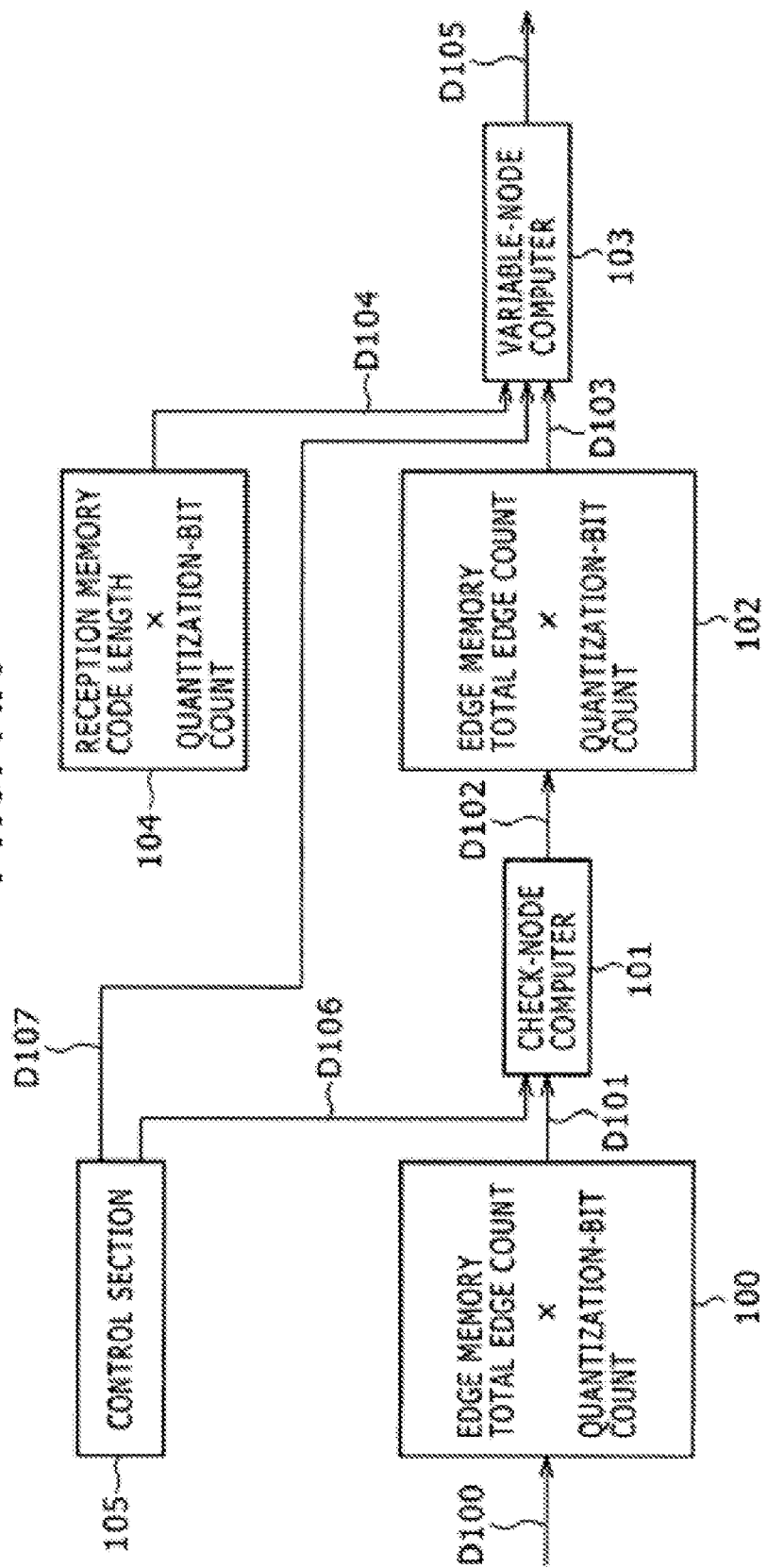
FIG. 10 is a block diagram showing a typical configuration of a decoding apparatus for decoding LDPC codes by carrying out node computation processes sequentially one process after another.
Figure 11:
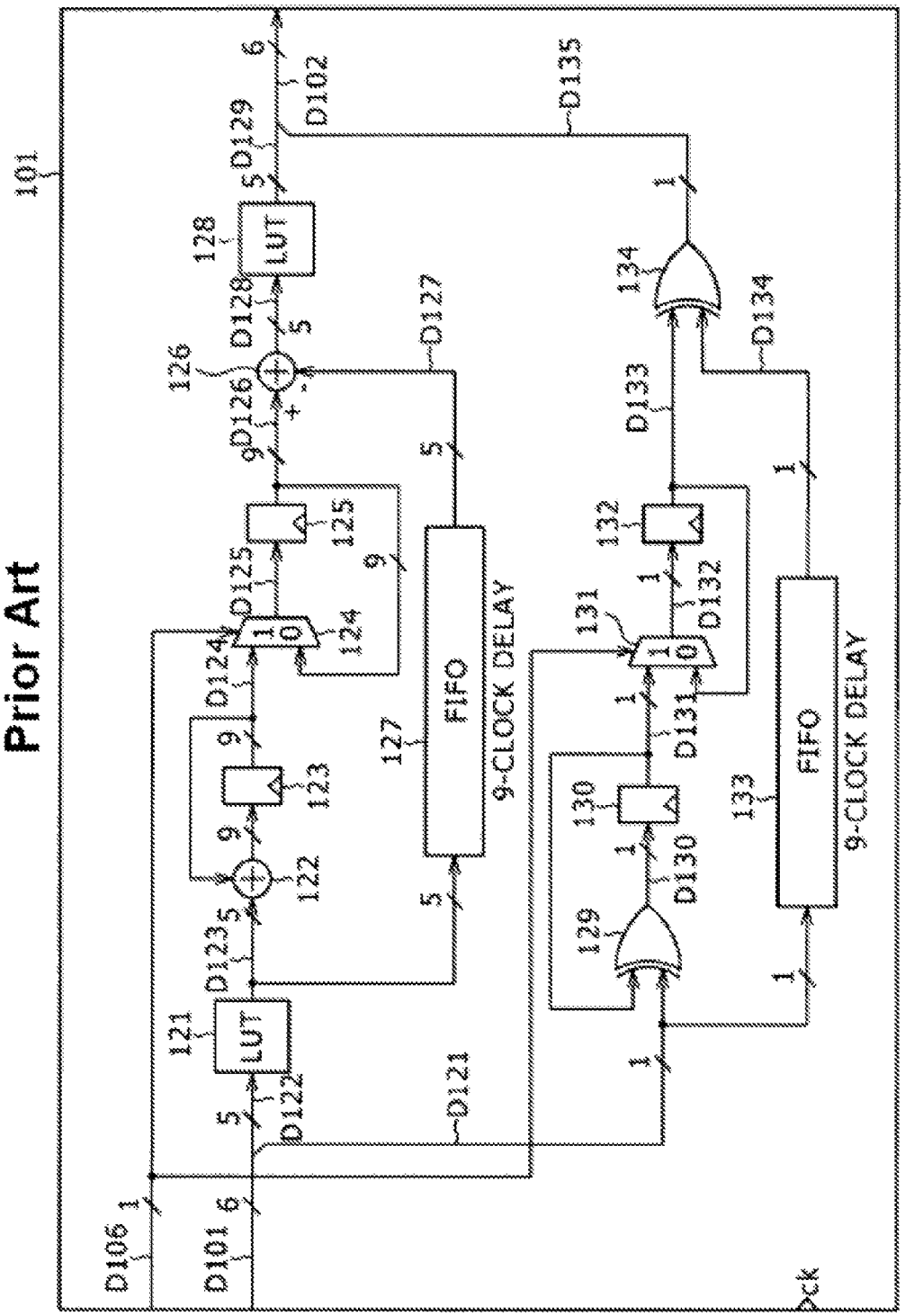
FIG. 11 is a block diagram showing a typical configuration of a check-node computer shown in FIG. 10.
Figure 12:
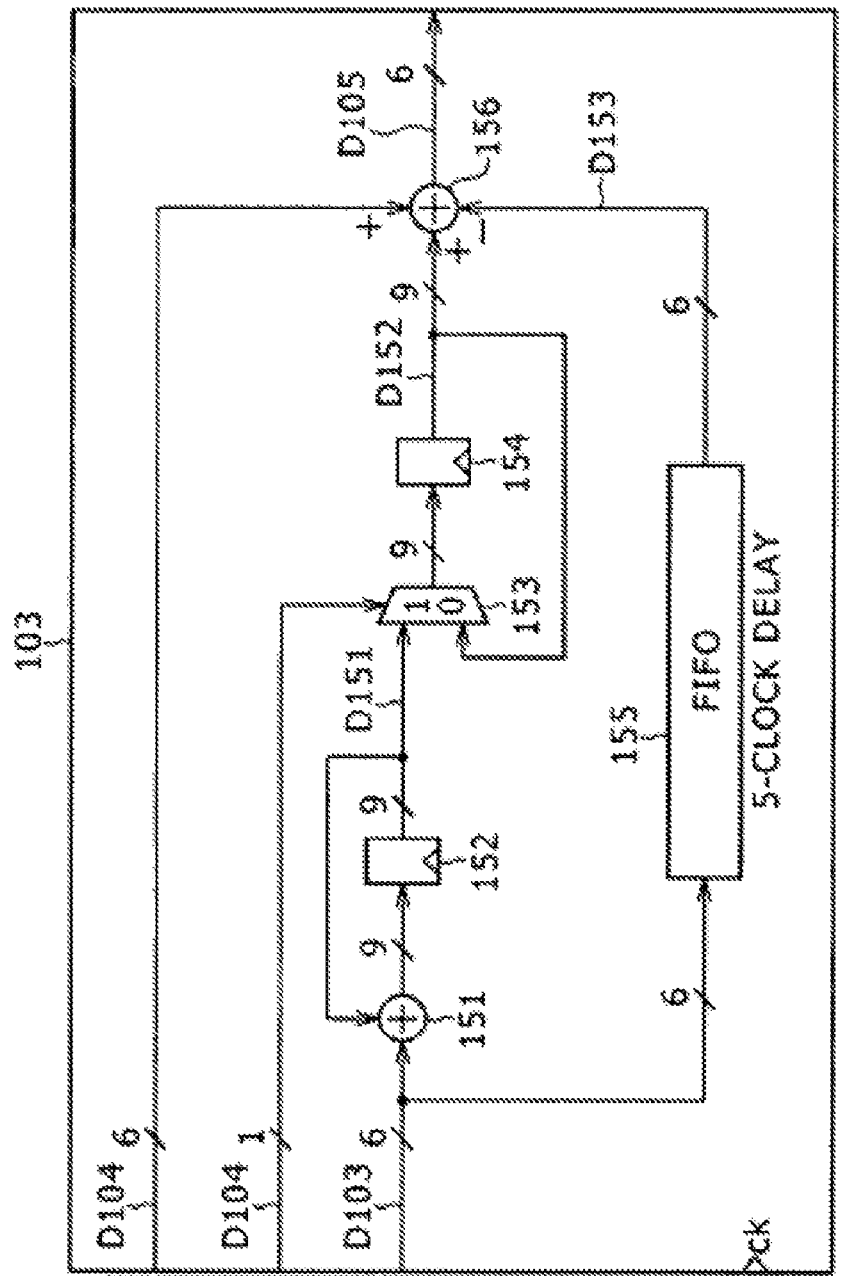
FIG. 12 is a block diagram showing a typical configuration of a variable-node computer shown in FIG. 10.
Figure 13:
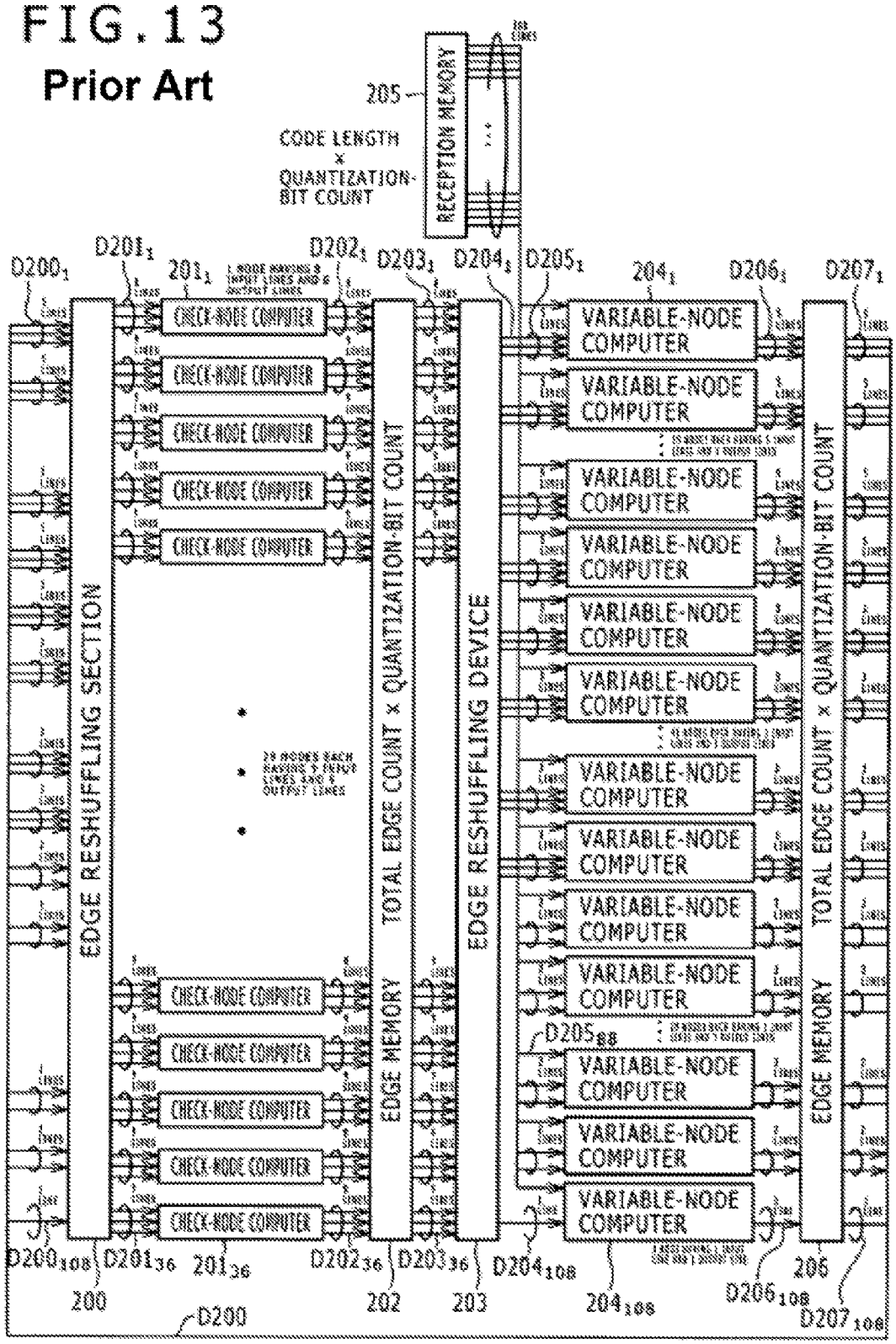
FIG. 13 is a block diagram showing a typical configuration of a decoding apparatus for decoding LDPC codes by carrying out all node computation processes at the same time.
Figure 14:
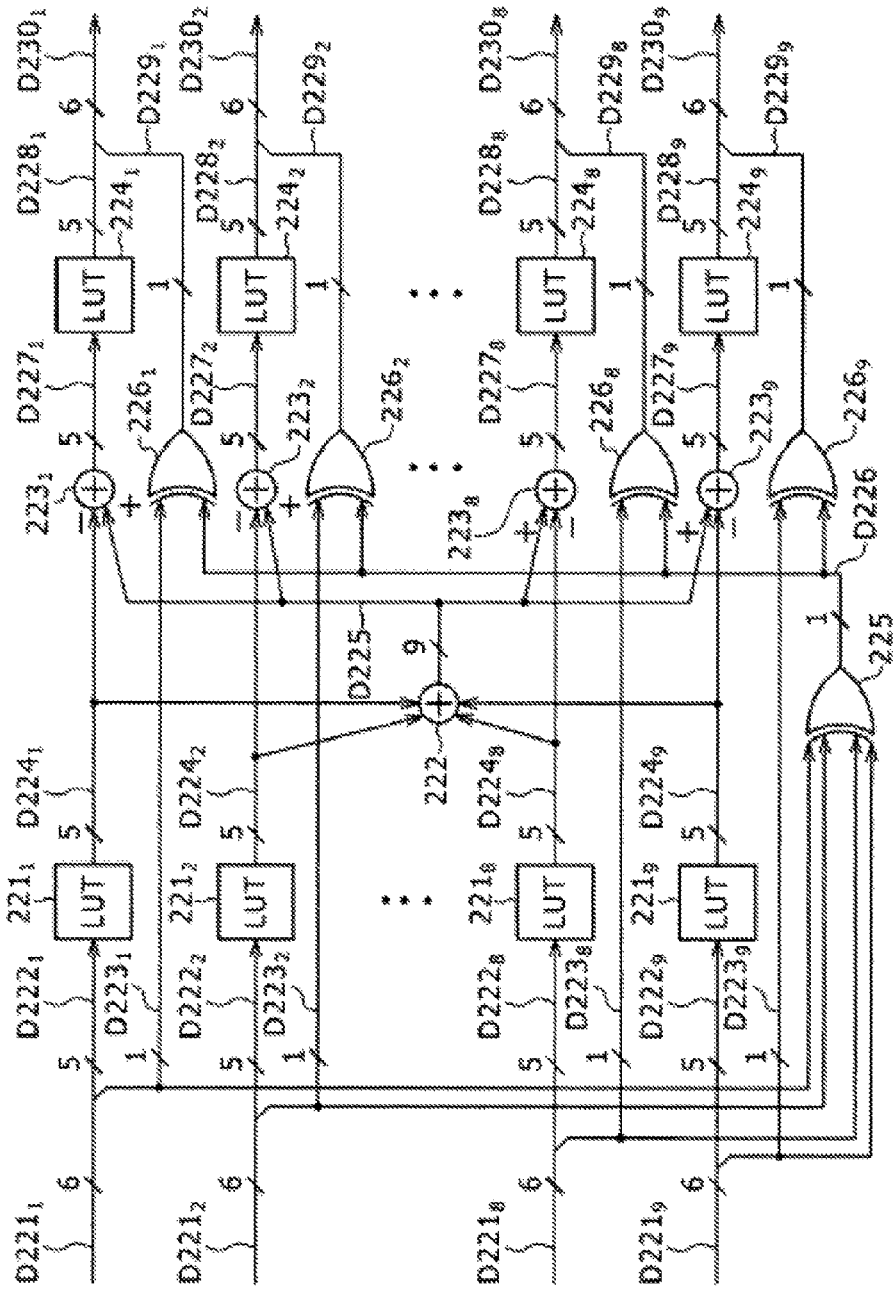
FIG. 14 is a block diagram showing a typical configuration of a check-node computer shown in FIG. 13.
Figure 15:
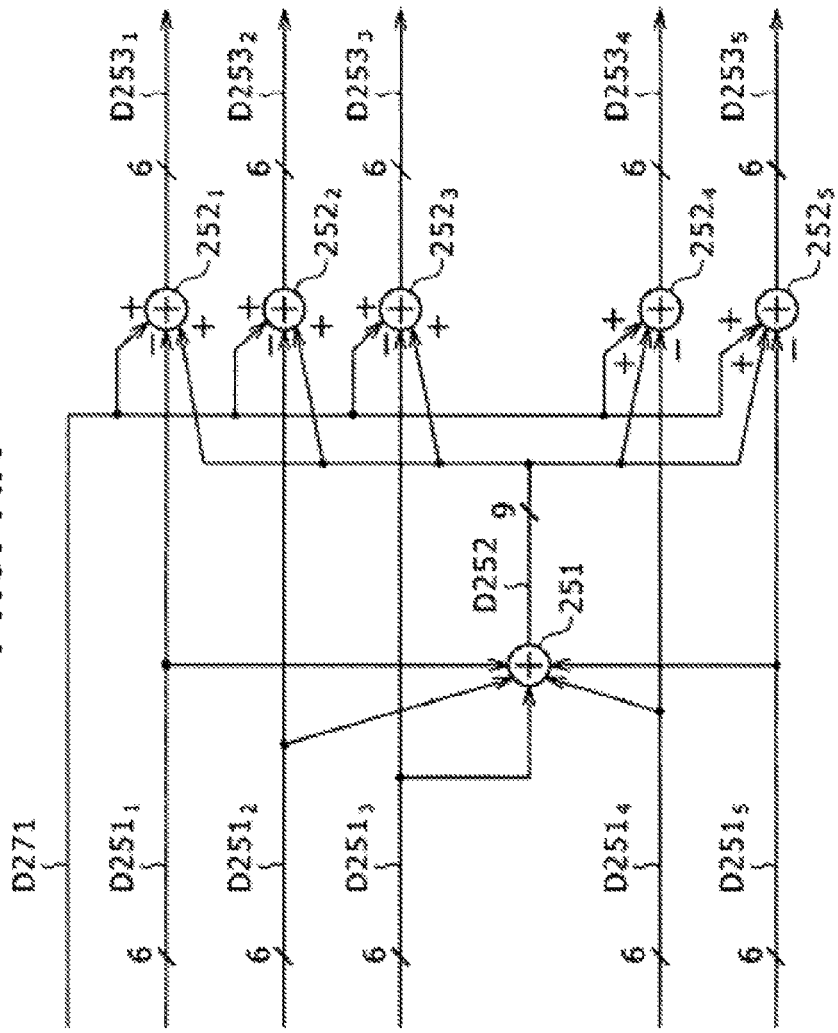
FIG. 15 is a block diagram showing a typical configuration of a variable-node computer shown in FIG. 13.

DESCRIPTION OF REFERENCE NUMERALS 414 cyclic shift circuit, 415 computation section, 416 reception memory, 1000 decoding apparatus, 1101 cyclic shift circuit, 1102 computation section, 1103, 1104 decoding intermediate result storage memory, 1105 control section, 1202 to 1205 decoding intermediate result storage RAM, 1499 control section, 1500 reception memory, 1600 decoding intermediate result storage memory, 1502, 1503 received-data storage memory, 1602, 1603 decoding intermediate result storage memory, 1799 control section, 1800 decoding intermediate result storage memory, 1801, 1802 decoding hard determination result storage memory, 1803 decoding soft determination result storage memory, 2000 cyclic shift circuit, 2001 syndrome determination section, 2002 decoding intermediate result storage memory, 2003 control section

BEST MODES FOR CARRYING OUT THE INVENTION

Concrete embodiments each applying the present invention are explained in detail by referring to figures as follows.

Figure 16:
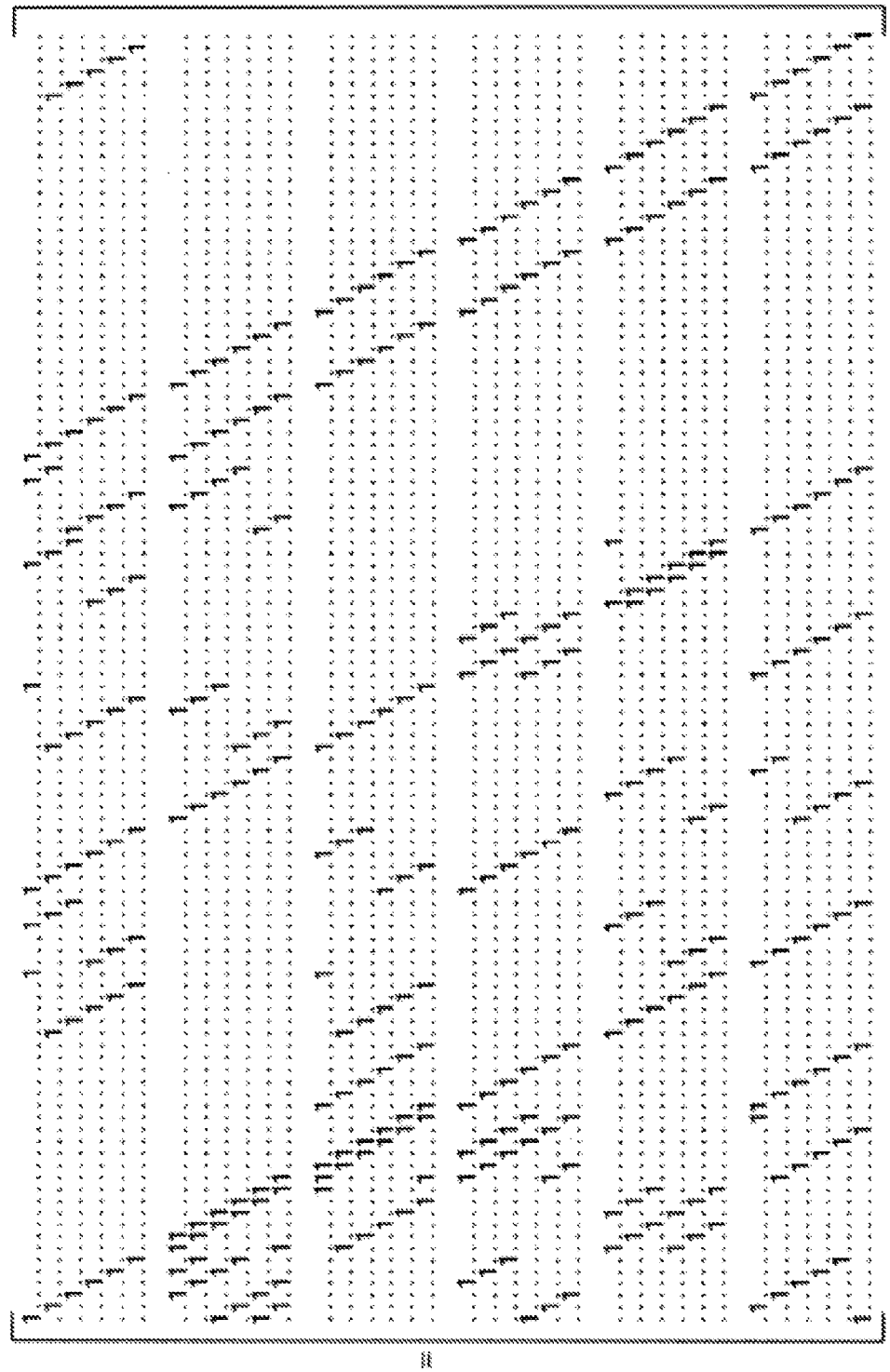
FIG. 16 is a diagram showing a parity check matrix H divided into a plurality of 6×6 units.
Figure 23:
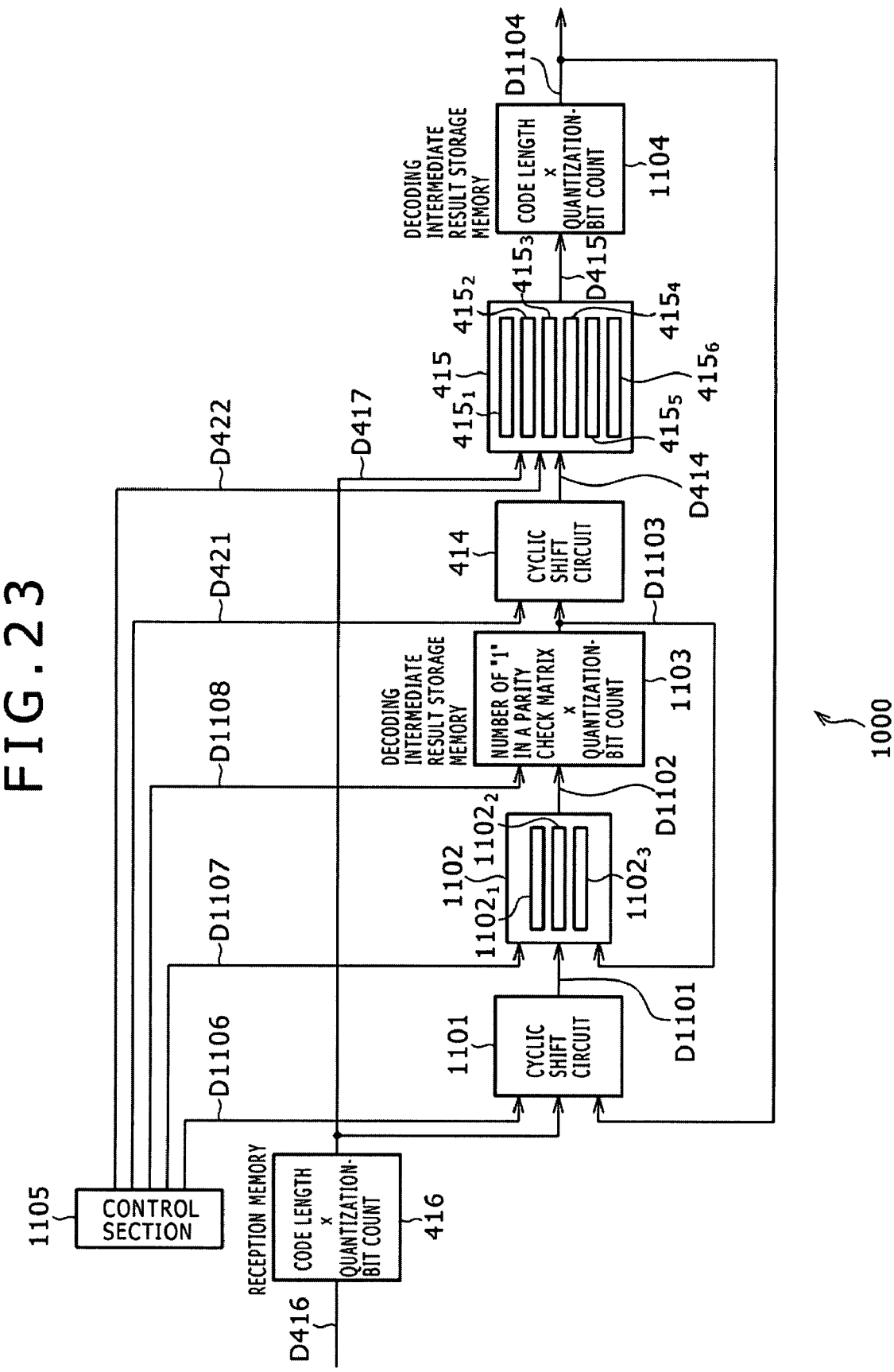
FIG. 23 is a block diagram showing a typical configuration of a decoding apparatus according to a first embodiment of the present invention.

FIG. 23 is a block diagram showing a typical configuration of a decoding apparatus implemented by a first embodiment of the present invention as an apparatus for decoding LDPC codes expressed by the parity check matrix H shown in FIG. 16.

Figure 17:
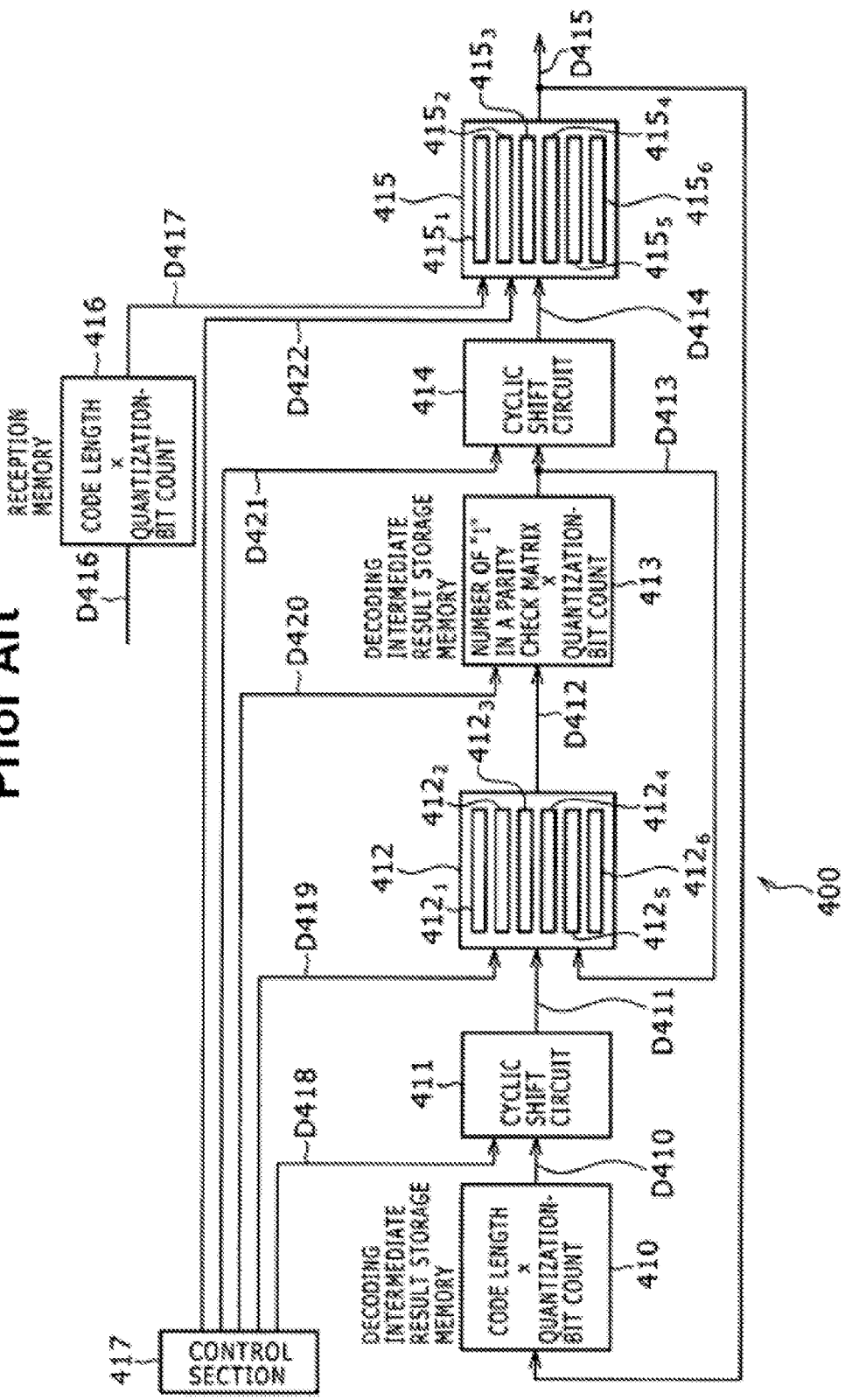
FIG. 17 is a block diagram showing a typical configuration of a decoding apparatus for carrying out six node computation processes at the same time.

The decoding apparatus 1000 shown in FIG. 23 employs a cyclic shift circuit 414, a computation section 415, a reception memory 416, a cyclic shift circuit 1101, a computation section 1102 including three computers $1102_1$ to $1102_3$, a decoding intermediate result storage memory 1103, a decoding intermediate result storage memory 1104 and a control section 1105. It is to be noted that sections identical with their respective counterparts employed in the decoding apparatus 400 shown in FIG. 17 are denoted by the same reference numerals as the counterparts.

The cyclic shift circuit 1101 receives six decoding intermediate results D1104 from the decoding intermediate result storage memory 1104 and six pieces of received data D417 (that is, LDPC codes) from the reception memory 416. In addition, the cyclic shift circuit 1101 also receives a control signal D1106 from the control section 1105. The control signal D1106 conveys information (or matrix data) indicating that the matrix element set at 1 in the parity check matrix H as an element corresponding to the decoding intermediate results D1104 is an element obtained as a result of carrying out some cyclic shift operations on a unit matrix included in the parity check matrix H as a unit matrix including the matrix element. In addition, the control signal D1106 also conveys information indicating which of the six decoding intermediate results D1104 and the six pieces of received data D417 are to be selected.

On the basis of the control signal D1106, the cyclic shift circuit 1101 selects the six decoding intermediate results D1104 or the six pieces of received data D417 and carries out cyclic shift operations on the six selected decoding intermediate results D1104 or the six selected pieces of received data D417 in order to rearrange the selected data. Then, the cyclic shift circuit 1101 outputs the upper (first to third row) or lower portion (fourth to sixth row) of the six results of the cyclic operations carried out on the six selected decoding intermediate results D1104 or the six selected pieces of received data D417 as decoding intermediate results D1101 to the computation section 1102.

As mentioned above, the computation section 1102 employs the three computers $1102_1$ to $1102_3$. The computation section 1102 receives the three decoding intermediate results D1101 (v) from the cyclic shift circuit 1101 as a result of a second computation process carried out by the computation section 415. In addition, the computation section 1102 also receives three decoding intermediate results D1103 from the decoding intermediate result storage memory 1103. Obtained as a result the first computation processes carried out previously by the three computers $1102_1$ to $1102_3$, the three decoding intermediate results D1103 ($u_j$) correspond to matrix elements set at 1 in the upper or lower rows of the component matrix. In the computation section 1102, the three decoding intermediate results D1101 and the three decoding intermediate results D1103 are supplied to the three computers $1102_1$ to $1102_3$. In addition, the computation section 1102 also receives a control signal D1107 from the control section 1105. In the computation section 1102, the control signal D1107 is supplied to the three computers $1102_1$ to $1102_3$. It is to be noted that the control signal D1107 is a signal common to the three computers $1102_1$ to $1102_3$.

Figure 18:
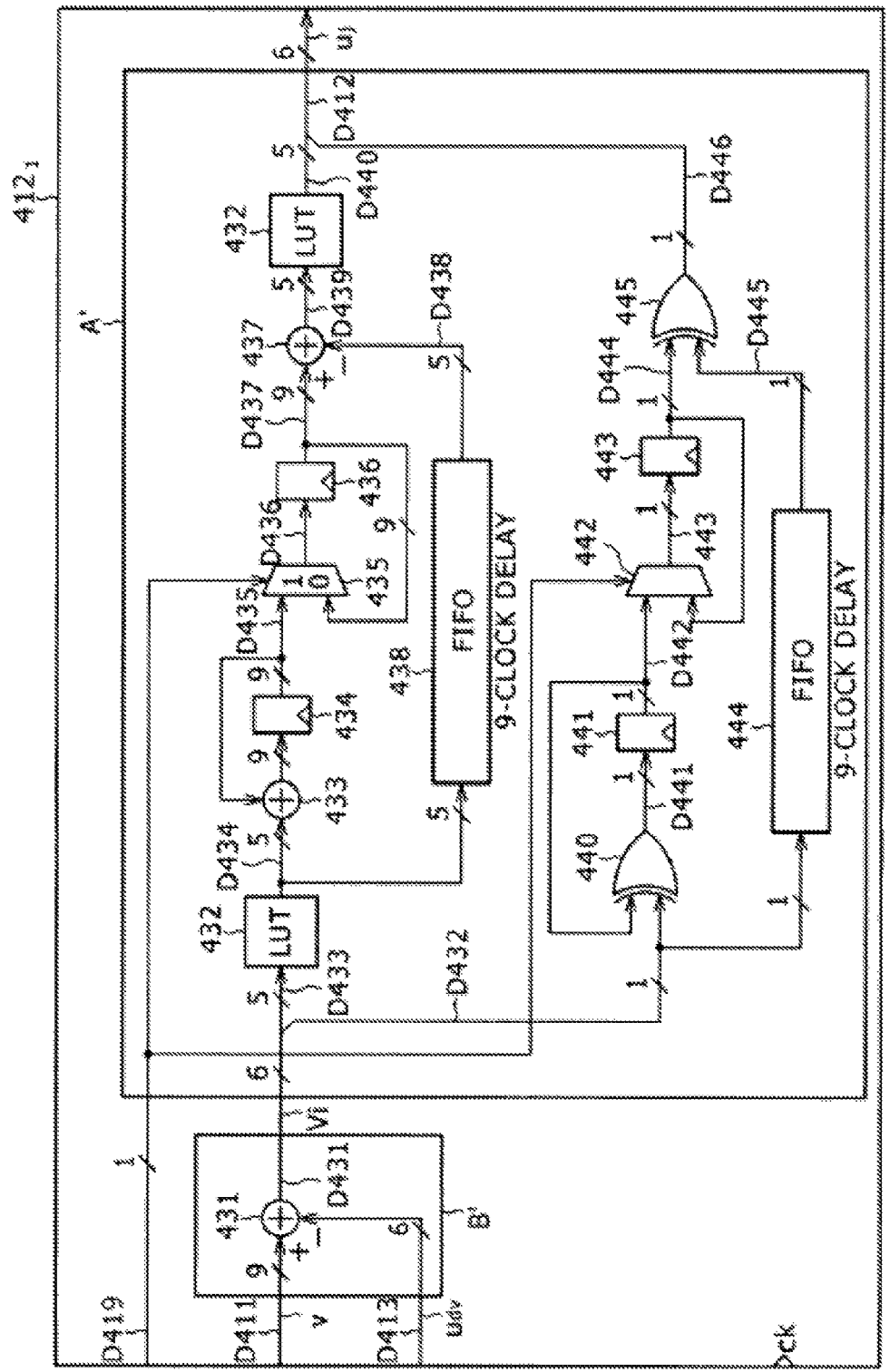
FIG. 18 is a block diagram showing a typical configuration of a check-node computer shown in FIG. 17.
Figure 19:
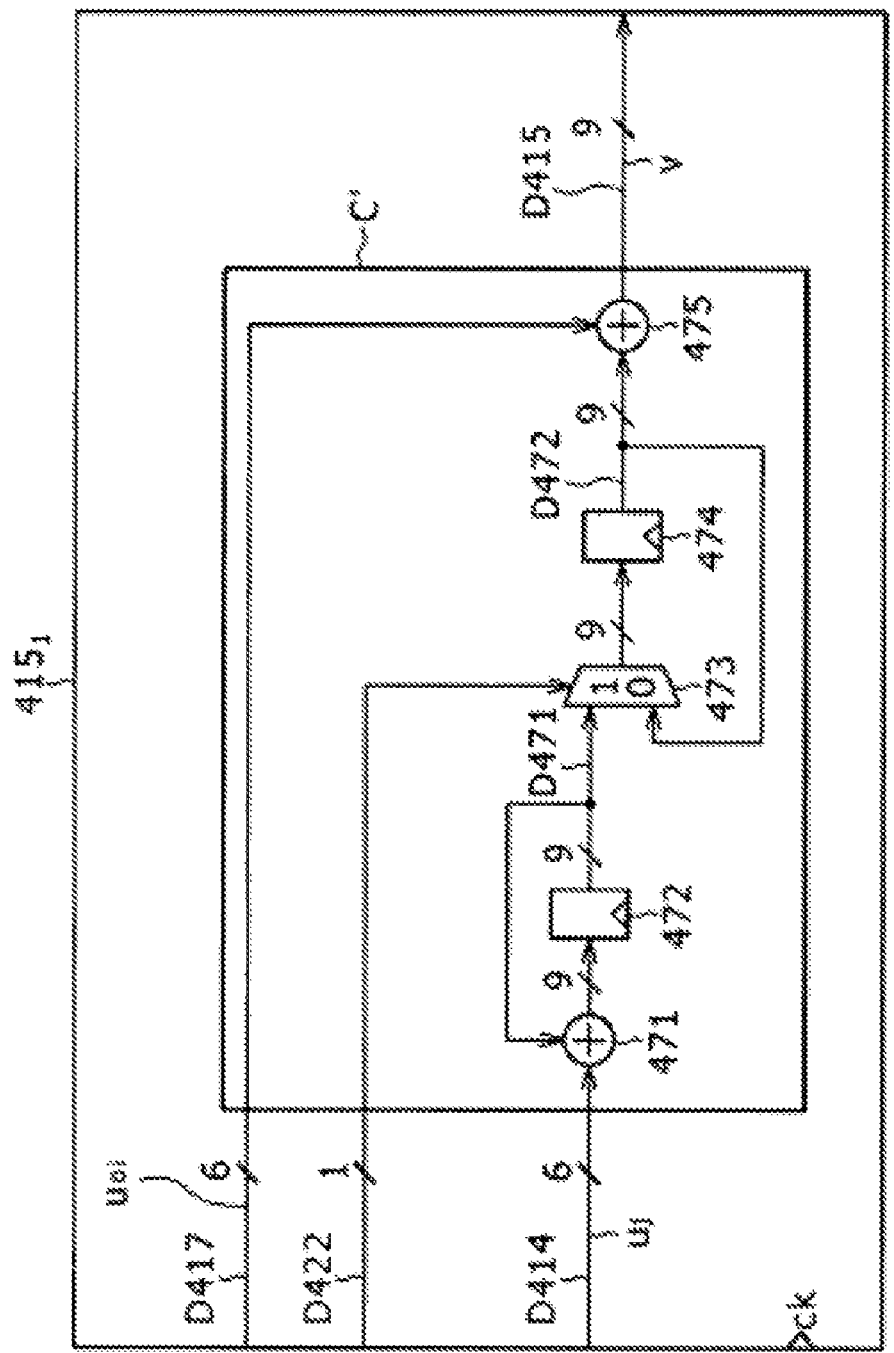
FIG. 19 is a block diagram showing a typical configuration of a variable-node computer shown in FIG. 17.
Figure 20:
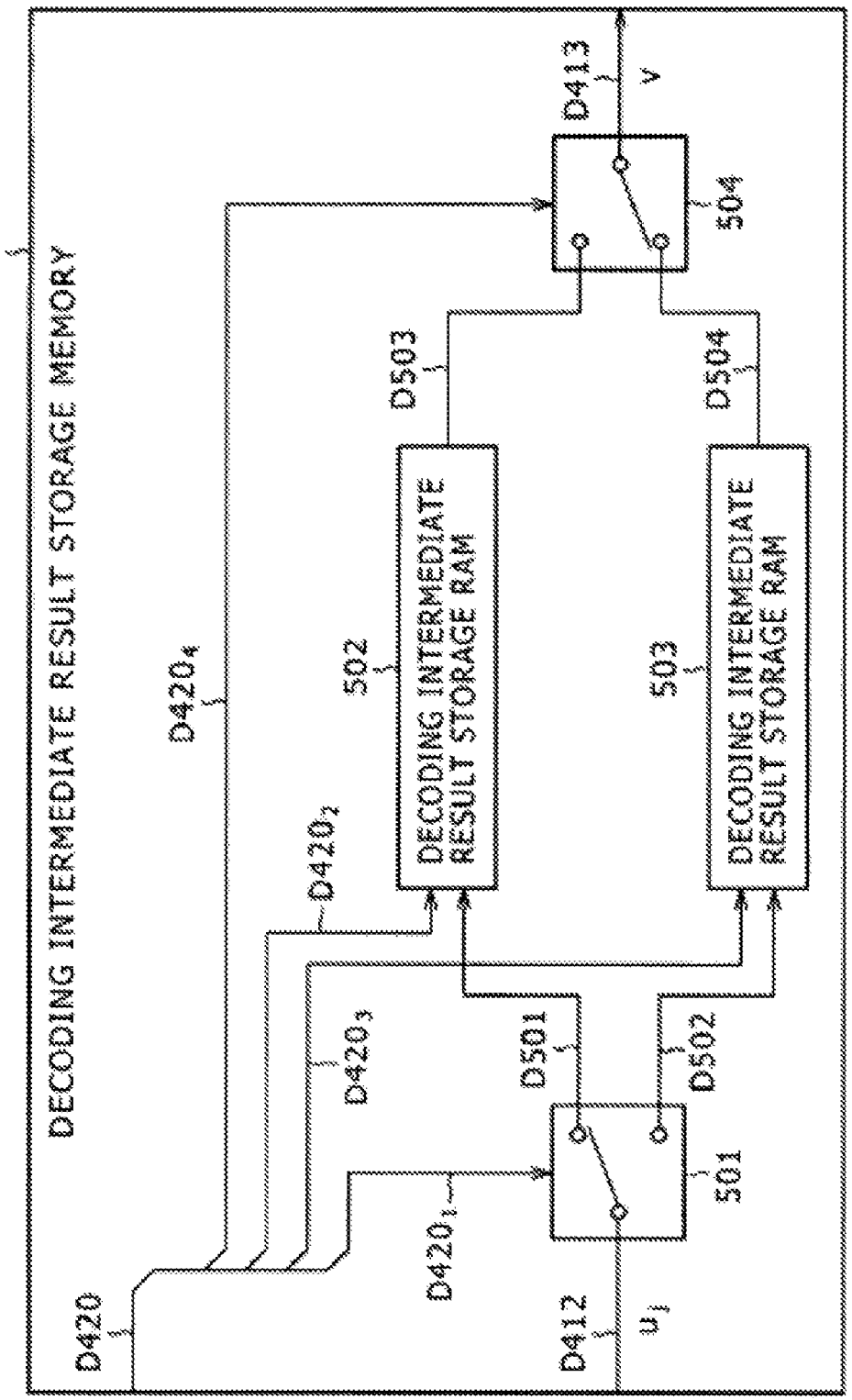
FIG. 20 is a block diagram showing a typical configuration of a decoding intermediate result storage memory shown in FIG. 17.
Figure 21:
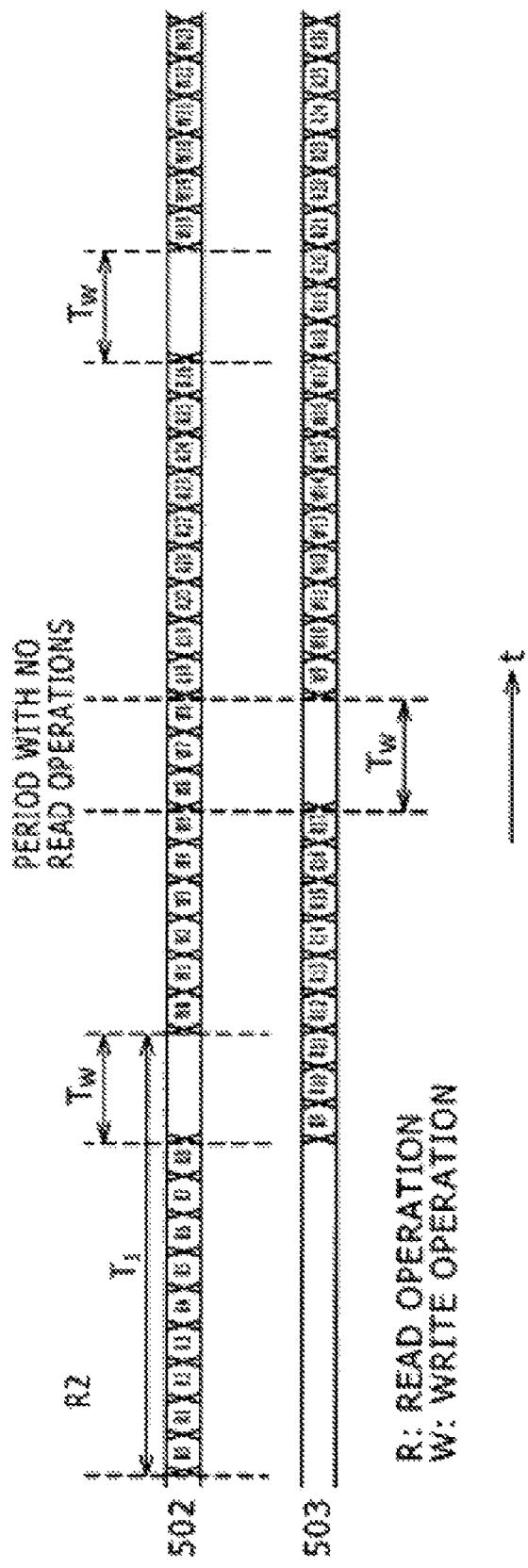
FIG. 21 shows timing charts to be referred to in explanation of operations of decoding intermediate result storage RAMs shown in FIG. 17.
Figure 22:
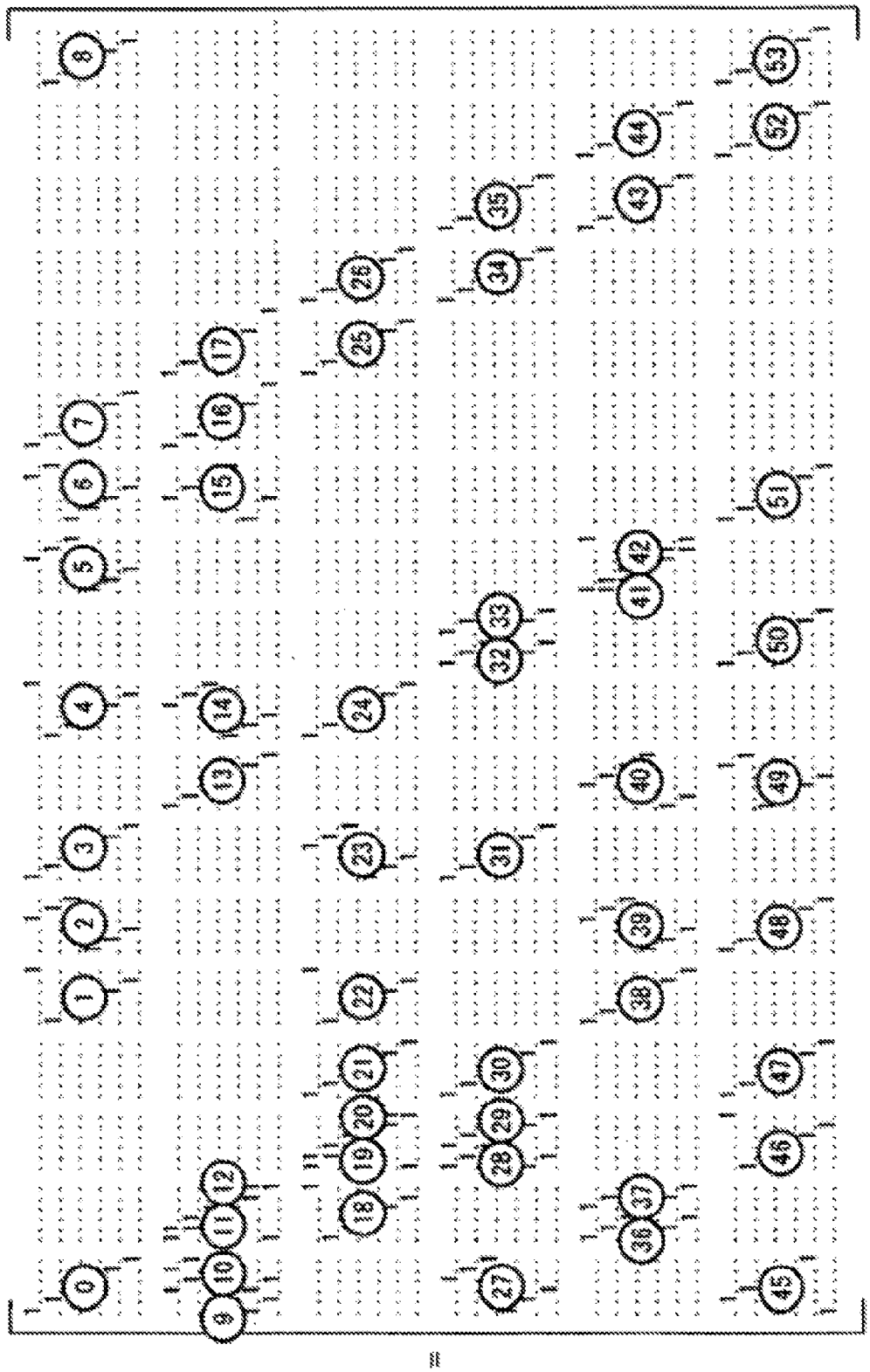
FIG. 22 is a diagram showing component matrixes corresponds to a decoding intermediate result.

The three computers $1102_1$ to $1102_3$ each have a configuration identical to the configuration of the computer $412_1$ shown in FIG. 18. The three computers $1102_1$ to $1102_3$ carry out the first computation processes according to Eqs. (7) and (8) by making use of the decoding intermediate results D1101 and D1103 in order to find three decoding intermediate results D1102 ($v_i$). The computation section 1102 stores the three decoding intermediate results D1102 in the decoding intermediate result storage memory 1103. The three decoding intermediate results D1102 obtained as a result of the first computation processes carried out by the three computers $1102_1$ to $1102_3$ correspond to respectively three matrix elements set at 1 in the three upper or lower rows of the component matrix.

The decoding intermediate result storage memory 1103 typically employs four single-port RAMs allowing three decoding intermediate results D1102 to be stored in the decoding intermediate result storage memory 1103 or read out from the decoding intermediate result storage memory 1103 at the same time. The decoding intermediate result storage memory 1103 receives the three decoding intermediate results D1102 from the computation section 1102 and a control signal D1108 from the control section 1105 as a signal for controlling operations to store the three decoding intermediate results D1102 in the decoding intermediate result storage memory 1103 or read out the three decoding intermediate results D1102 from the decoding intermediate result storage memory 1103.

On the basis of the control signal D1108, the decoding intermediate result storage memory 1103 allows the three decoding intermediate results D1102 received from the computation section 1102 to be stored collectively in the decoding intermediate result storage memory 1103 and, at the same time, three decoding intermediate results D1102 already stored in the decoding intermediate result storage memory 1103 to be read out from the decoding intermediate result storage memory 1103 and output to the computation section 1102 and the cyclic shift circuit 414 as decoding intermediate results D1103. That is to say, the operation to read out the decoding intermediate results D1103 from the decoding intermediate result storage memory 1103 to be supplied to the computation section 1102 as well as the cyclic shift circuit 414 and the operation to write the decoding intermediate results D1102 received from the computation section 1103 are carried out at the same time.

It is to be noted that, since the decoding intermediate result storage memory 1103 is used for storing decoding intermediate results D1102 originated from edges corresponding to matrix elements set at 1 at intersections of the ith column and rows in the parity check matrix H as a result of the first computation processes carried out by the computation section 1102, the required storage capacity of the decoding intermediate result storage memory 1103 is equal to the product of the quantization-bit count of the decoding intermediate results D1102 and the number of matrix elements set at 1 in the parity check matrix H.

Since the cyclic shift circuit 414, the computation section 415 and the reception memory 416 are identical with their respective counterparts employed in the decoding apparatus 400 shown in FIG. 17, their explanations are omitted. It is to be noted that the cyclic shift circuit 414 carries out cyclic shift operations on six decoding intermediate results D1103, three of which are received by the cyclic shift circuit 414 from the decoding intermediate result storage memory 1103 at one time, in order to generate six decoding intermediate results D414 to be supplied to the computation section 415.

The decoding intermediate result storage memory 1104 is used for storing decoding intermediate results D1105, which are received in 6-result units from the cyclic shift circuit 1101. The decoding intermediate results D1105 are stored sequentially in the decoding intermediate result storage memory 1104 in an address range starting with a first address and decoding intermediate results D1105 already stored in the decoding intermediate result storage memory 1104 are read out from the decoding intermediate result storage memory 1104. In addition, six decoding intermediate results D415 are also stored sequentially in the decoding intermediate result storage memory 1104 in the address range starting with the first address. Obtained as a result of the second computation process carried out by the computation section 415, the six decoding intermediate results D415 correspond to respectively six columns of the parity check matrix H.

That is to say, much like the decoding intermediate result storage memory 410 shown in FIG. 17, decoding intermediate results v corresponding to the first to sixth columns of the parity check matrix H are stored at the first address in the decoding intermediate result storage memory 1104 as a portion of decoding intermediate results corresponding to the columns of the parity check matrix H. In the same way, decoding intermediate results v corresponding to the seventh to twelfth columns of the parity check matrix H are stored at a second address. By the same token, decoding intermediate results v corresponding to the thirteenth to eighteenth columns of the parity check matrix H are stored at a third address. Thereafter, in the same way, decoding intermediate results v corresponding to the 19th to 108th columns of the parity check matrix H are stored as six decoding intermediate results per address at fourth to eighteenth addresses in the decoding intermediate result storage memory 1104. In this way, 108 decoding intermediate results v are stored in the decoding intermediate result storage memory 1104.

Thus, the number of words in the decoding intermediate result storage memory 1104 is a quotient obtained as a result of dividing the number of columns 108 (code length of LDPC codes) in the parity check matrix H shown in FIG. 16 by the number of decoding intermediate results 6. Therefore, the number of words in the decoding intermediate result storage memory 1104 is 18.

Decoding intermediate results D415 already stored in the decoding intermediate result storage memory 1104 are read out from the decoding intermediate result storage memory 1104 at the same time. To be more specific, the decoding intermediate results D415 read out from the decoding intermediate result storage memory 1104 at the same time are six decoding intermediate results v corresponding to matrix elements set at "1" in the parity check matrix H as matrix elements associated with decoding intermediate results $u_j$ to be found by a computation section 1102 provided at the immediately succeeding stage. The decoding intermediate results D415 read out from the decoding intermediate result storage memory 1104 at the same time are supplied to the cyclic shift circuit 1101 as decoding intermediate results D1104.

The decoding intermediate result storage memory 1104 typically employs single-port RAMs allowing six decoding intermediate results that are readable or writeable. In addition, since decoding intermediate results D415 obtained as a result of the second computation process carried out by the computation section 415 are stored in the decoding intermediate result storage memory 1104, the required storage capacity of the decoding intermediate result storage memory 1104 is equal to the product of the quantization-bit count of the decoding intermediate results D415 and the number of columns in the parity check matrix H (code length of LDPC codes).

The control section 1105 supplies the control signal D1106 to the cyclic shift circuit 1101 and the control signal D1107 to the computation section 1102 in order to control the cyclic shift circuit 1101 and the computation section 1102. In addition, the control section 1105 also supplies the control signal D1108 to the decoding intermediate result storage memory 1103, the control signal D421 to the cyclic shift circuit 414 and the control signal D422 to the computation section 415 in order to control the decoding intermediate result storage memory 1103, the cyclic shift circuit 414 and the computation section 415.

Data is circulated in the decoding apparatus 1000 for one decoding process in the following order: the cyclic shift circuit 1101 to the computation section 1102 to the decoding intermediate result storage memory 1103 to the cyclic shift circuit 414 to the computation section 415 and to the decoding intermediate result storage memory 1104. After the decoding apparatus 1000 carries out the decoding process repeatedly a predetermined number of times, the decoding intermediate results D1104 obtained as a result of the second computation processes carried out by the computation section 415 are output as the final decoding result.

Figure 24:
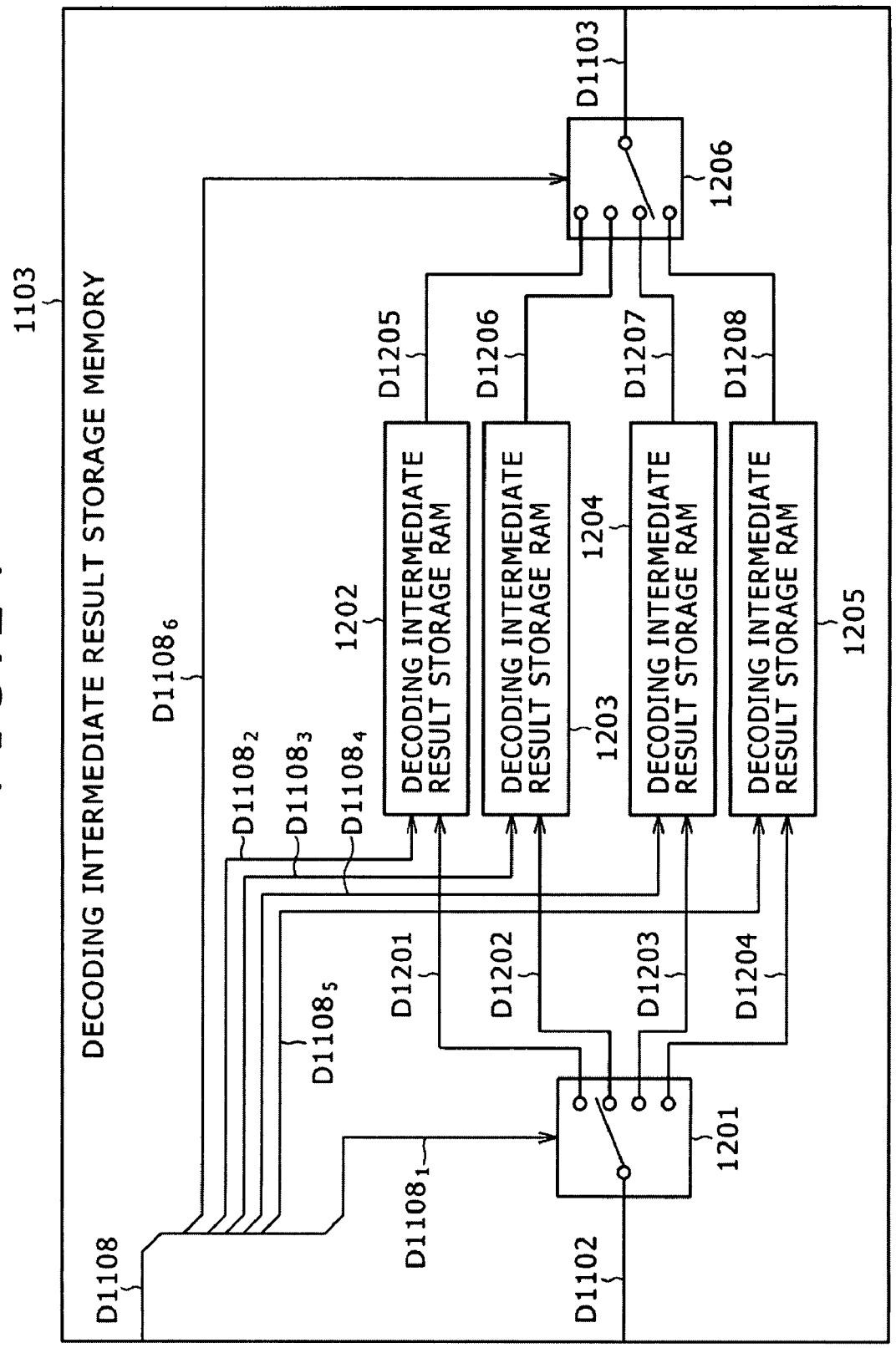
FIG. 24 is a block diagram showing a typical configuration of a decoding intermediate result storage memory shown in FIG. 23.

FIG. 24 is a block diagram showing a typical configuration of the decoding intermediate result storage memory 1103 shown in FIG. 23.

The decoding intermediate result storage memory 1103 employs switches 1201 and 1206 as well as four decoding intermediate result storage RAMs 1202 to 1205 each implemented as a single-port RAM.

Before the sections employed in the decoding intermediate result storage memory 1103 are explained in detail, first of all, a method for storing data into the decoding intermediate result storage RAMs 1202 to 1205 is explained.

The decoding intermediate result storage RAMs 1202 to 1205 are each used for storing decoding intermediate results D1102 obtained as a result of a first computation process carried out by the computation section 1102 and supplied to the decoding intermediate result RAMs 1202 to 1205 by way of the switch 1201.

To put it concretely, at first to ninth addresses in the decoding intermediate result storage RAM 1202, decoding intermediate results D1102 (D1201) corresponding to matrix elements set at 1 on the first to third rows of the parity check matrix H shown in FIG. 16 are stored in a form of packing (ignoring 0) decoding intermediate results D1102 (D1201) corresponding to matrix elements set at 1 on the rows in the horizontal direction (or the column arrangement direction).

Let notation (j, i) denote an intersection of the jth row and the ith column in the parity check matrix H shown in FIG. 16. In this case, data set at 1 in the upper half (or the first to third rows) of a 6×6 unit matrix included in the parity check matrix H shown in FIG. 16 as a component matrix spread throughout a matrix area ranging over intersections (1, 1) to (6, 6) are stored at the first address of the decoding intermediate result storage RAM 1202. By the same token, data set at 1 in the upper half of a 6×6 shift matrix included in the parity check matrix H shown in FIG. 16 as a component matrix spread throughout a matrix area ranging over intersections (1, 25) to (6, 30) are stored at the second address. The shift matrix in this case is a shift matrix obtained by carrying out a cyclic shift operation on a 6×6 unit matrix by 5 matrix elements in the direction to the right. In the same way, data set at 1 in the upper halves of component matrixes included in the parity check matrix H shown in FIG. 16 are stored at the third to eighth addresses.

Likewise, data set at "1" in the upper half of a 6×6 shift matrix included in the parity check matrix H shown in FIG. 16 as a component matrix spread throughout a matrix area ranging over intersections (1, 103) to (6, 108) are stored at the ninth address. The shift matrix in this case is a shift matrix obtained by carrying out a cyclic shift operation on a 6×6 semi unit matrix by "1" matrix element in the direction to the right. The 6×6 semi unit matrix in this case is a semi unit matrix obtained by resetting the matrix element set at "1" on the first row of a 6×6 unit matrix to "0". In this case, the first row of the 6×6 shift matrix spread throughout a matrix area ranging over intersections (1, 103) to (6, 108) does not include a matrix element set at "1". Thus, no data is stored at the ninth address.

By the same token, at the tenth to eighteenth addresses in the decoding intermediate result storage RAM 1202, data set at "1" on the thirteenth to fifteenth rows of the parity check matrix H shown in FIG. 16 are stored. To put it in detail, data corresponding to matrix elements set at "1" in the upper half of a 6×6 shift matrix included in the parity check matrix H shown in FIG. 16 as a component matrix spread throughout a matrix area ranging over intersections (13, 7) to (18, 12) are stored at the tenth address. The shift matrix in this case is a shift matrix obtained by carrying out a cyclic shift operation on a 6×6 unit matrix by 5 matrix elements in the direction to the right. By the same token, data set at "1" in the upper half of a shift matrix serving as a component of a sum matrix included in the parity check matrix H shown in FIG. 16 as a component matrix spread throughout a matrix area ranging over intersections (13, 13) to (18, 18) are stored at the eleventh address. The sum matrix in this case is the sum of a 6×6 unit matrix and the shift matrix, which is obtained by carrying out a cyclic shift operation on a 6×6 unit matrix by "1" matrix element in the direction to the right.

Likewise, data set at "1" in the upper half of the unit matrix serving as a component of the sum matrix included in the parity check matrix H as a component matrix spread throughout a matrix area ranging over intersections (13, 13) to (18, 18) are stored at the twelfth address. Thereafter, in the same way, data set at "1" in the upper halves in component matrixes included in the parity check matrix H are stored at the thirteenth to eighteenth addresses.

By the same token, at the nineteenth to twenty-seventh addresses in the decoding intermediate result storage RAM 1202, data each set at "1" on the twenty-fifth to twenty-seventh rows of the parity check matrix H shown in FIG. 16 are stored. That is to say, the number of words in the decoding intermediate result storage RAM 1202 is 27.

In addition, at the first to ninth addresses in the decoding intermediate result storage RAM 1203, decoding intermediate results D1102 (D1202) corresponding to matrix elements each set at "1" on the fourth to sixth rows of the parity check matrix H shown in FIG. 16 are stored in a form of packing decoding intermediate results D1102 (D1202) corresponding to matrix elements each set at 1 on the rows in the horizontal direction or the column arrangement direction.

To put it in detail, data corresponding to matrix elements each set at "1" in the lower half (or the fourth to sixth rows) of a 6×6 unit matrix included in the parity check matrix H shown in FIG. 16 as a component matrix spread throughout a matrix area ranging over intersections (1, 1) to (6, 6) are stored at the first address in the decoding intermediate result storage RAM 1203. By the same token, data corresponding to matrix elements each set at "1" in the lower half of a 6×6 shift matrix included in the parity check matrix H shown in FIG. 16 as a component matrix spread throughout a matrix area ranging over intersections (1, 25) to (6, 30) are stored at the second address. The shift matrix in this case is a shift matrix obtained by carrying out a cyclic shift operation on a 6×6 unit matrix by 5 matrix elements in the direction to the right. In the same way, data corresponding to matrix elements each set at "1" in the lower halves of component matrixes included in the parity check matrix H shown in FIG. 16 are stored at the third to ninth addresses.

By the same token, at the tenth to eighteenth addresses in the decoding intermediate result storage RAM 1203, data corresponding to matrix elements each set at "1" on the sixteenth to eighteenth rows of the parity check matrix H shown in FIG. 16 are stored. To put it in detail, data corresponding to matrix elements each set at "1" in the lower half of a 6×6 shift matrix included in the parity check matrix H as a component matrix spread throughout a matrix area ranging over intersections (13, 7) to (18, 12) are stored at the tenth address. The shift matrix in this case is a shift matrix obtained by carrying out a cyclic shift operation on a 6×6 unit matrix by 5 matrix elements in the direction to the right. By the same token, data corresponding to matrix elements each set at "1" in the lower half of a shift matrix serving as a component of a sum matrix (the sum of a 6×6 unit matrix and the shift matrix, which is obtained by carrying out a cyclic shift operation on a 6×6 unit matrix by 1 matrix element in the direction to the right) included in the parity check matrix H as a component matrix spread throughout a matrix area ranging over intersections (13, 13) to (18, 18) are stored at the eleventh address. Likewise, data corresponding to matrix elements each set at "1" in the lower half of the unit matrix serving as a component of the sum matrix included in the parity check matrix H as a component matrix spread throughout a matrix area ranging over intersections (13, 13) to (18, 18) are stored at the twelfth address. Thereafter, in the same way, data corresponding to matrix elements each set at "1" in the lower halves in component matrixes included in the parity check matrix H are stored at the thirteenth to eighteenth addresses.

By the same token, at the nineteenth to twenty-seventh addresses in the decoding intermediate result storage RAM 1203, data corresponding to matrix elements each set at "1" on the twenty-eighth to thirtieth rows of the parity check matrix H shown in FIG. 16 are stored. That is to say, the number of words in the decoding intermediate result storage RAM 1203 is 27.

In addition, at the first to ninth addresses in the decoding intermediate result storage RAM 1204, decoding intermediate results D1102 (D1203) corresponding to matrix elements each set at 1 on the seventh to ninth rows of the parity check matrix H shown in FIG. 16 are stored in a form of packing decoding intermediate results D1102 (D1203) corresponding to matrix elements each set at 1 on the rows in the horizontal direction or the column arrangement direction.

Data corresponding to matrix elements each set at "1" in the upper half (the seventh to ninth rows) of a first shift matrix serving as a component of a sum matrix (the sum of the first shift matrix and a second shift matrix. In this case, the first shift matrix is a shift matrix obtained by carrying out a cyclic shift operation on a 6×6 unit matrix by 2 matrix elements in the direction to the right whereas the second shift matrix is a shift matrix obtained by carrying out a cyclic shift operation on a 6×6 unit matrix by 4 matrix elements in the direction to the right) included in the parity check matrix H as a component matrix spread throughout a matrix area ranging over intersections (7, 1) to (12, 6) are stored at the first address in the decoding intermediate result storage RAM 1204. Data corresponding to matrix elements each set at "1" in the upper half of the second shift matrix serving as a component of the sum matrix included in the parity check matrix H shown in FIG. 16 as a component matrix spread throughout a matrix area ranging over intersections (7, 1) to (12, 6) are stored at the second address. In the same way, data corresponding to matrix elements each set at "1" in the upper halves of component matrixes included in the parity check matrix H are stored at the third to ninth addresses.

By the same token, at the tenth to eighteenth addresses in the decoding intermediate result storage RAM 1204, data corresponding to matrix elements each set at "1" on the nineteenth to twenty-first rows of the parity check matrix H shown in FIG. 16 are stored. In the same way, at the nineteenth to twenty-seventh addresses, data corresponding to matrix elements each set at "1" on the thirty-first to thirty-third rows of the parity check matrix H shown in FIG. 16 are stored. That is to say, the number of words in the decoding intermediate result storage RAM 1204 is 27.

In addition, at the first to ninth addresses in the decoding intermediate result storage RAM 1205, decoding intermediate results D1102 (D1204) corresponding to matrix elements each set at "1" on the tenth to twelfth rows of the parity check matrix H shown in FIG. 16 are stored in a form of packing decoding intermediate results D1102 (D1203) corresponding to matrix elements each set at "1" on the rows in the horizontal direction or the column arrangement direction.

Data corresponding to matrix elements each set at "1" in the lower half (the tenth to twelfth rows) of a first shift matrix serving as a component of a sum matrix (the sum of the first shift matrix and a second shift matrix. In this case, the first shift matrix is a shift matrix obtained by carrying out a cyclic shift operation on a 6×6 unit matrix by two matrix elements in the direction to the right whereas the second shift matrix is a shift matrix obtained by carrying out a cyclic shift operation on a 6×6 unit matrix by four matrix elements in the direction to the right) included in the parity check matrix H as a component matrix spread throughout a matrix area ranging over intersections (7, 1) to (12, 6) are stored at the first address in the decoding intermediate result storage RAM 1205. Data corresponding to matrix elements each set at 1 in the lower half of the second shift matrix serving as a component of the sum matrix included in the parity check matrix H as a component matrix spread throughout a matrix area ranging over intersections (7, 1) to (12, 6) are stored at the second address. In the same way, data corresponding to matrix elements each set at "1" in the lower halves of component matrixes included in the parity check matrix H are stored at the third to ninth addresses.

By the same token, at the tenth to eighteenth addresses in the decoding intermediate result storage RAM 1205, data corresponding to matrix elements each set at "1" on the twenty-second to twenty-fourth rows of the parity check matrix H shown in FIG. 16 are stored. In the same way, at the nineteenth to twenty-seventh addresses, data corresponding to matrix elements each set at "1" on the thirty-fourth to thirty-sixth rows of the parity check matrix H shown in FIG. 16 are stored. That is to say, the number of words in the decoding intermediate result storage RAM 1205 is 27.

As described above, the number of words in each of the decoding intermediate result storage RAM 1202 to the decoding intermediate result storage RAM 1205 is 27. This number 27 is obtained as follows. The row weight of the parity check matrix H is 9. This row weight of 9 is multiplied by the row count of 36 to give a multiplied result (the number of matrix elements each set at "1" in the parity check matrix H). The multiplied result is then divided by 3, which is the number of decoding intermediate results D1201, which can be read out at the same time, to give a quotient. Finally, the quotient is further divided by 4, which is the number of the decoding intermediate result storage RAMs employed in the decoding intermediate result storage memory 1103 to result in the number 27.

The following description explains details of operations carried out by the sections employed in the decoding intermediate result storage memory 1103 shown in FIG. 24.

When the computation section 1102 carries out a first computation process, the decoding intermediate result storage memory 1103 receives decoding intermediate results D1102 ($u_j$) obtained as a result of the first computation process from the computation section 1102. In the decoding intermediate result storage memory 1103, the decoding intermediate results D1102 are stored at a predetermined address determined in advance in one of the decoding intermediate result storage RAMs 1202 to 1205. At the same time, from another one of the decoding intermediate result storage RAMs 1202 to 1205, decoding intermediate results D1102 ($u_j$) obtained as a result of a first computation process carried out previously by the computation section 1102 are read out and output to the computation section 1102 as decoding intermediate results D1103. When the computation section 415 carries out a second computation process, on the other hand, no data is written in the decoding intermediate result storage RAMs 1202 to 1205 employed in the decoding intermediate result storage memory 1103. Instead, decoding intermediate results D1102 are read out from an address determined in advance in one of the decoding intermediate result storage RAMs 1202 to 1205 and supplied to the cyclic shift circuit 414 as decoding intermediate results D1103.

The switch 1201 receives three decoding intermediate results D1102 from the computation section 1102 and a control signal D1108$_1$ from the control section 1105 as a signal for selecting one of the decoding intermediate result storage RAMs 1202 to 1205 as a RAM to be used for storing the decoding intermediate results D1102. On the basis of the control signal D1108$_1$, the switch 1201 selects one of the decoding intermediate result storage RAMs 1202 to 1205 and supplies the three decoding intermediate results D1102 to the selected one of the decoding intermediate result storage RAMs 1202 to 1205.

The three decoding intermediate results D1102 are supplied to the decoding intermediate result storage RAM 1202 to 1205 as decoding intermediate results D1201 to D1204 respectively. At the same time, the decoding intermediate result storage RAMs 1202 to 1205 receive control signals D1108$_2$ to D1108$_5$ each conveying information on an address from the control section 1105. Three decoding intermediate results D1201 to D1204 already stored at an address specified by the control signal D1108$_2$ to D1108$_5$ as a result of a first computation process carried out previously by the computation section 1102 are read out from the decoding intermediate result storage RAM 1202 to 1205 and supplied to the switch 1206 as decoding intermediate results D1205 to D1208, respectively. In addition, three decoding intermediate results D1201 to D1204 received from the switch 1201 are stored at an address specified by the control signal D1108$_2$ to D1108$_5$ as an address in the decoding intermediate result storage RAM 1202 to 1205, respectively.

The switch 1206 receives the decoding intermediate results D1205 from the decoding intermediate result storage RAM 1202, the decoding intermediate results D1206 from the decoding intermediate result storage RAM 1203, the decoding intermediate results D1207 from the decoding intermediate result storage RAM 1204 or the decoding intermediate results D1208 from the decoding intermediate result storage RAM 1205. In addition, the switch 1206 receives a control signal D1086 from the control section 1105 as a signal for selecting one of the decoding intermediate result storage RAMs 1202 to 1205. On the basis of the control signal D1108$_6$, the switch 1206 selects one of the decoding intermediate result storage RAMs 1202 to 1205 as a source for supplying the three decoding intermediate results D1205 to D1208, respectively, and outputs the three decoding intermediate results D1205 to D1208, to the computation section 1102 or the cyclic shift circuit 414 as three decoding intermediate results D1103.

Figure 25:
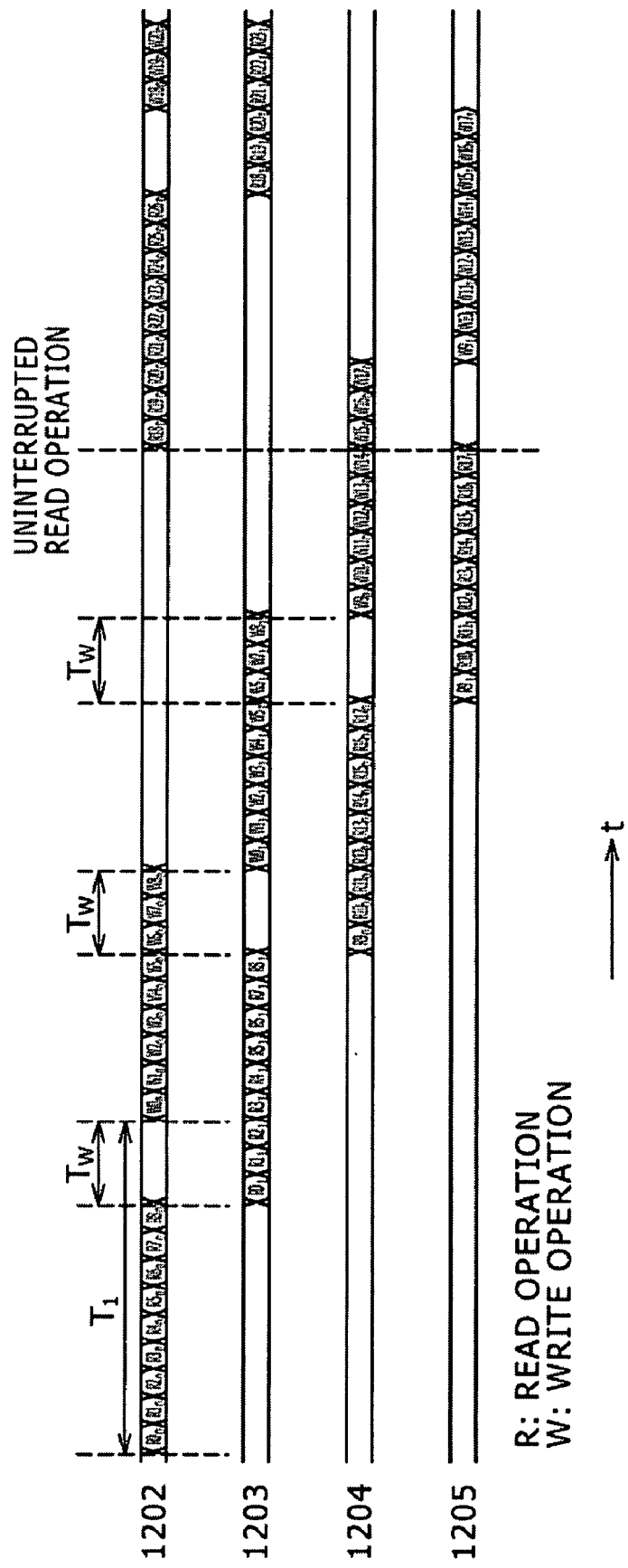
FIG. 25 shows timing charts to be referred to in explanation of operations of decoding intermediate result storage RAMs shown in FIG. 24.

FIG. 25 shows timing charts referred to in explanation of operations to read out data from the decoding intermediate result storage RAMs 1202 to 1205 employed in the decoding intermediate result storage memory 1103 and store data into the decoding intermediate result storage RAMs 1202 to 1205.

Figure 26:
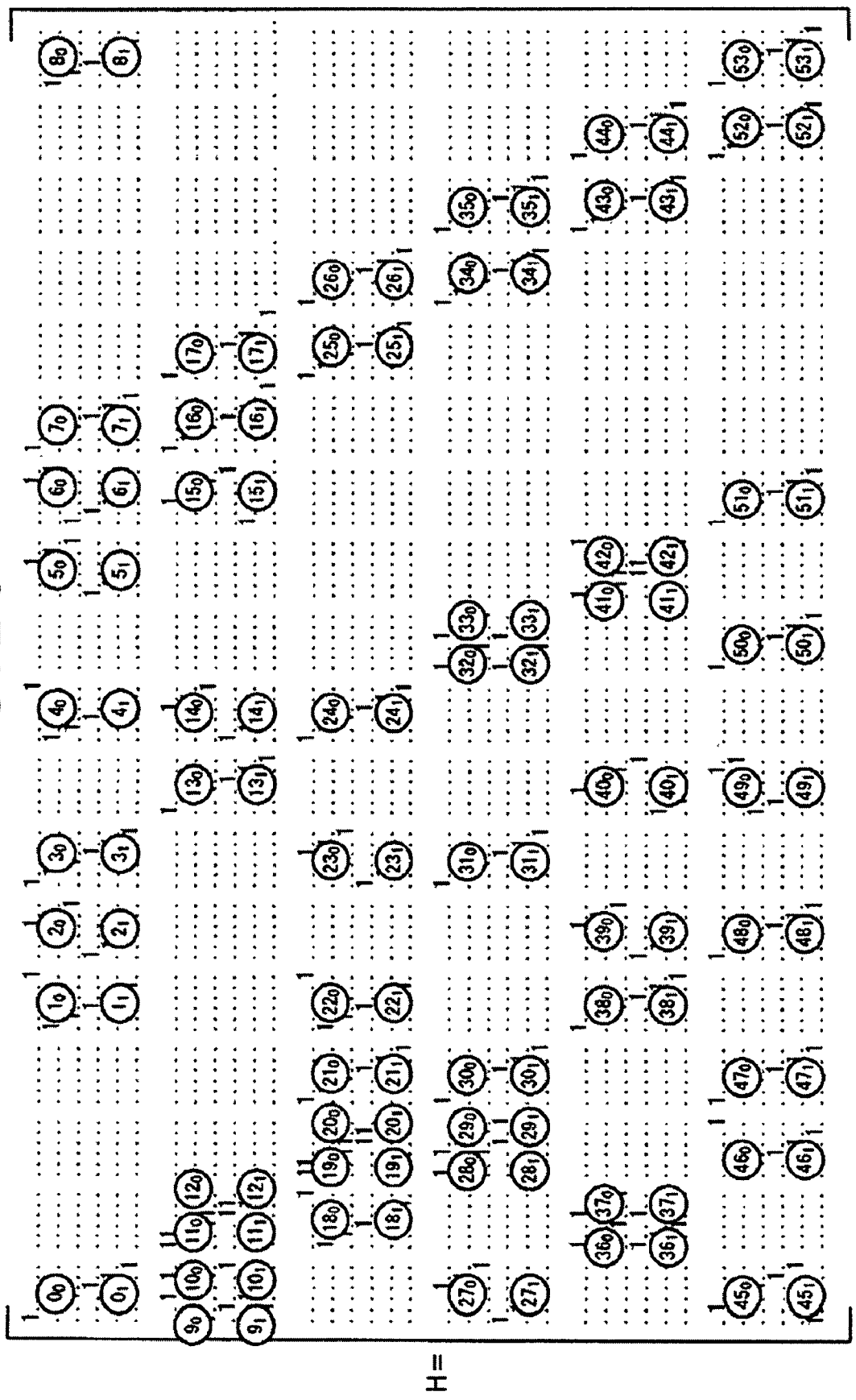
FIG. 26 is a diagram showing position of component matrixes corresponding to a decoding intermediate result.

It is to be noted that, in the timing charts shown in FIG. 25, the horizontal axis represents the lapse of time (t). Notation Rio shown in FIG. 25 denotes an operation to read out data corresponding to a matrix element indicated by the suffix $i_0$ enclosed in a circle in the upper half of a component matrix shown in FIG. 26 to indicate that the matrix element is a matrix element set at "1" and notation $Wi_0$ denotes an operation to write (store) the above-mentioned data. Further, notation $Ri_1$ denotes an operation to read out data corresponding to a matrix element indicated by the suffix ii enclosed in a circle in the lower half of a component matrix shown in FIG. 26 to indicate that the matrix element is a matrix element set at "1" and $Wi_1$ denotes an operation to write the above-mentioned data.

When the computation section 1102 carries out a first computation process, the decoding intermediate result storage memory 1103 carries the following operations. In each of 9 (9 clocks) read operations ($R0_0$ to $R8_0$) on the basis of the control signal D1108$_2$, three decoding intermediate results D1201 (D1205) already stored at an address in the decoding intermediate result storage RAM 1202 are read out from the decoding intermediate result storage RAM 1202 as decoding intermediate results D1201 (D1205), which are then output to the computation section 1102 as decoding intermediate results D1103 by way of the switch 1206. The three decoding intermediate results D1201 (D1205) correspond to matrix elements each set at "1" in the first to third rows of the parity check matrix H. Since the row weight of the parity check matrix H shown in FIG. 16 is 9, the number of decoding intermediate results D1201 each corresponding to a matrix element set at "1" on each row of the parity check matrix H is also 9. The decoding intermediate results D1201 each corresponding to a matrix element set at "1" on the first to third rows of the parity check matrix H is read out from the decoding intermediate result storage RAM 1202 nine consecutive in three unit.

Then, on the basis of the control signal D1108$_3$, in each of 9 consecutive read operations ($R0_1$ to $R8_1$ in the figure), three decoding intermediate results D1202 already stored at an address in the decoding intermediate result storage RAM 1203 are read out from the decoding intermediate result storage RAM 1203, which are then output to the computation section 1102 by way of the switch 1206. The three decoding intermediate results D1202 correspond to matrix elements each set at "1" in the fourth to sixth rows of the parity check matrix H. The three decoding intermediate results D1202 are a part of decoding intermediate results D1202 already stored in the decoding intermediate result storage RAM 1203 as a result of a first computation process carried out previously by the computation section 1102.

In this case, a time period T1 required by the computation section 1102 to complete a first computation process is a period of 12 clocks. That is, the time period T1 is defined as a period from the start of an operation to read out decoding intermediate results D1103 from the decoding intermediate result storage memory 1103 to the start of an operation to supply decoding intermediate results D1102 to the decoding intermediate result storage memory 1103 as a result of a first computation process carried out on the decoding intermediate results D1103.

Thus, as the time period T1 lapses since the first read operation ($R0_0$) to read out decoding intermediate results D1205 from the decoding intermediate result storage RAM 1202, the computation section 1102 starts an operation to supply three decoding intermediate results D1102 corresponding to matrix elements each set at "1" on respectively the first to third rows of the parity check matrix H to the decoding intermediate result storage memory 1103 as a result of the first computation process. In the decoding intermediate result storage memory 1103, the decoding intermediate results D1102 are supplied to the decoding intermediate result storage RAM 1202 by way of the switch 1201 as decoding intermediate results D1201. In the decoding intermediate result storage RAM 1202, the decoding intermediate results D1202 are stored at an address used for storing decoding intermediate results D1205 in nine consecutive write operations (W$0_0$ to W$8_0$) on the basis of the control signal D1108$_2$.

That is to say, a time period Tw corresponding to 3 (=T1−9) clocks is needed. As shown in the figure, the time period Tw is a period from the end of the 9 consecutive read operations (R$0_0$ to R$8_0$) to read out decoding intermediate results D1205 from the decoding intermediate result storage RAM 1202 to the start of the nine consecutive write operations (W$0_0$ to W$8_0$) to store decoding intermediate results D1201 in the decoding intermediate result storage RAM 1202. As a result, as soon as the time period Tw lapses since the end of the nine read operations (R$0_1$ to R$8_1$) to read out data from the decoding intermediate result storage RAM 1203, the nine write operations (W$0_0$ to W$8_0$) to store the data into the decoding intermediate result storage RAM 1202 are completed.

In the decoding intermediate result storage memory 1103, however, decoding intermediate results D1203 associated with matrix elements each set at "1" on the seventh to ninth rows of the parity check matrix H as data to be used in a next first computation process have been stored in the decoding intermediate result storage RAM 1204. Thus, right after the nine read operations (R$0_1$ to R$8_1$) to read out data from the decoding intermediate result storage RAM 1203, nine read operations (R$9_0$ to R$17_0$) to read data from the decoding intermediate result storage RAM 1204 can be carried out.

In addition, after the time period Tw lapses since end of the nine read operations (R$0_1$ to R$8_1$) to read out data from the decoding intermediate result storage RAM 1203, nine write operations (W$0_1$ to W$8_1$) to store decoding intermediate results D1202 in the decoding intermediate result storage RAM 1203 are started.

Then, right after the nine read operations (R$9_0$ to R$17_0$) to read out data from the decoding intermediate result storage RAM 1204, decoding intermediate results D1204 associated with matrix elements each set at 1 on the tenth to twelfth rows of the parity check matrix H as decoding intermediate results to be used in the next first computation process are read out from the decoding intermediate result storage RAM 1205 in nine read operations (R$9_1$ to R$17_1$). In addition, after the time period Tw lapses since the end of the nine read operations (R$9_0$ to R$17_0$) to read out data from the decoding intermediate result storage RAM 1204, nine write operations (W$9_0$ to W$17_0$) to store decoding intermediate results D1203 into the decoding intermediate result storage RAM 1204 are started.

Then, right after the nine read operations (R$9_1$ to R$17_1$) to read out data from the decoding intermediate result storage RAM 1205, decoding intermediate results D1201 associated with matrix elements each set at "1" on the thirteenth to fifteenth rows of the parity check matrix H as decoding intermediate results to be used in the next first computation process are read out from the decoding intermediate result storage RAM 1202 in nine read operations (R$18_0$ to R$26_0$). In addition, after the time period Tw lapses since the end of the nine read operations (R$9_1$ to R$17_1$) to read out data from the decoding intermediate result storage RAM 1205, nine write operations (W$9_1$ to W$17_1$) to store decoding intermediate results D1204 into the decoding intermediate result storage RAM 1205 are started. Then, thereafter, the same operations are repeated.

As described above, in the decoding intermediate result storage memory 1103, the decoding intermediate results D1102 corresponding to matrix elements each set at "1" on 3 rows of the parity check matrix H are stored sequentially in the four decoding intermediate result storage RAMs 1202 to 1205. Thus, even if the computation section 1102 requites the time period T1 to carry out a first computation process, the decoding intermediate results D1103 can be output continuously to the computation section 1102. As a result, the computation section 1102 is capable of carrying out a first computation process continuously.

Figure 27:
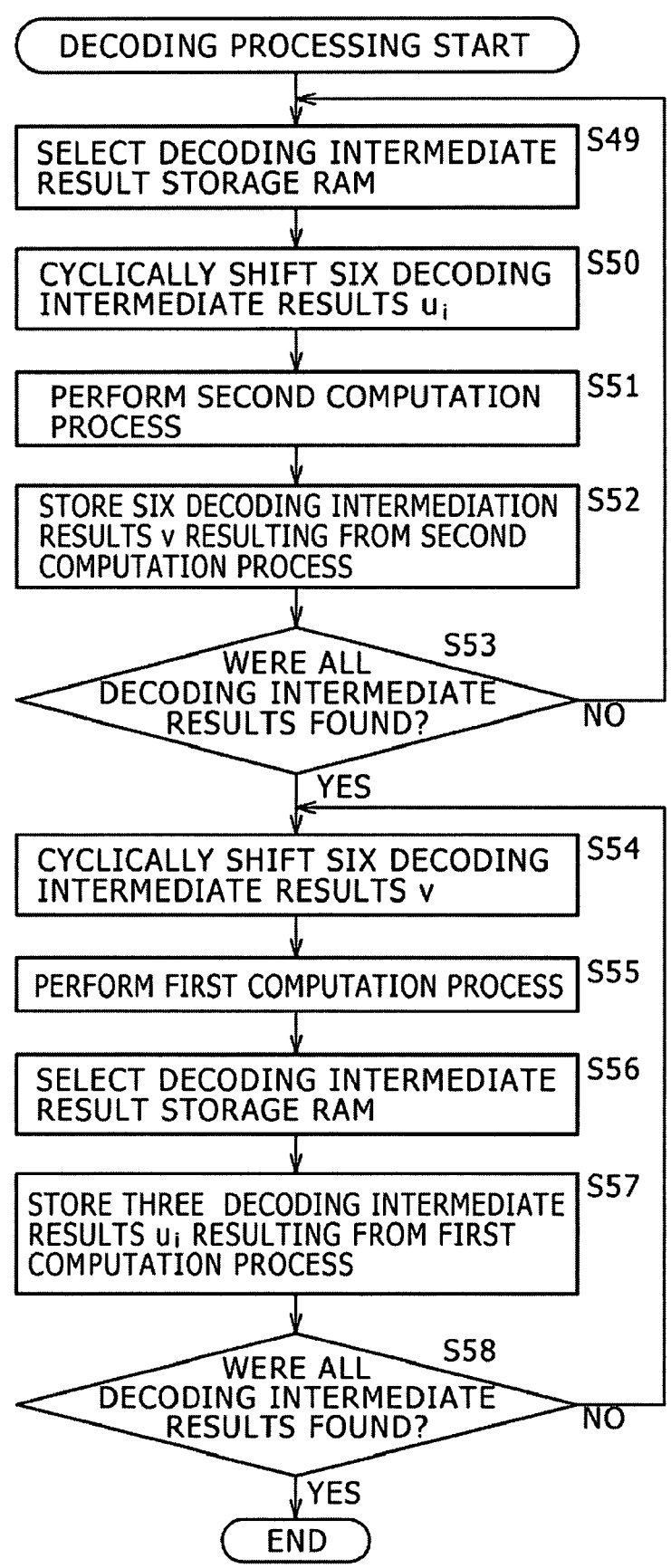
FIG. 27 shows a flowchart representing decoding processing carried out by the decoding apparatus shown in FIG. 23.

FIG. 27 shows a flowchart to be referred to in explanation of decoding processing carried out by the decoding apparatus 1000 shown in FIG. 23. The decoding processing is started typically when received data to be decoded is stored in the reception memory 416.

The flowchart begins with a step S49. At this step, the control section 1105 selects one of the decoding intermediate result storage RAMs 1202 to 1205 as a memory from which data is to be read out. The control section 1105 selects one of the decoding intermediate result storage RAMs 1202 to 1205 by supplying the control signal D1108$_6$ to the switch 1206 (FIG. 24). After the switch 1206 selects the decoding intermediate result storage RAM 1202 to 1205, on the basis the control signal D1108$_6$, decoding intermediate results D1205 to D1208 are read out from the selected one of the decoding intermediate result storage RAMs 1202 to 1205 in three result units and output to the cyclic shift circuit 414 and the computation section 1102 as decoding intermediate results D1103.

After the process of the step S49 is completed, step moves on to a step S50 at which the cyclic shift circuit 414 concatenates the three decoding intermediate results D1103 received from (the switch 1206 employed in) the decoding intermediate result storage memory 1103 as data corresponding to the upper half of a component matrix with the three decoding intermediate results D1103 ($u_j$) also received from the switch 1206 as data corresponding to the lower half of the component matrix, and carries out a cyclical shift operation, then supplying the result of the cyclical shift operation to the computation section 415.

To put it concretely, the cyclic shift circuit 414 receives decoding intermediate results D1103 from the decoding intermediate result storage memory 1103 in three result units and the control signal D421 representing matrix data for the decoding intermediate results 1103 from the control section 1105. Then, on the basis of the control signal D421, the cyclic shift circuit 414 concatenates the three decoding intermediate results D1103 corresponding to the upper half of a component matrix with the three decoding intermediate results D1103 corresponding to the lower half of the component matrix, carries out a cyclical shift operation (sorting) and supplies the result of the cyclical shift operation to the computation section 415 as decoding intermediate results D414.

Then, at the next step S51, the computation section 415 carries out a second computation process and supplies decoding intermediate results D415 obtained as a result of the second computation process to the decoding intermediate result storage memory 1104.

To put it concretely, in the process carried out at the step S50, the computation section 415 receives six decoding intermediate results D414 from the cyclic shift circuit 414 and six received data D417 from the received data memory 416. In the computation section 415, each of the six decoding intermediate results D414 and each of the six received data D417 are supplied to one of the six computers 415$_1$ to 415$_6$. In addition, the computation section 415 also receives the control signal D422 from the control section 1105. In the computation section 415, the control signal D422 is supplied to the six computers $415_1$ to $415_6$.

On the basis of the control signal D422, the six computers $415_1$ to $415_6$ each carry out a second computation process according to Eq. (5) on the 6 decoding intermediate result D414 and the six received data D417, supplying decoding intermediate results D415 (v) corresponding to rows of the parity check matrix H to the decoding intermediate result storage memory 1104 as results of the second computation processes.

It is to be noted that, if no decoding intermediate results D1103 have been stored in the decoding intermediate result storage memory 1103 for the received data D417 received from the reception memory 416 because a first computation process has not been carried out, the computation section 415 sets the decoding intermediate results $u_j$ as initial values for execution of a second computation process.

After the process of the step S51 is completed, the flow of the decoding processing represented by this flowchart goes on to a step S52 at which the decoding intermediate results D415 (v) received from the computation section 415 in the process carried out at the step S51 are stored at a common address in the decoding intermediate result storage memory 1104. Then, the flow of the decoding processing represented by this flowchart goes on to a step S53.

At the step S53, the control section 1105 produces a result of determination as to whether or not the computation section 415 has carried out the computation process on all decoding intermediate results D1104 corresponding to columns of the parity check matrix H. If the determination result produced in the process carries out at the step S53 indicates that the computation section 415 has not carried out the computation process on all decoding intermediate results D1104 corresponding to columns of the parity check matrix H, the flow of the decoding processing represented by this flowchart goes back to the step S49 in order to repeat the processes explained so far.

If the determination result produced in the process carries out at the step S53 indicates that the computation section 415 has carried out the computation process on all decoding intermediate results D1104 corresponding to columns of the parity check matrix H, on the other hand, the flow of the decoding processing represented by this flowchart goes on to a step S54 at which, on the basis of the control signal D1106 received from the control section 1105, the cyclic shift circuit 1101 carries out a cyclic shift operation on the six decoding intermediate results D1104 (v) received from the decoding intermediate result storage memory 1104 and supplies the result of the cyclic shift operation to the computation section 1102 as decoding intermediate results D1101 in three result units.

After the process of the step S54 is completed, the flow of the decoding processing represented by this flowchart goes on to a step S55 at which the computation section 1102 carries out a first computation process and supplies decoding intermediate results D1102 as the result of the first computation process to the decoding intermediate result storage memory 1103.

To put it concretely, the computation section 1102 receives three decoding intermediate results D1101 (v) from the cyclic shift circuit 1101 in the process carried out at the step S54 and three decoding intermediate results D1102 (D1103) ($u_j$) already stored in a process carried out at a step S57 to be described later as a result of a first computation process carried out previously by the computation section 1102. In the computation section 1102, each of the three decoding intermediate results D1101 and D1103 are supplied to one of the three computers $1102_1$ to $1102_3$. In addition, the computation section 1102 also receives the control signal D1107 from the control section 1105. In the computation section 1102, the control signal D1107 is supplied to the three computers $1102_1$ to $1102_3$.

On the basis of the control signal D1107, the three computers $1102_1$ to $1102_3$ each carry out a first computation process according to Eqs. (7) and (8) on the three decoding intermediate result D1101 and D1103, supplying decoding intermediate results D1102 ($u_j$) to the decoding intermediate result storage memory 1103 as results of the first computation processes.

It is to be noted that, if no decoding intermediate results D1103 have been stored in the decoding intermediate result storage memory 1103 for the received data D417 received from the reception memory 416 because a first computation process has not been carried out, the computation section 1102 sets the decoding intermediate results $u_{dv}$ at 0. To put it concretely, for example, before received data D417 is decoded, data stored in the decoding intermediate result storage memory 1103 is initialized to 0 or the computation section 1102 masks an input received from the decoding intermediate result storage memory 1103 to 0.

After the process of the step S55 is completed, the flow of the decoding processing represented by this flowchart goes on to a step S56 at which the control section 1105 selects one of the decoding intermediate result storage RAMs 1202 to 1205 and outputs the control signal $D1108_1$ specifying the selected RAM to the switch 1201 (FIG. 24) employed in the decoding intermediate result storage memory 1103. On the basis of the control signal $D1108_1$, the switch 1201 selects one of the decoding intermediate result storage RAMs 1202 to 1205 each used for storing decoding intermediate results D1102 and stores the decoding intermediate results D1102 to the selected one of the decoding intermediate result storage RAMs 1202 to 1205.

After the process of the step S56 is completed, step moves on to a step S57 at which three decoding intermediate results D1201 to D1204 (D1102) received from the resulting from the switch 1201 in the process carried out at the step S56 are stored at an address in the selected one of the decoding intermediate result storage RAMs 1202 to 1205. Then, the flow of the decoding processing represented by this flowchart goes on to a step S58.

At the step S58, the control section 1105 produces a result of determination as to whether or not the computation section 1102 has carried out the computation process on decoding intermediate results D1102 corresponding to all matrix elements each set at "1" in the parity check matrix H. If the determination result produced in the process carries out at the step S58 indicates that the computation section 1102 has not carried out the computation process on decoding intermediate results D1102 corresponding to all matrix elements each set at "1" in the parity check matrix H, the flow of the decoding processing represented by this flowchart goes back to the step S54 in order to repeat the processes explained so far.

If the determination result produced in the process carries out at the step S57 indicates that the computation section 1102 has carried out the computation process on decoding intermediate results D1102 corresponding to all matrix elements each set at "1" in the parity check matrix H, on the other hand, the control section 1105 ends the execution of the decoding processing represented by this flowchart.

It is to be noted that the decoding apparatus 1000 carries out the decoding processing represented by the flowchart shown in FIG. 27 repeatedly, and outputs a message D1104 resulting from the last second computation process as the eventual decoding result.

In the decoding apparatus 1000 described above by referring to FIG. 23, the computation section 1102 employs the three computers $1102_1$ to $1102_3$. However, it is also possible to provide a configuration in which, instead of such a computation section 1102, it is the computation section 415 that employs three computers $415_1$ to $415_3$. In such a configuration, each second computation process is carried out on three decoding intermediate results and the decoding intermediate result storage memory 1104 is provided with three or more decoding intermediate result storage memory. It is also possible to provide a configuration in which the computation section 1102 employs the three computers $1102_1$ to $1102_3$ whereas the computation section 415 employs three computers $415_1$ to $415_3$.

As described above, in the decoding apparatus 1000 described above by referring to FIG. 23, the decoding intermediate result storage memory 1103 employs four decoding intermediate result storage RAMs 1202 to 1205 and the computation section 1102 carries out each first computation process on three decoding intermediate results. Thus, the scale of the circuit can be reduced without lowering the operating frequency.

In the conventional decoding apparatus 400 employing six computers $412_1$ to $412_6$ for example, the number of clocks required by each of the computers $412_1$ to to execute a first computation process is 72. In the decoding apparatus 1000 employing computers $1102_1$ to $1102_3$, on the other hand, the number of clocks required by each of the computers $1102_1$ to $1102_3$ to execute a first computation process is 117, which is 1.6 times the number of clocks required by the decoding apparatus 400. That is to say, even though the number of aforementioned computers $1102_1$ to $1102_3$ is half the number of aforementioned computers $412_1$ to $412_6$, the number of clocks required by the decoding apparatus 1000 is smaller than two times the number of clocks required by the decoding apparatus 400.

In addition, since the number of clocks required by the computers $415_1$ to $415_6$ to carry out a second computation process is 59, the time it takes to carry out one decoding process is 131 (=72+59) in the case of the decoding apparatus 400 and 176 (=117+59) in the case of the decoding apparatus 1000. That is to say, the length of time it takes to carry out a decoding process in the decoding apparatus 1000 is about 1.3 times the length of time it takes to carry out a decoding process in the decoding apparatus 400. In other words, the operating frequency of the decoding apparatus 1000 is about 1.3 times the operating frequency of the decoding apparatus 400.

In addition, if the number of clocks required to carry out a first computation process is small, the ratio of the length of time it takes to carry out a decoding process in the decoding apparatus 400 to the length of time it takes to carry out a decoding process in the decoding apparatus 1000 decreases. If the numbers of matrix elements each set at "1" on each row of the parity check matrix H is 4 for example, the ratio of the length of time it takes to carry out a decoding process in the decoding apparatus 400 to the length of time it takes to carry out a decoding process in the decoding apparatus 1000 is 37/52, that is, the length of time it takes to carry out a decoding process in the decoding apparatus 1000 is about 1.4 times the length of time it takes to carry out a decoding process in the decoding apparatus 1000.

Figure 28:
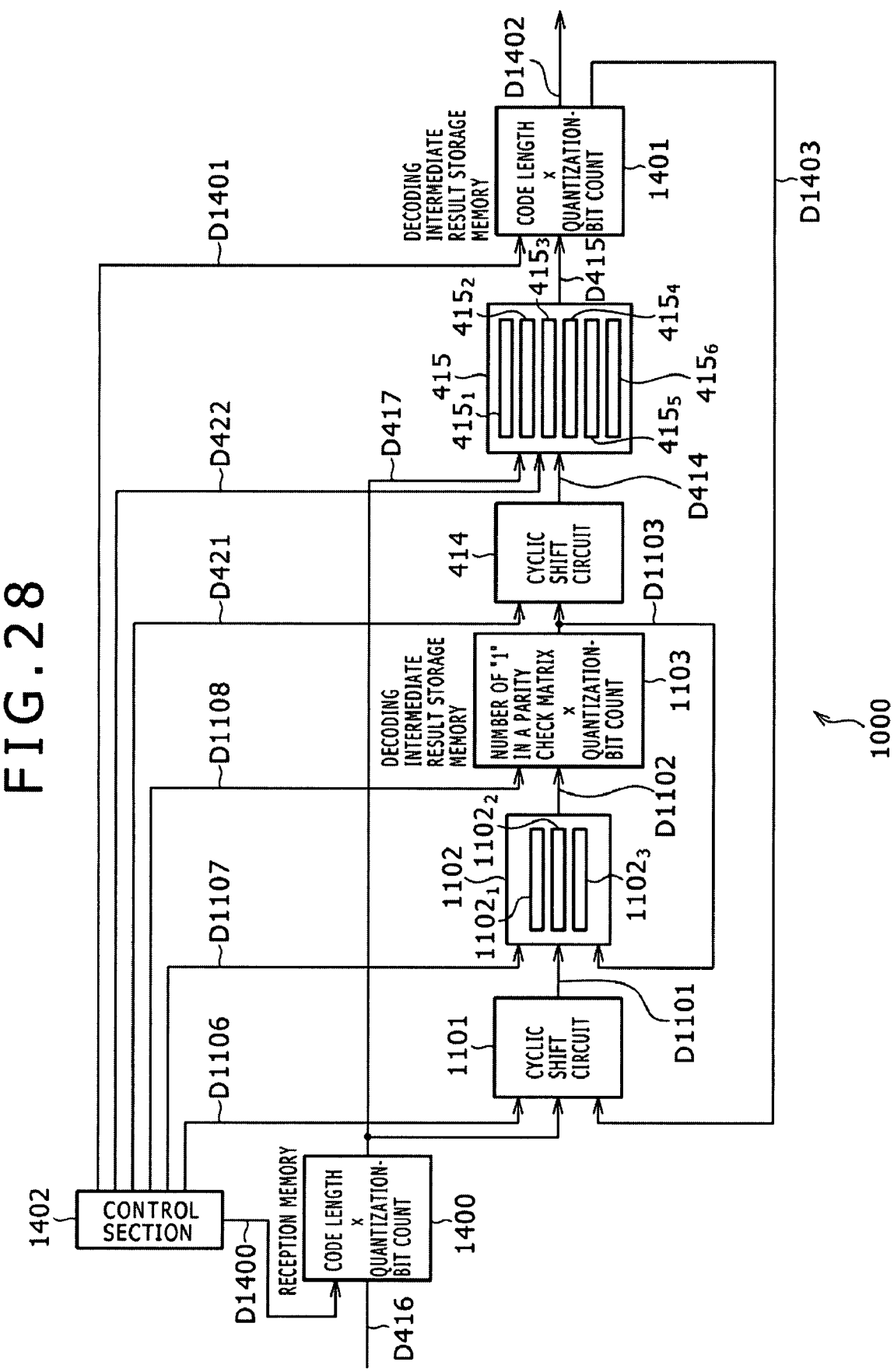
FIG. 28 is a block diagram showing a typical configuration of a decoding apparatus according to a second embodiment of the present invention.

FIG. 28 is a block diagram showing a typical configuration of a decoding apparatus 1000 according to a second embodiment of the present invention.

The decoding apparatus 1000 shown in FIG. 28 employs a reception memory 1400 as a substitute for the reception memory 416 employed in the decoding apparatus 1000 shown in FIG. 23, a decoding intermediate result storage memory 1401 as a substitute for the decoding intermediate result storage memory 1104 and a control section 1402 as a substitute for the control section 1105. The reception memory 1400 receives a control signal D1400 from the control section 1402 as a signal for selecting one of received-data storage memories 1502 and 1503 (described later by referring to FIG. 29). The decoding intermediate result storage memory 1401 receives a control signal D1401 from the control section 1402 as a signal for selecting one of decoding intermediate result storage memories 1602 and 1603 (described later by referring to FIG. 30).

Figure 29:
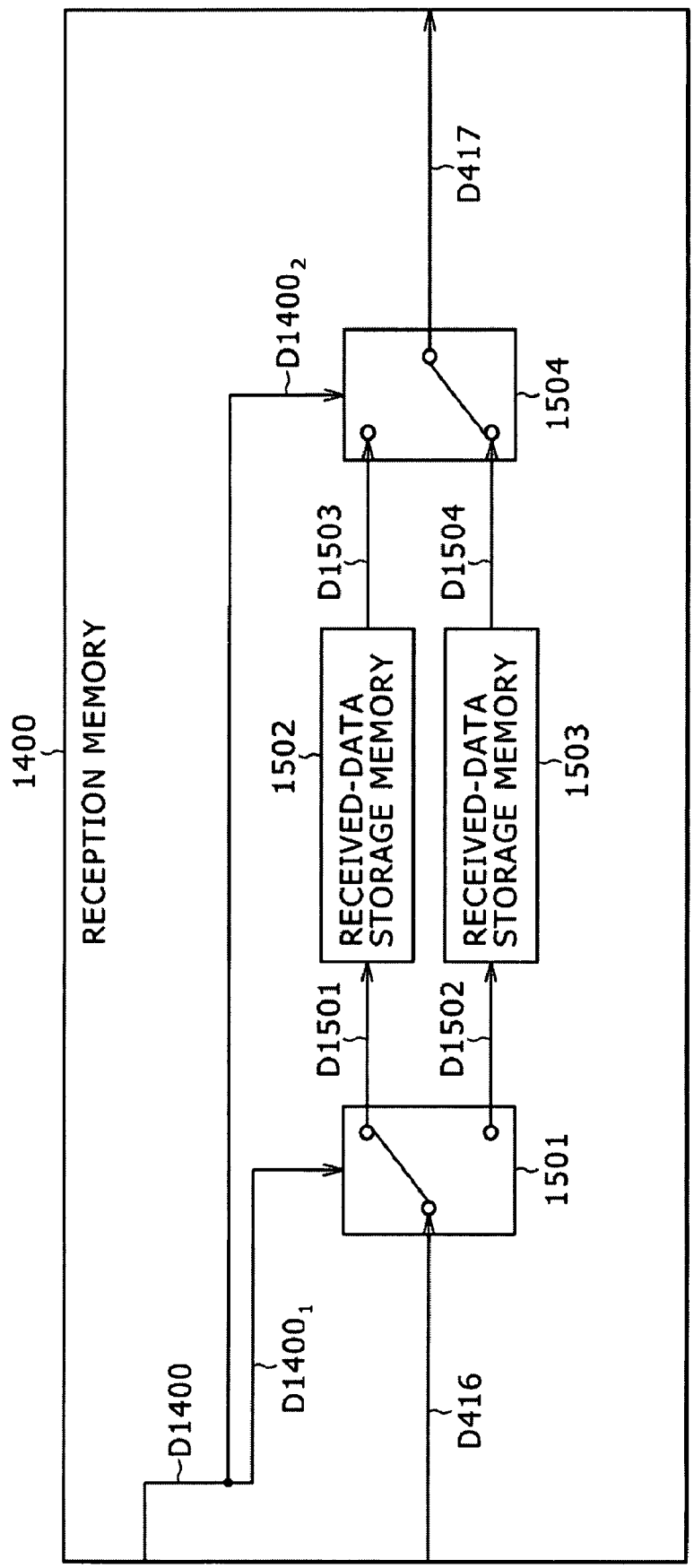
FIG. 29 is a block diagram showing a typical configuration of a reception memory shown in FIG. 28.

FIG. 29 is a block diagram showing a typical configuration of the reception memory 1400 shown in FIG. 28.

As shown in FIG. 29, the reception memory 1400 employs switches 1501 and 1504 as well as received-data storage memories 1502 and 1503.

The switch 1501 receives data D416 (received data) representing an LLR (Log Likelihood Ratio), which is defined as the value of the 0 likelihood of a sign bit computed from received values (or sign bits) received from a communication line. In addition, the switch 1501 also receives a control signal $D1400_1$ from the control section 1105 as a signal for selecting the received-data storage memory 1502 or 1503. On the basis of the control signal $D1400_1$, the switch 1501 supplies the received data D416 to the received-data storage memory 1502 as received data D1501 or to the received-data storage memory 1503 as received data D1502.

The received-data storage memory 1502 is used for storing received data D1501 received from the switch 1501. In addition, received data D1501 already stored in the received-data storage memory 1502 is read out from the received-data storage memory 1502 and supplied to the switch 1504 as received data D1503.

On the other hand, in a way similar to the received-data storage memory 1502, the received-data storage memory 1503 is used for storing received data D1502 received from the switch 1501. In addition, received data D1504 already stored in the received-data storage memory 1503 is read out from the received-data storage memory 1503 and supplied to the switch 1504.

It is to be noted that the storage capacity of each of the received-data storage memories 1502 and 1503, that is, the required amount of data that is to be stored in each of the received-data storage memories 1502 and 1503, is equal to the multiplication of the code length of LDPC codes and the quantization-bit count of the received data.

The switch 1504 receives a control signal $D1400_2$ as a signal for selecting the received-data storage memory 1502 or 1503. On the basis of the control signal $D1400_2$, the switch 1504 selects the received data D1503 read out from the received-data storage memory 1502 or the received data D1504 read out from the received-data storage memory 1503 and supplies the received data D1503 or the received data D1504 to the cyclic shift circuit 1101 and the computation section 415 as received data D417.

It is to be noted that, if the control signal $D1400_1$ selects the received-data storage memory 1502, the control signal $D1400_2$ selects the received-data storage memory 1503 or vice versa. That is to say, if received data D1501 is being stored in the received-data storage memory 1502, received data D1504 is read out from the received-data storage memory 1503. If received data D1502 is being stored in the received-data storage memory 1503, on the other hand, received data D1503 is read out from the received-data storage memory 1502.

As described above, the reception memory 1400 employs the two received-data storage memories 1502 and 1503. Thus, while received-data D416 is being stored into one of the two received-data storage memories 1502 and 1503, received data already stored in the other one of the two received-data storage memories 1502 and 1503 can be read out from the other one of the two received-data storage memories 1502 and 1503 as received data D417. As a result, the reception memory 1400 is capable of continuously outputting received data D416, which is input continuously, as received data D417.

Figure 30:
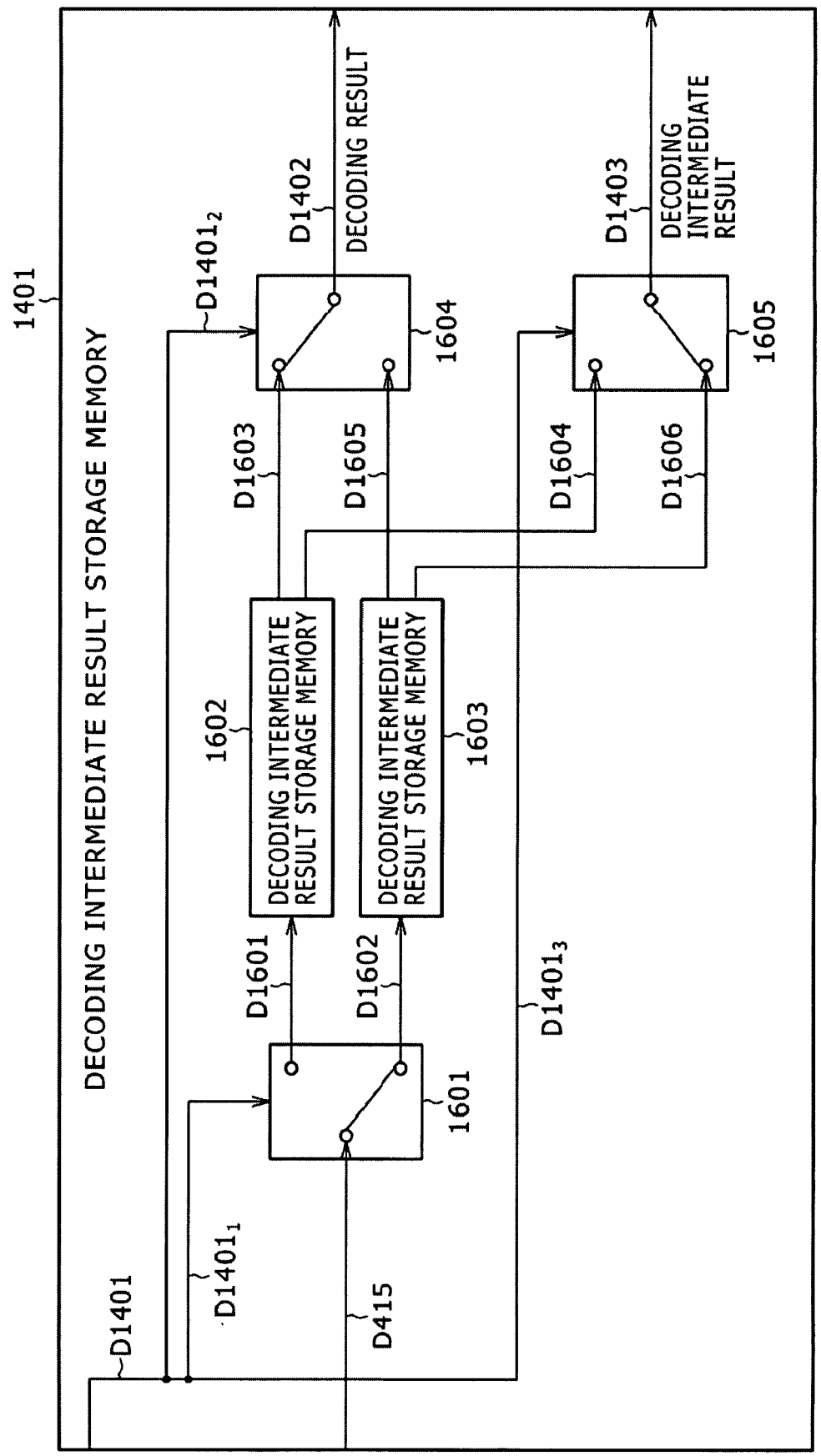
FIG. 30 is a block diagram showing a typical configuration of a decoding intermediate result storage memory shown in FIG. 28.

Next, the configuration of the decoding intermediate result storage memory circuit 1401 shown in FIG. 28 is explained in detail by referring to FIG. 30.

As shown in FIG. 30, the decoding intermediate result storage memory circuit 1401 employs switches 1601, 1604 and 1605 as well as decoding intermediate result storage memories 1602 and 1603.

The switch 1601 receives 3 decoding intermediate results D415 from the computation section 415 and a control signal $D1401_1$ from the control section 1105 as a signal for selecting one of the decoding intermediate result storage memories 1602 and 1603. On the basis of the control signal $D1401_1$, the switch 1601 selects one of the decoding intermediate result storage memories 1602 and 1603 and supplies the decoding intermediate results D415 to the decoding intermediate result storage memory 1602 as decoding intermediate results D1601 or to the decoding intermediate result storage memory 1603 as decoding intermediate results D1602.

The decoding intermediate result storage memory 1602 is used for storing the decoding intermediate results D1601 received from the switch 1601. In addition, decoding intermediate results D1601 already stored in the decoding intermediate result storage memory 1602 are read out from the decoding intermediate result storage memory 1602 and supplied to the switch 1604 as decoding intermediate results D1603 and to the switch 1605 as decoding intermediate results D1604. In the same way as the decoding intermediate result storage memory 1602, the decoding intermediate result storage memory 1603 is used for storing the decoding intermediate results D1602 received from the switch 1601. In addition, decoding intermediate results D1602 already stored are read out from the decoding intermediate result storage memory 1602 and supplied to the switch 1604 as decoding intermediate results D1605 and to the switch 1605 as decoding intermediate results D1606.

It is to be noted that the storage capacity of each of the decoding intermediate result storage memories 1602 and 1603, that is, the amount of data that can be stored in each of the decoding intermediate result storage memories 1602 and 1603, is equal to the product of the code length of LDPC codes for the decoding intermediate result D415 and the quantization-bit count of the decoding intermediate result D415.

The switch 1604 receives a control signal $D1401_2$ from the control section 1105 as a signal for selecting one of the decoding intermediate result storage memories 1602 and 1603. On the basis of the control signal D14012, the switch 1604 selects the decoding intermediate results D1603 read out from the decoding intermediate result storage memory 1602 or the decoding intermediate results D1605 read out from the decoding intermediate result storage memory 1603 and outputs the decoding intermediate results D1603 or the decoding intermediate results D1605 as a decoding result (or a soft determination value) D1402.

By the same token, the switch 1605 receives a control signal $D1401_3$ from the control section 1105 as a signal for selecting one of the decoding intermediate result storage memories 1602 and 1603. On the basis of the control signal $D1401_3$, the switch 1605 selects the decoding intermediate results D1604 read out from the decoding intermediate result storage memory 1602 or the decoding intermediate results D1606 read out from the decoding intermediate result storage memory 1603 and outputs the decoding intermediate results D1604 or the decoding intermediate results D1606 as a decoding intermediate result D1403 to the cyclic shift circuit 1101.

It is to be noted that, if the control signal $D1401_2$ selects the decoding intermediate result storage memory 1602, the control signal $D1401_3$ selects the decoding intermediate result storage memory 1603 or vice versa. That is to say, if decoding intermediate results D1603 are being read out from the decoding intermediate result storage memory 1602 and output as a decoding result D1402, decoding intermediate results D1606 are read out from the decoding intermediate result storage memory 1603 and output as a decoding intermediate result D1403. If decoding intermediate results D1605 are being read out from the decoding intermediate result storage memory 1602 and output as a decoding result D1402, on the other hand, decoding intermediate results D1604 are read out from the decoding intermediate result storage memory 1603 and output as a decoding intermediate result D1403.

As described above, the decoding intermediate result storage memory 1401 employs the two decoding intermediate result storage memories 1602 and 1603. Thus, decoding intermediate results D1601 or D1602 being decoded can be written into one of the two decoding intermediate result storage memories 1602 and 1603 whereas decoding intermediate results D1601 or D1602 completing a decoding process can be stored in the other one the two decoding intermediate result storage memories 1602 and 1603. As a result, a decoding process can be carried out while the decoding intermediate result storage memory 1401 is outputting a decoding result D1402. Therefore, the decoding intermediate result storage memory 1401 is capable of outputting the decoding result D1402 continuously.

Figure 31:
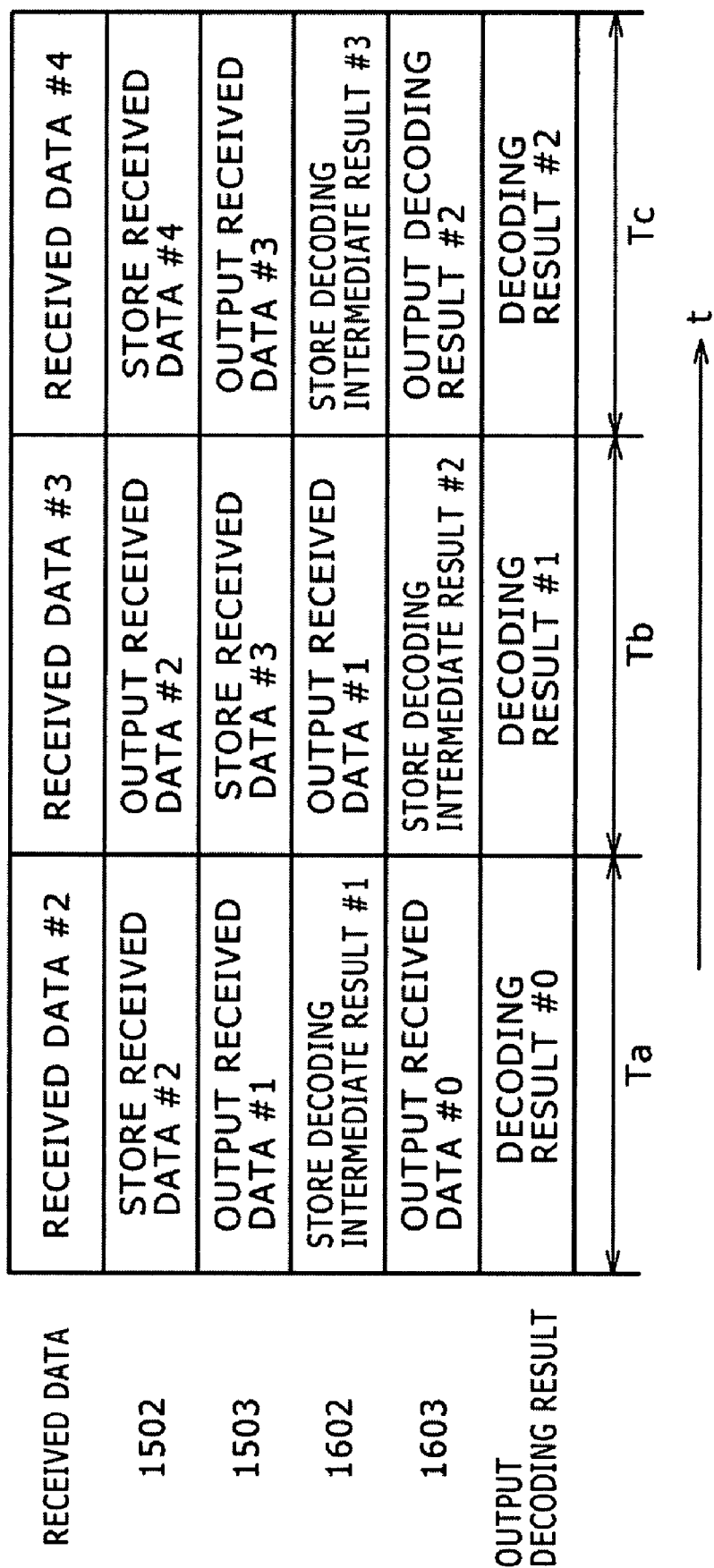
FIG. 31 shows timing charts to be referred to in explanation of operations of a reception memory and a decoding intermediate result storage memory.

FIG. 31 shows timing charts referred to in explanation of operations to read out (or output) data from the reception memory 1400 and the decoding intermediate result storage memory 1401 and write (or store) data into the reception memory 1400 and the decoding intermediate result storage memory 1401.

It is to be noted that, in the timing charts shown in FIG. 31, the horizontal axis represents the lapse of time (t). In addition, received data #i shown in the timing charts of FIG. 31 is received data D416 of an ith frame supplied by the reception memory 1400. In addition, in the timing charts shown in FIG. 31, decoding intermediate result #i is a decoding intermediate result D1403 of received data #i whereas decoding result #i is a decoding result D1402 of received data #i. In the timing charts shown in FIG. 31, in a time period between the start of an operation to receive received data #i and the end of an operation to decode received data #i, a process to decode a piece of received data is completed.

When received data #2 is supplied to the reception memory 1400, during a time period Ta required for inputting all received data #2, received data #2 is supplied to the received-data storage memory 1502 by way of the switch 1501 to be stored. At that time, received data #2 already stored in the received-data storage memory 1503 is supplied to the switch 1504 to be outputted to the cyclic shift circuit 1101 and the computation section 415. Then, received data #1 is decoded.

In addition, the computation section 415 supplies decoding intermediate results #1 to the decoding intermediate result storage memory 1602 employed in the decoding intermediate result storage memory circuit 1401 to be stored in the decoding intermediate result storage memory 1602. On top of that, decoding intermediate results #1 already stored in the decoding intermediate result storage memory 1602 are supplied to the cyclic shift circuit 1101. In addition, decoding intermediate results #0 already stored in the decoding intermediate result storage memory 1603 are outputted to the switch 1604 as decoding result #0. That is to say, during the time period Ta, the decoding intermediate result storage memory circuit 1401 outputs decoding intermediate results #0.

After the lapse of the time period Ta, received data #3 is inputted to the received-data storage memory circuit 1400 and, during a time period Tb required for inputting all received data #3, received data #3 is supplied to the received-data storage memory 1503 by way of the switch 1501 to be stored in the received-data storage memory 1503. At that time, received data #2 already stored during the time period Ta is read out from the received-data storage memory 1502, being supplied to the cyclic shift circuit 1101 and the computation section 415 by way of the switch 1504. Then, received data #2 is decoded.

In addition, the decoding intermediate result storage memory 1602 outputs decoding intermediate results #1 stored in the decoding intermediate result storage memory 1602 during the time period Ta as decoding result #1. That is to say, during the time period Tb following the time period Ta, the decoding intermediate result storage memory 1602 outputs decoding intermediate results #1 from the decoding intermediate result storage memory 1401 during the time period Ta as decoding result #1. The computation section 415 supplies decoding intermediate results #2 to the decoding intermediate result storage memory 1603 by way of the switch 1601 to be stored in the decoding intermediate result storage memory 1603. On top of that, decoding intermediate results #2 already stored are supplied from the decoding intermediate result storage memory 1603 to the cyclic shift circuit 1101.

After the lapse of the time period Tb, received data #4 is inputted to the reception memory 1400 and, during a time period Tc required for inputting all received data #4, the same processing as that of the time period Ta is carried out. That is to say, during the time period Tc following the time period Tb, received data #3 is supplied to the cyclic shift circuit 1101 and the computation section 415, which then decodes received data #3. On top of that, decoding intermediate results #2 already stored in the decoding intermediate result storage memory 1603 during the time period Tb are outputted as decoding result #2.

As described above, in the decoding apparatus 1000 shown in FIG. 28, consecutively input pieces of received data D417 can be sequentially decoded and output continuously as a decoding result. Thus, the decoding process can be carried out at a high speed. That is to say, the throughput of the decoding apparatus 1000 can be increased.

It is to be noted that each of the number of received-data storage memories 1502 (1503) employed in the reception memory 1400 shown in FIG. 29 and the number of decoding intermediate result storage memories 1602 (1603) employed in the decoding intermediate result storage memory circuit 1401 shown in FIG. 30 is by no means limited to 2. By increasing each of the number of received-data storage memories 1502 and decoding intermediate result storage memories 1602, it is possible to increase the number of times of decoding can be carried out so that the decoding performance can be improved.

If each of the number of received-data storage memories 1502 and decoding intermediate result storage memories 1602 is increased to three for example, one of the received-data storage memories 1502 can be used for storing received data D417 and one of the decoding intermediate result storage memories 1602 can be used for storing a decoding result D1402. Then, the remaining two received-data storage memories 1502 and the remaining two decoding intermediate result storage memories 1602 can be used for carrying out a decoding process. In such a configuration, two computation sections 415 and two computation sections 1102 are required, entailing an increased circuit scale. However, it is possible to double the number of times of decoding can be carried out.

Figure 32:
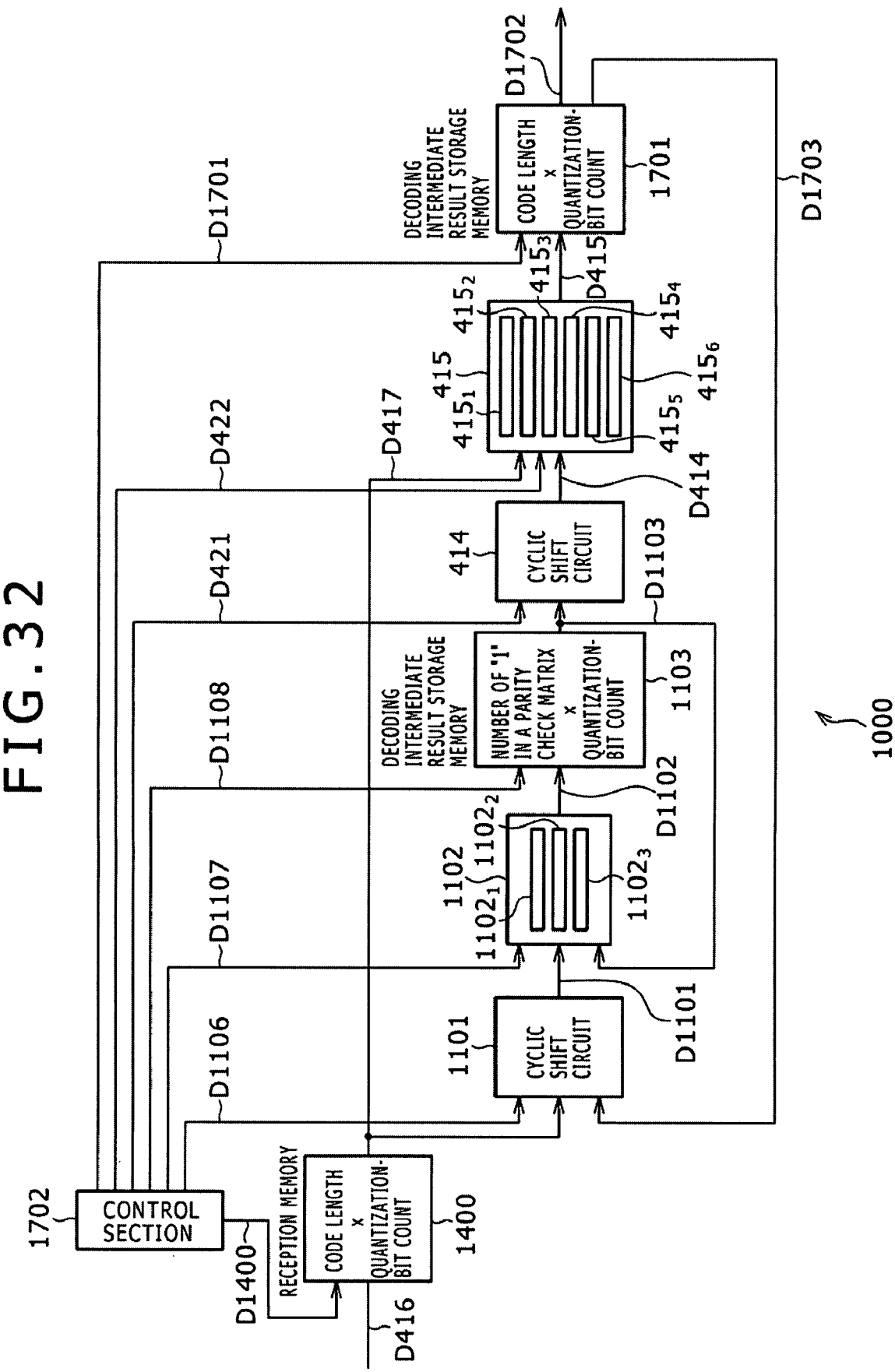
FIG. 32 is a block diagram showing a typical configuration of a decoding apparatus according to a third embodiment of the present invention.

FIG. 32 is a block diagram showing a typical configuration of a decoding apparatus 1000 according to a third embodiment of the present invention.

The decoding apparatus 1000 shown in FIG. 32 employs a decoding intermediate result storage memory 1701 as a substitute for the decoding intermediate result storage memory 1401 employed in the decoding apparatus 1000 shown in FIG. 28 and a control section 1799 as a substitute for the control section 1402 shown in FIG. 28. The decoding intermediate result storage memory 1701 receives a control signal D1701 as a signal for selecting one of decoding hard determination result storage memories 1802 and 1803 employed in the decoding intermediate result storage memory 1701 (as will be described later by referring to FIG. 33). The decoding intermediate result storage memory 1701 outputs a hard determination value of a decoding intermediate result D415 resulting from a decoding process as a decoding result D1702 and a soft determination value of a decoding intermediate result D415 being decoded as a decoding intermediate result D1703.

Figure 33:
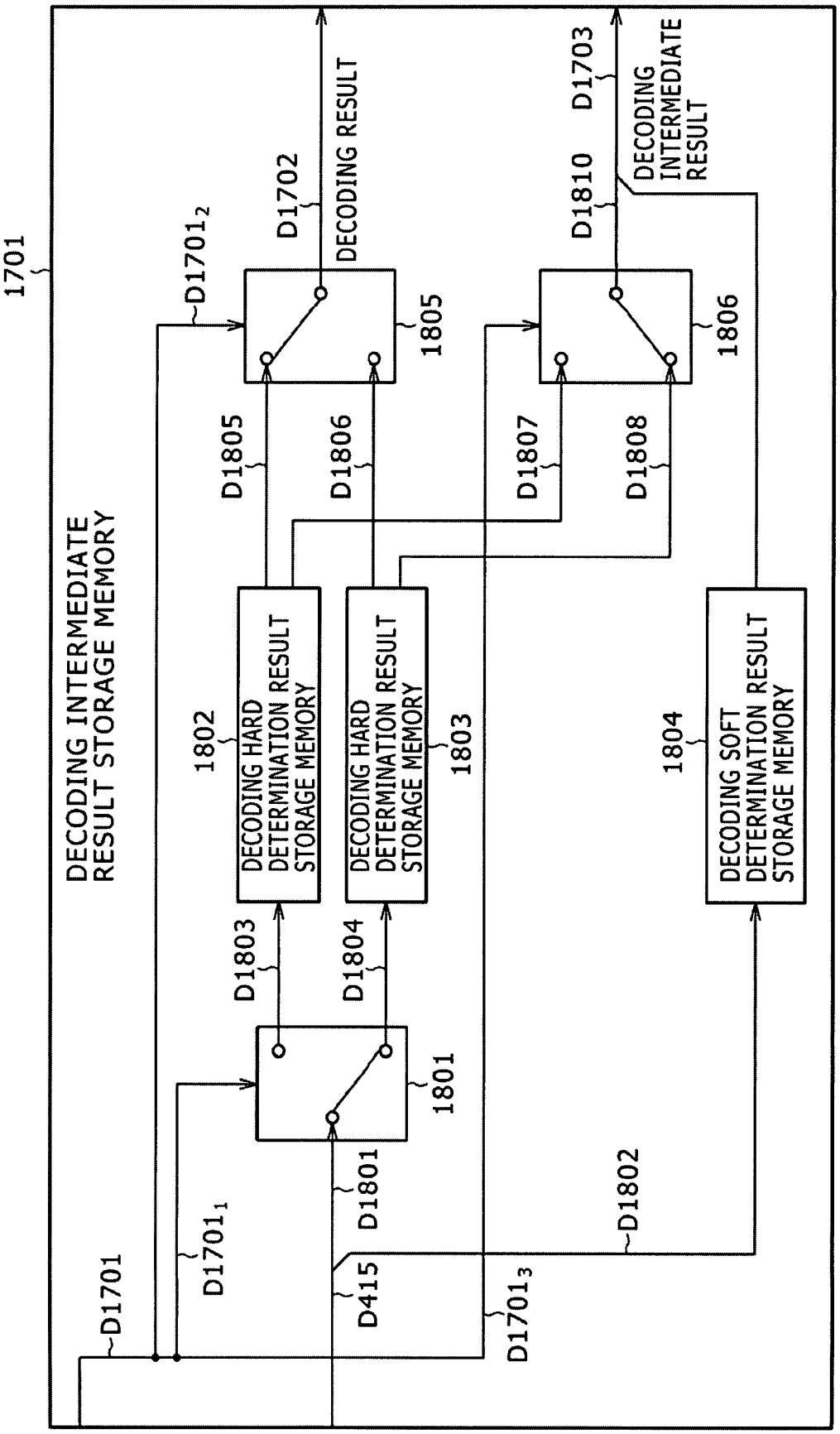
FIG. 33 is a block diagram showing a typical configuration of a decoding intermediate result storage memory shown in FIG. 32.

FIG. 33 is a block diagram showing a typical configuration of the decoding intermediate result storage memory 1701 shown in FIG. 32.

As shown in FIG. 32, the decoding intermediate result storage memory 1701 employs switches 1801, 1805 and 1806, decoding hard determination result storage memories 1802 and 1803 as well as a decoding soft determination result storage memory 1804.

The switch 1801 receives hard determination values of three decoding intermediate results D415 from the computation section 415 as decoding hard determination results D1801 and a control signal D1701$_1$ from the control section 1702 as a signal for selecting one of the decoding hard determination result storage memories 1801 and 1802. On the basis of control signal D1701$_1$, the switch 1801 supplies the decoding hard determination results D1801 to the decoding hard determination result storage memory 1802 as decoding hard determination results D1803 or to the decoding hard determination result storage memory 1803 as decoding hard determination results D1804.

The decoding hard determination result storage memory 1802 is used for storing the decoding intermediate results D1803 received from the switch 1801. In addition, decoding intermediate results D1803 already stored in the decoding hard determination result storage memory 1802 are read out from the decoding hard determination result storage memory 1802 and supplied to the switch 1805 as decoding intermediate results D1805 and to the switch 1806 as decoding intermediate results D1807.

In the same way as the decoding hard determination result storage memory 1802, the decoding hard determination result storage memory 1803 is used for storing the decoding intermediate results D1804 received from the switch 1801. In addition, decoding intermediate results D1804 already stored in the decoding hard determination result storage memory 1803 are read out from the decoding hard determination result storage memory 1803 and supplied to the switch 1805 as decoding intermediate results D1806 and to the switch 1806 as decoding intermediate results D1808.

It is to be noted that the storage capacity of each of the decoding intermediate result storage memories 1802 and 1803, that is, the maximum amount of data that can be stored in each of the decoding intermediate result storage memories 1802 and 1803, is equal to the product of the code length of LDPC codes for the decoding intermediate result D415 and the number of bits in the hard determination value of the decoding intermediate result D415. In this case, the number of bits is 1.

The decoding soft determination result storage memory 1804 receives soft determination values excluding the most significant bits of three decoding intermediate results D415 received from the computation section 415 as decoding soft determination results D1802. The decoding soft determination result storage memory 1804 is used for storing the decoding soft determination results D1802. In addition, decoding soft determination results D1802 already stored in the decoding soft determination result storage memory 1804 are outputted as decoding soft determination results D1811.

It is to be noted that the storage capacity of the 1804, that is, the amount of data that can be stored in the decoding soft determination result storage memory 1804, is equal to the product of the code length of LDPC codes and the number of bits (the quantization-bit count of the decoding intermediate result D415-1) in the soft determination value excluding the most significant bit.

The switch 1805 receives a control signal D1701$_2$ from the control section 1702 as a signal for selecting one of the decoding hard determination result storage memories 1802 and 1803. On the basis of the control signal D1701$_2$, the switch 1805 selects the decoding hard determination results D1805 read out from the decoding hard determination result storage memory 1802 or the decoding hard determination results D1806 read out from the decoding hard determination result storage memory 1803 and outputs as a decoding result (or a hard determination value) D1702.

By the same token, the switch 1806 receives a control signal D1701$_3$ from the control section 1702 as a signal for selecting one of the decoding hard determination result storage memories 1802 and 1803. On the basis of the control signal D1701$_3$, the switch 1805 selects the decoding hard determination results D1807 read out from the decoding hard determination result storage memory 1802 or the decoding hard determination results D1808 read out from the decoding hard determination result storage memory 1803 and outputs as a decoding hard determination result D1810. The decoding hard determination result D1810 output by the switch 1806 is concatenated with the decoding soft determination result D1811 output by the decoding soft determination result storage memory 1804 to generate a decoding intermediate result D1703 including the decoding hard determination result D1810 as the 1 most significant and the decoding soft determination result D1811 as less significant bits. The decoding intermediate result D1703 is supplied to the cyclic shift circuit 1101.

It is to be noted that, if the control signal D1701$_2$ selects the decoding intermediate result storage memory 1802, the control signal D1701$_3$ selects the decoding intermediate result storage memory 1803 or vice versa. That is to say, if decoding intermediate results D1805 are being read out from the decoding hard determination result storage memory 1802 and output as a decoding result D1702 completing a decoding process, decoding intermediate results D1808 are read out from the decoding hard determination result storage memory 1803 and output as a decoding hard determination result D1810. If decoding intermediate results D1806 are being read out from the decoding hard determination result storage memory 1803 and output as the decoding result D1702 completing a decoding process, on the other hand, decoding intermediate results D1807 are read out from the decoding hard determination result storage memory 1802 and output as the decoding hard determination result D1810.

As described above, the decoding intermediate result storage memory 1701 employs the two decoding intermediate result storage memories 1802 and 1803 used for storing the hard determination value of the decoding intermediate result D415 as well as the decoding soft determination result storage memory 1804 for storing the soft determination value of the decoding intermediate result D415. The soft determination value is a value obtained by excluding the most significant bit from the decoding intermediate result D415. Thus, the decoding intermediate result storage memory 1701 merely needs a storage capacity equal to the sum of twice a product obtained as a result of an operation to multiply the code length of the LDPC codes by 1 bit and a product obtained as a result of an operation to multiply the code length of the LDPC codes by (the quantization-bit count of the decoding intermediate results D415-1).

Thus, the circuit scale of the decoding apparatus 1000 shown in FIG. 32 as an apparatus employing the decoding intermediate result storage memory 1701 can be made small in comparison with the decoding apparatus shown in FIG. 28 as an apparatus employing the decoding intermediate result storage memory circuit 1401 having a storage capacity equal to twice a product obtained as a result of an operation to multiply the code length of the LDPC codes by the quantization-bit count of the decoding intermediate result D415.

Figure 34:
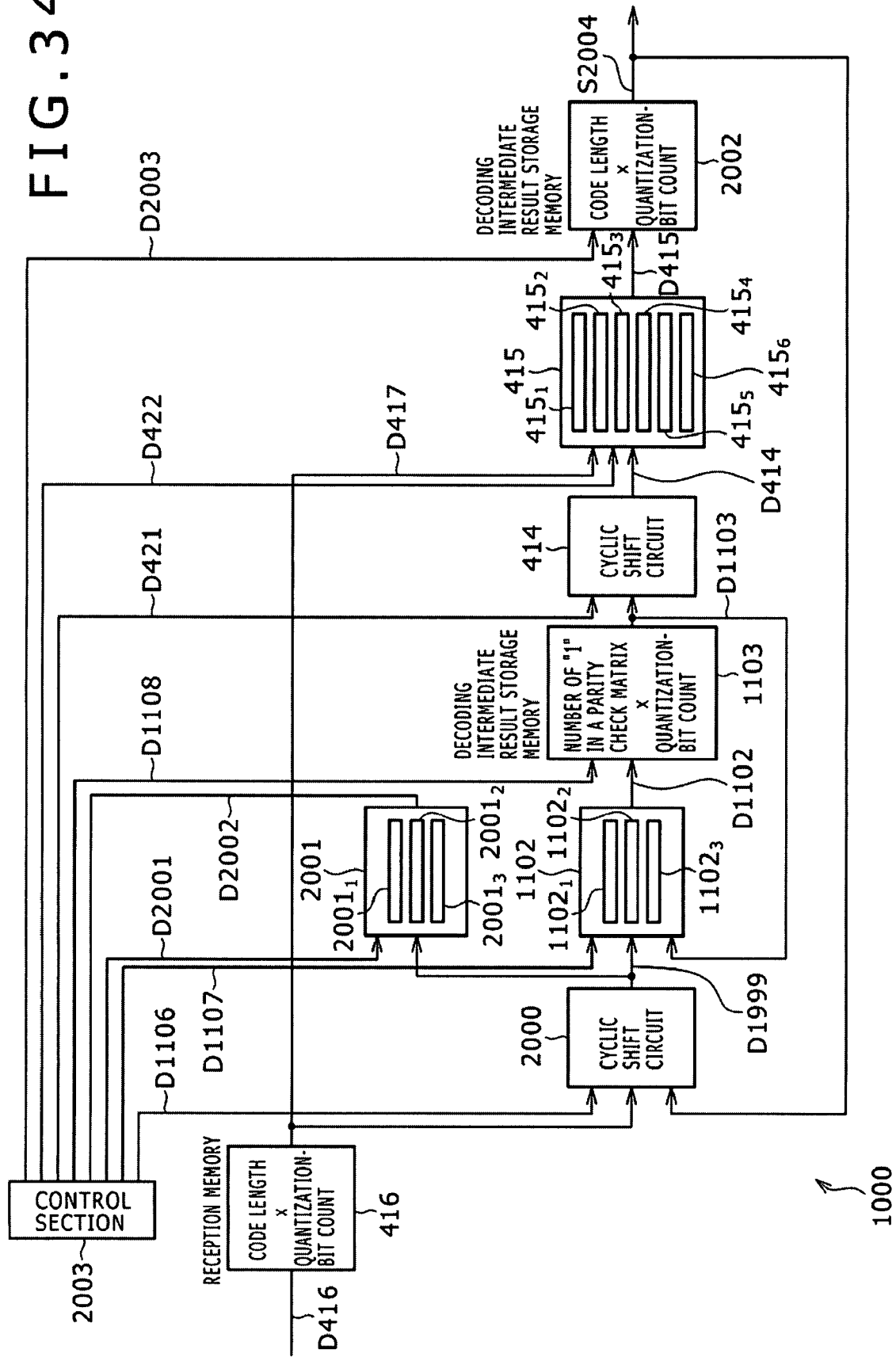
FIG. 34 is a block diagram showing a typical configuration of a decoding apparatus according to a fourth embodiment of the present invention.

FIG. 34 is a block diagram showing a typical configuration of a decoding apparatus 1000 according to a fourth embodiment of the present invention.

The decoding apparatus 1000 shown in FIG. 34 employs a syndrome determination section 2001 having three syndrome determiners 2001$_1$ to 2001$_3$. The syndrome determination section 2001 is a unit for carrying out a syndrome computation process on a hard determination result D2000 output by a cyclic shift circuit 2000. The decoding apparatus 1000 ends a decoding process on the basis of the result of the syndrome processing.

On the basis of a control signal D1106, the cyclic shift circuit 2000 selects six decoding intermediate results D1104 or received data D417 and carries out a cyclic shift operation to rearrange. The cyclic shift circuit 2000 outputs three of the results of the cyclic shift operation to the computation section 412 as decoding intermediate results D1999. The three decoding intermediate results D1999 correspond to matrix elements each set at "1" in the upper (the first to third rows) or lower half (the fourth to sixth rows) of a component matrix. In addition, the cyclic shift circuit 2000 supplies a hard determination result of the results of the cyclic shift operation carried out on the six decoding intermediate results D1104 or the received data D417 to the syndrome determination section 2000 as hard determination results D2000.

As described above, the syndrome determination section 2001 has the three syndrome determiners 2001$_1$ to 2001$_3$.

Also as described above, the syndrome determination section 2001 receives the hard determination results D2000 from the cyclic shift circuit 2000 and a control signal D2001 for controlling a syndrome computation process from a control section 2003. In the syndrome determination section 2001, the hard determination result D2000 and the control signal D2001 are supplied to the three syndrome determiners $2001_1$ to $2001_3$.

On the basis of the control signal D2001, the three syndrome determiners 20011 to 20013 carry out operations to compute syndromes of the hard determination results D2000. To put it concretely, the three syndrome determiners $2001_1$ to $2001_3$ compute exclusive logical sums (EXOR) of the hard determination results D2000 for the rows of the parity check matrix H and produce a result of determination as to whether or not the exclusive logical sums are "0" for all the rows. The syndrome determiners $2001_1$ to $2001_3$ supply the determination result D2002 to the control section 2003.

It is to be noted that the syndrome computation process of the syndrome determination section 2001 and the first computation process of the computation section 1102 can be carried out at the same time.

In accordance with the determination result D2002 received from the syndrome determination section 2000, the control section 2003 ends the decoding process. To put it concretely, in accordance with the determination result D2002, the control section 2003 supplies a control signal D2003 to the decoding intermediate result storage memory 2002 to output a decoding intermediate result D415 or a decoding result D1105 as a decoding result. On the basis of the control signal D2003 received from the control section 2003, the decoding intermediate result storage memory 2002 outputs either of a decoding intermediate result D415 and a decoding result D1105 as a decoding result or supply a decoding intermediate result D415 to the cyclic shift circuit 2000.

Figure 35:
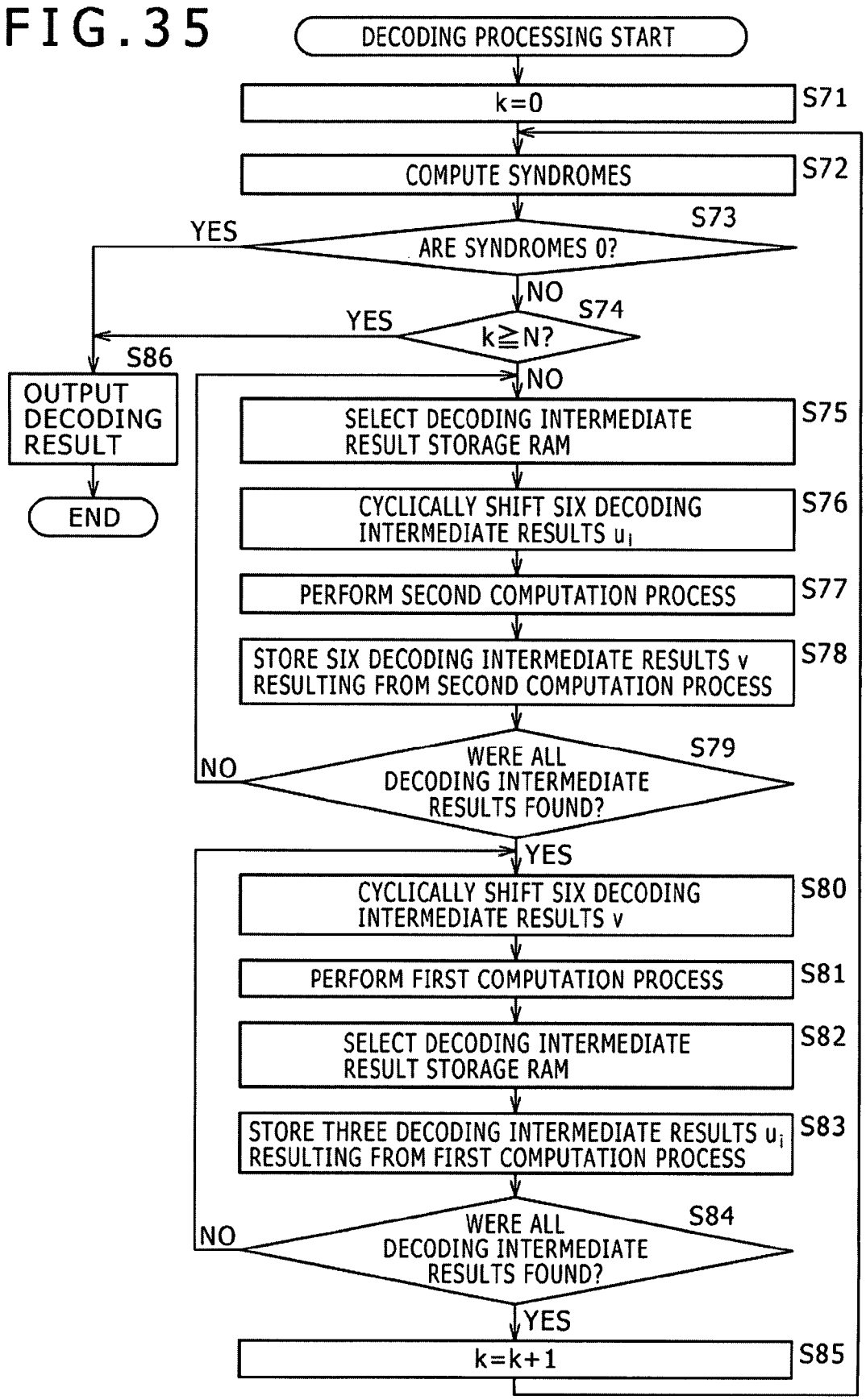
FIG. 35 shows a flowchart representing decoding processing carried out by the decoding apparatus shown in FIG. 34.

FIG. 35 shows a flowchart referred to in explanation of decoding processing carried out by the decoding apparatus 1000 shown in FIG. 34. The decoding processing is started typically when received data D416 to be decoded is stored in the reception memory 416.

First of all, at a step S71, the control section 2003 sets a count value K to 0. Then, the decoding processing goes on to a step S72. At the step S72, the syndrome determiners $2001_1$ to $2001_3$ employed in the syndrome determination section 2001 compute syndromes of hard determination results D2000 received from the cyclic shift circuit 2000. It is to be noted that, at the step executed for the first time, the syndrome determination section 2001 receives hard determination results D2000 as a result of a cyclic shift operation carried out on received data D417 and computes syndromes of the hard determination results D2000 of the received data D417.

After the process of the step S72 is completed, the decoding processing goes on to a step S73 at which, on the basis of a determination result supplied by the syndrome determination section 2001, the control section 2003 produces a result of determination as to whether or not the syndromes are "0". If the determination result produced in the process carried out at the step S73 indicates that the syndromes are not "0", the decoding processing goes on to a step S74.

At the step S74, the control section 2003 produces a result of determination as to whether or not the count value K is at least equal to a number N determined in advance. If the determination result produced in the process carried out at the step S74 indicates that the count value K is smaller than the number N determined in advance, the decoding processing goes on to a step S75.

The processes of the steps S75 to S84 are identical with the processes carried out respectively at the steps S49 to S58 of the flowchart shown in FIG. 27. Thus, explanation is omitted.

After the process of the step S84 is completed, the decoding processing goes on to a step S85 at which the control section 2003 increments the count value K by 1. Then, the decoding processing goes back to the step S72.

If the determination result at the step S73 indicates that the syndromes are "0", on the other hand, the decoding processing goes on to a step S86 at which the control section 2003 outputs a decoding intermediate result D415 or a decoding result D1105 in the decoding intermediate result storage memory 2002 as a decoding result, and ends the execution of the decoding processing. It is to be noted that, if the determination result produced in the process carried out at the step S71 for the first time indicates that the syndromes are "0", the decoding processing is not carried out at all at the subsequent steps. In this case, the received data D417 (or the decoding result D1105) supplied to the computation section 415 is output as it is as a decoding result by way of the decoding intermediate result storage memory 2002.

If the determination result produced in the process carried out at the step S74 indicates that the count value K is at least equal to the number N determined in advance, on the other hand, the decoding processing also goes on to the step S86 at which the control section 2003 outputs a decoding intermediate result D415 in the decoding intermediate result storage memory 2002 as a decoding result, and ends the execution of the decoding processing.

As described above, the execution of the decoding processing shown in FIG. 35 is ended when the syndromes are "0" or the count value K is at least equal to the number N determined in advance (if the series of decoding processes carried out at the steps S72 to S85 has been executed N times). It is thus possible to prevent the number of errors from increasing again because the decoding intermediate result D415 with "0" syndromes or an error count of 0 is further decoded. In the case of received data with a large SN (Signal Noise) ratio of the received data D416, it is a so possible to suppress the number of times the decoding processes are carried out so as to prevent the decoding performance from deteriorating. Thus, the power consumption of the decoding apparatus can be reduced.

It is to be noted that, in general, the circuit scale of the syndrome determination section 2001 is so small that it is possible to ignore a circuit scale increase caused by incorporation of the syndrome determination section 2001 in the decoding apparatus 1000.

In addition, the decoding apparatus 1000 shown in FIG. 34 is obtained by adding the syndrome determination section 2001 to the decoding apparatus 1000 shown in FIG. 23. The syndrome determination section 2001 can be added to any decoding apparatus if the decoding apparatus is an apparatus for carrying out a decoding process by execution of computation processing at two phases (such as the check-node process and the variable-node process or the first computation process and the second computation process). For example, the syndrome determination section 2001 can be added to the decoding apparatus 400 shown in FIG. 17 and the decoding apparatus shown in FIG. 28 or 32.

In the embodiments of the present invention, the decoding intermediate result storage memory 1103 employs four decoding intermediate result storage RAMs 1202 to 1205. The number of decoding intermediate result storage RAMs 1202 to 1205 can be set at any arbitrary value as long as the value is at least equal to three. The larger the number of decoding intermediate result storage RAMs 1202 to 1205, the higher the processing speed of the decoding apparatus.

In addition, in the embodiments of the present invention, the decoding processing is carried out by executing the first computation process and the second computation process repeatedly. However, the decoding processing can also be carried out by executing the check-node process and the variable-node process repeatedly.

If the number of bits in a physical RAM employed in each of the decoding intermediate result storage RAMs 1202 to 1205 shown in FIG. 24, the received-data storage memories 1502 and 1503 shown in FIG. 29, the decoding intermediate result storage memories 1602 and 1603 shown in FIG. 30 as well as the decoding hard determination result storage memories 1802 to 1803 and the decoding soft determination result storage memory 1804, which are shown in FIG. 33, is not sufficient, a plurality of physical RAMs can be employed. In this case, the same control signal is supplied to the plurality of RAMs so that the employed RAMs can be handled as a single RAM.

In the embodiments described above, the value of P is set at six in order to make the explanation simple. That is to say, in the embodiments described above, the number of rows and the number of columns in each of component matrixes composing the parity check matrix H are each 6. However, the value of P, that is, the number of rows and the number of columns in each component matrix, do not have to be six. For example, the value of P can be set at a value peculiar to the parity check matrix H. Typical values of P are 360 and 392.

In addition, in the embodiments of the present invention, the LDPC codes have a code length of 108 and a coding rate of ⅔. However, the LDPC codes can have any arbitrary code length and any arbitrary coding rate. In the case of a parity check matrix H including component matrixes each having a row count of 6 and a column count of 6 for example, any LDPC codes with any arbitrary code length and any arbitrary coding rate can be decoded by the decoding apparatus 1000 by merely changing a control signal provided that the number of all edges is six or smaller.

On top of that, a decoding apparatus for decoding LDPC codes satisfying conditions is capable of decoding LDPC codes with any arbitrary code length and any arbitrary coding rate provided that the LDPC codes satisfy the conditions. In this case, the conditions require that the row count P and column count P of each component matrix shall have a value determined in advance whereas the number of all edges shall not be greater than a certain value.

If the number of rows and/or the number of columns of each component matrix are not a multiple of the row count P or the column count P, additional rows and additional columns with all matrix elements set at 0 are attached to the matrix H so that the number of rows and/or the number of columns in the matrix H become a multiple of the row count P or the column count P. In some cases, the decoding apparatus provided by the present invention is used for decoding LDPC codes defined by such an expanded parity check matrix H.

In the decoding apparatus 1000 described earlier, the number of computers 1102$_1$ to 1102$_3$ employed in the computation section 1102 is three (=P/2). However, the number of computers employed in the computation section 1102 can be set at any arbitrary value as long as the value is smaller than the value of P. Even if the value of P is a large prime number, the number of computers 1102$_1$ to 1102$_3$ can be set at a prime number close to an integer 1.

Instead of designing the computation section 1102 employed in the decoding apparatus 1000, the computation section 415 can be designed as a section having a plurality of computers, the number of which is smaller than the value of P. That is to say, at least one of the computation section 1102 and the computation section 415 need to be designed as a section having a plurality of computers, the number of which is smaller than the value of P. In this case, the other one of the computation section 1102 and the computation section 415 is designed as a section having a plurality of computers, the number of which is smaller than or equal to the value of P.

By adoption of the architecture described above, P or N (where N is a positive integer smaller than the value of P) first and second computation processes can be carried out at the same time in order to suppress the operating frequency to a value in a range that can be implemented. In addition, the decoding processing can be carried out repeatedly a large number of times. On top of that, it is possible to prevent accesses to different addresses from being made at the same time in operations to write data into a memory (which can be a FIFO memory or a RAM) and read out data from the memory. As described above, in the architecture, P or N first and second computation processes are carried out on LDPC codes defined by a parity check matrix H. The parity check matrix H is a matrix that can be represented as a combination of P×P unit matrixes, semi unit matrixes, shift matrixes, sum matrixes and P×P 0 matrixes. The semi unit matrix is a matrix obtained by setting one or more of the matrix elements each having a value of 1 in a unit matrix to 0. The shift matrix is a matrix obtained by carrying out a cyclic shift operation on a unit matrix or a semi unit matrix. The sum matrix is a matrix obtained by computing the sum of a plurality such matrixes.

In addition, by carrying out N first or second computation processes at the same time, the number of computers 1102$_1$ to 1102$_3$ composing the computation section for carrying out a first computation process or the number of computers 415$_1$ to 415$_6$ composing the computation section 415 for carrying out a second computation process can be reduced to a value smaller than the computer counts of a configuration in which P first and second computation processes are carried out at the same time. Thus, the circuit scale of the decoding apparatus can be reduced.

In general, the code length of LDPC codes is a value in a range of several thousands to several tens of thousands. Thus, a large P value in the order of several hundreds is used. In this case, the effect of making use of the decoding apparatus provided by the present invention is even greater.

In addition, the decoding apparatus provided by the present invention faithfully adopts the sum product algorithm. Thus, a decoding loss other than the quantization of the message is not incurred.

From the above points of view, by making use of the decoding apparatus provided by the present invention, high-performance decoding processing can be carried out.

It is to be noted that the decoding apparatus for decoding LDPC codes as described above can be applied to, for example, a tuner for receiving (digital) satellite broadcasts.

The invention claimed is:

1. A decoding apparatus for LDPC (Low Density Parity Check) codes definable by a parity check matrix including a combination of at least one component matrix which can be
    a P×P (where P is a positive integer) unit matrix,
    a semi unit matrix obtained by setting one or more of matrix elements each having a value of 1 in said unit matrix to 0,
    a shift matrix obtained by carrying out a cyclic shift operation on said unit matrix or said semi unit matrix, a sum matrix obtained by computing the sum of a plurality of said unit matrixes, said semi unit matrixes or said shift matrixes, or a P×P 0 matrix, said decoding apparatus comprising:

a first computation section configured to carry out a check-node computation process in order to decode said LDPC codes; and a second computation section configured to carry out a variable-node computation process in order to decode said LDPC codes;

wherein only said first computation section carries out N (where N is a positive integer smaller than said P) said check-node computation processes at the same time, only said second computation section carries out N said variable-node computation processes at the same time, or said first computation section carries out said N check-node computation processes at the same time whereas said second computation section carries out said N variable-node computation processes at the same time.

2. The decoding apparatus according to claim 1 wherein said N is an integer equal to a fraction of said P.

3. The decoding apparatus according to claim 1 wherein
said first computation section carries out said check-node computation process and a portion of said variable-node process, said second computation section carries out the rest of said variable-node computation process, and only said first computation section carries out said N check-node computation processes and a portion of said variable-node computation processes at the same time, only said second computation section carries out the rest of said N variable-node computation processes at the same time, or said first computation section carries out said check-node computation processes and a portion of said variable-node computation processes at the same time whereas said second computation section carries out the rest of said N variable-node computation processes at the same time.

4. The decoding apparatus according to claim 1 wherein
only said first computation section has said N check-node computers each used for carrying out said check-node computation process, only said second computation section has said N variable-node computers each used for carrying out said variable-node computation process, or said first computation section has said N check-node computers each used for carrying out said check-node computation process whereas said second computation section has said N variable-node computers each used for carrying out said variable-node computation process.

5. The decoding apparatus according to claim 4 wherein
if said first computation section has said N check-node computers, each of said N check-node computers sequentially inputs second computation results produced by said second computation section from said second computation section, and each of said N check-node computers sequentially outputs first computation results of said check-node computation process carried out by making use of said second computation results, and if said second computation section has said N variable-node computers, each of said N variable-node computers sequentially inputs first computation results produced by said first computation section from said first computation section, and each of said N variable-node computers sequentially outputs second computation results of said variable-node computation process carried out by making use of said first computation results.

6. The decoding apparatus according to claim 2 further comprising:

a first storage section configured to store first computation results produced by said first computation section; and a second storage section configured to store second computation results produced by said second computation section; wherein said first storage section allows said N first computation results to be stored in said first storage section at the same time and to be read out, or said second storage section allows said N second computation results to be stored in said second storage section at the same time and to be read out.

7. The decoding apparatus according to claim 6 wherein said first storage section stores said first computation results by packing matrix elements each set at 1 in said parity check matrix, which defines said LDPC codes, in a row direction.

8. The decoding apparatus according to claim 6 wherein
said first storage section includes a plurality of memories allowing said N first computation results to be stored at the same time and to be read out, or said second storage section includes a plurality of memories allowing said N second computation results to be stored at the same time and to be read out.

9. The decoding apparatus according to claim 6 wherein
said first storage section stores said N first computation results obtained for a plurality of matrixes obtained as a result of decomposing said sum matrix into said unit matrixes, said semi unit matrixes or said shift matrixes at an address common to said N first computation results, and said second storage section stores said N second computation results obtained for a plurality of matrixes obtained as a result of decomposing said sum matrix into said unit matrixes, said semi unit matrixes or said shift matrixes at an address common to said N second computation results.

10. The decoding apparatus according to claim 2 further comprising a rearrangement section configured to rearrange p said first or second computation results, select N said first or second computation results from said P first or second computation results and output said N first or second computation results.

11. The decoding apparatus according to claim 10 wherein said rearrangement section is a parallel shifter.

12. The decoding apparatus according to claim 1 further comprising:

a plurality of received-information storage sections configured to store LDPC codes as received information;

a plurality of computation-result storage sections configured to store a computation result produced by said second computation section; and a storage control section configured to control said received-information storage sections and said computation result storage sections;

wherein said storage control section executes control to select one of said received-information storage sections as a storage section to store said received information to be used in a later decoding process, read out said received information to be used in a present decoding process from another one of said received-information storage sections, read out a decoding result of decoding said LDPC codes from one of said computation-result storage sections, and make use of another one of said computation-result storage sections in a present decoding process.

13. The decoding apparatus according to claim 12 wherein said storage control section changes said received-information storage section to be used for storing said received information to be used in a later decoding process every time said received information with an amount corresponding to the code length of said LDPC codes is stored in said received-information storage section.

14. The decoding apparatus according to claim 12 wherein said storage control section changes said computation-result storage section, from which a decoding result of decoding said LDPC codes is to be read out, every time said received information with an amount corresponding to the code length of said LDPC codes is stored in said selected received-information storage section.

15. The decoding apparatus according to claim 1 further comprising:
- a plurality of received-information storage sections configured to store LDPC codes as received information;
- a plurality of hard determination value storage sections configured to store a hard determination value of a computation result produced by said second computation section;
- a soft determination value storage section configured to store a soft determination value of a computation result produced by said second computation section; and
- a storage control section configured to control said received-information storage sections and said hard determination value storage sections;

wherein said storage control section executes control to
select one of said received-information storage sections as a storage section to store said received information to be used in a later decoding process, read out said received information to be used in a present decoding process from another one of said received-information storage sections, read out a decoding result of decoding said LDPC codes from one of said hard determination result storage sections, and make use of another one of said hard determination result storage sections in a present decoding process.

16. A decoding method for LDPC (Low Density Parity Check) codes definable by a parity check matrix comprising a combination of at least one component matrix which can be:
- a P×P (where P is a positive integer) unit matrix;
- a semi unit matrix obtained by setting one or more of matrix elements each having a value of 1 in said unit matrix to 0;
- a shift matrix obtained by carrying out a cyclic shift operation on said unit matrix or said semi unit matrix;
- a sum matrix obtained by computing the sum of at a plurality of said unit matrixes, said semi unit matrixes or said shift matrixes; or
- a P×P 0 matrix, said decoding method comprising:
- a first computation step, implemented by a check-node computation section, of carrying out a check-node computation process in order to decode said LDPC codes; and
- a second computation step, implemented by a variable-node computation section, of carrying out a variable-node computation process in order to decode said LDPC codes, whereby:

only said first computation step is executed to carry out N (where N is a positive integer smaller than said P) said check-node computation processes at the same time;

said second computation step is executed to carry out said N variable-node computation processes at the same time; or said first computation section is executed to carry out said N check-node computation processes at the same time whereas said second computation step is executed to carry out said N variable-node computation processes at the same time.

* * * * *